(12) United States Patent
Toda

(10) Patent No.: US 10,656,315 B2
(45) Date of Patent: May 19, 2020

(54) SOLID-STATE IMAGING DEVICE, METHOD OF MANUFACTURING THE SAME, AND ELECTRONIC DEVICE

(71) Applicant: SONY SEMICONDUCTOR SOLUTIONS CORPORATION, Kanagawa (JP)

(72) Inventor: Atsushi Toda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/554,306

(22) PCT Filed: Feb. 25, 2016

(86) PCT No.: PCT/JP2016/055568
§ 371 (c)(1),
(2) Date: Aug. 29, 2017

(87) PCT Pub. No.: WO2016/143532
PCT Pub. Date: Sep. 15, 2016

(65) Prior Publication Data
US 2018/0081099 A1  Mar. 22, 2018

(30) Foreign Application Priority Data
Mar. 10, 2015 (JP) ................. 2015-046665

(51) Int. Cl.
*G02B 5/28* (2006.01)
*H04N 9/07* (2006.01)
(Continued)

(52) U.S. Cl.
CPC .............. *G02B 5/28* (2013.01); *G02B 5/285* (2013.01); *H01L 27/14* (2013.01);
(Continued)

(58) Field of Classification Search
CPC ...... G02B 5/28–288; H01L 51/42–448; H01L 27/144–14893; H01L 27/307; H04N 5/378; H04N 9/045; H04N 9/07
See application file for complete search history.

(56) References Cited

U.S. PATENT DOCUMENTS 4,158,133 A * 6/1979 Spaeth .............. H01L 31/02165
136/257
9,245,951 B1 * 1/2016 Camillo-Castillo .........................
H01L 29/0826
(Continued)

FOREIGN PATENT DOCUMENTS

CN      103426891 A    12/2013
CN      103959467 A    7/2014
(Continued)

OTHER PUBLICATIONS

International Search Report and Written Opinion of PCT Application No. PCT/JP2016/055568, dated May 24, 2016, 10 pages of ISRWO.

*Primary Examiner* — Robert T Huber
*Assistant Examiner* — Gardner W. S. Swan
(74) *Attorney, Agent, or Firm* — Chip Law Group

(57) ABSTRACT

The present technology relates to a solid-state imaging device, a method of manufacturing the same, and an electronic device capable of improving sensitivity in a certain wavelength band and at the same time reducing color mixture of light of other wavelength bands in a photoelectric conversion unit. The solid-state imaging device is provided with a first photoelectric conversion unit which generates a signal charge corresponding to a light amount of light of a first color component on a short wavelength side out of incident light, a second photoelectric conversion unit which generates a signal charge corresponding to a light amount of light of a second color component on a long wavelength side (Continued)

out of the incident light, and a first optical interference film provided between the first photoelectric conversion unit and the second photoelectric conversion unit formed below the first photoelectric conversion unit which transmits the light on the long wavelength side while reflecting the light on the short wavelength side out of the incident light. The present technology may be applied to a CMOS image sensor, for example.

14 Claims, 34 Drawing Sheets

(51) Int. Cl.
    *H01L 27/14*    (2006.01)
    *H01L 31/02*    (2006.01)
    *H01L 51/42*    (2006.01)
    *H01L 31/101*   (2006.01)
    *H01L 27/146*   (2006.01)
    *H04N 5/378*    (2011.01)
    *H04N 9/04*     (2006.01)
    *H01L 27/30*    (2006.01)

(52) U.S. Cl.
    CPC .... *H01L 27/1462* (2013.01); *H01L 27/14605* (2013.01); *H01L 27/14621* (2013.01); *H01L 27/14647* (2013.01); *H01L 27/14685* (2013.01); *H01L 31/02* (2013.01); *H01L 31/1013* (2013.01); *H01L 51/42* (2013.01); *H04N 5/378* (2013.01); *H04N 9/045* (2013.01); *H04N 9/07* (2013.01); *G02B 5/282* (2013.01); *H01L 27/307* (2013.01); *H04N 2209/042* (2013.01)

(56) References Cited

U.S. PATENT DOCUMENTS

| | | | |
|---|---|---|---|
| 2003/0050173 A1* | 3/2003 | Lin | C03C 3/062 501/70 |
| 2003/0209651 A1 | 11/2003 | Iwasaki | |
| 2005/0205903 A1* | 9/2005 | Hioki | H01L 27/14647 257/291 |
| 2007/0125934 A1 | 6/2007 | Matthews | |
| 2010/0127260 A1 | 5/2010 | Matsuyama | |
| 2013/0307106 A1 | 11/2013 | Egawa | |
| 2014/0347538 A1 | 11/2014 | Toda | |

FOREIGN PATENT DOCUMENTS

| | | |
|---|---|---|
| EP | 2793264 A1 | 10/2014 |
| JP | 2003-332551 A | 11/2003 |
| JP | 2007-059487 A | 3/2007 |
| JP | 2007-158338 A | 6/2007 |
| JP | 2010-128028 A | 6/2010 |
| JP | 2013-239634 A | 11/2013 |
| JP | 2014-232761 A | 12/2014 |
| KR | 10-2013-0128299 A | 11/2013 |
| KR | 10-2014-0107196 A | 9/2014 |
| TW | 200807701 A | 2/2008 |
| TW | 201330238 A | 7/2013 |
| WO | 2013/088983 A1 | 6/2013 |

* cited by examiner

SOLID-STATE IMAGING DEVICE, METHOD OF MANUFACTURING THE SAME, AND ELECTRONIC DEVICE

CROSS REFERENCE TO RELATED APPLICATIONS

This application is a U.S. National Phase of International Patent Application No. PCT/JP2016/055568 filed on Feb. 25, 2016, which claims priority benefit of Japanese Patent Application No. JP 2015-046665 filed in the Japan Patent Office on Mar. 10, 2015. Each of the above-referenced applications is hereby incorporated herein by reference in its entirety.

TECHNICAL FIELD

The present technology relates to a solid-state imaging device, a method of manufacturing the same, and an electronic device, and especially relates to a solid-state imaging device, a method of manufacturing the same, and an electronic device capable of improving sensitivity in a certain wavelength band and at the same time reducing color mixture of light of other wavelength bands in a photoelectric conversion unit.

BACKGROUND ART

In a semiconductor bulk (silicon bulk), a longitudinal spectroscopic structure in which a plurality of photodiodes (PDs) is stacked is known (for example, refer to Patent Document 1). In this longitudinal spectroscopic structure, an upper photodiode (PD) performs spectroscopy on a short wavelength side and a lower photodiode (PD) performs spectroscopy on a long wavelength side.

For example, in the longitudinal spectroscopic structure formed of one layer of organic photoelectric conversion film and two layers of silicon bulk, spectroscopy of green light (G) is performed by a G organic photoelectric conversion film, and spectroscopy of blue light (B) and red light (R) is performed by two photodiodes (B-PD and R-PD) on a silicon bulk side.

CITATION LIST

Patent Document

Patent Document 1: Japanese Patent Application Laid-Open No. 2006-270021

SUMMARY OF THE INVENTION

Problems to be Solved by the Invention

However, in a case of performing spectroscopy in such silicon bulk, unlike a case where a photoelectric conversion film performs spectroscopy on a specific wavelength band of an organic material and the like, on the silicon side, color mixture is inevitable in principle when the red light (R) passes through the B photodiode (B-PD) which absorbs the blue light (B) and the blue light (B) passes through the R photodiode (R-PD) which absorbs the red light (R).

Therefore, it is required to improve the sensitivity in a certain wavelength band and at the same time reducing the color mixture of the light in other wavelength bands in a photoelectric conversion unit such as the B photodiode and the R photodiode stacked as the longitudinal spectroscopic structure.

The present technology is achieved in view of such a situation, and an object thereof is to improve the sensitivity in a certain wavelength band and at the same time reduce the color mixture of the light of other wavelength bands in the photoelectric conversion unit.

Solutions to Problems

A solid-state imaging device according to a first aspect of the present technology is a solid-state imaging device provided with a first photoelectric conversion unit which generates a signal charge corresponding to a light amount of light of a first color component on a short wavelength side out of incident light, a second photoelectric conversion unit which generates a signal charge corresponding to a light amount of light of a second color component on a long wavelength side out of the incident light, and a first optical interference film provided between the first photoelectric conversion unit and the second photoelectric conversion unit formed below the first photoelectric conversion unit which transmits the light on the long wavelength side while reflecting the light on the short wavelength side out of the incident light.

In the solid-state imaging device according to the first aspect of the present technology, the first photoelectric conversion unit generates the signal charge corresponding to the light amount of the light of the first color component on the short wavelength side out of the incident light, and the second photoelectric conversion unit generates the signal charge corresponding to the light amount of the light of the second color component on the long wavelength side out of the incident light. Also, the first optical interference film provided between the first photoelectric conversion unit and the second photoelectric conversion unit formed below the first photoelectric conversion unit reflects the light on the short wavelength side and transmits the light on the long wavelength side out of the incident light.

A method of manufacturing a solid-state imaging device according to a second aspect of the present technology is a method of manufacturing a solid-state imaging device including removing a part of a second semiconductor substrate on which a second photoelectric conversion unit which generates a signal charge corresponding to a light amount of light of a second component on a long wavelength side out of incident light is formed for forming a first optical interference film which reflects light on a short wavelength side and transmits the light on the long wavelength side out of the incident light, forming the first optical interference film in a portion from which a part of the second semiconductor substrate is removed, and attaching a first semiconductor substrate on which a first photoelectric conversion unit which generates a signal charge corresponding to a light amount of light of a first color component on the short wavelength side out of the incident light is formed to the second semiconductor substrate on which the first optical interference film is formed.

In the method of manufacturing a solid-state imaging device according to the second aspect of the present technology, a part of a second semiconductor substrate on which a second photoelectric conversion unit which generates a signal charge corresponding to a light amount of light of a second component on a long wavelength side out of incident light is formed is removed for forming a first optical interference film which reflects light on a short wavelength side and transmits the light on the long wavelength side out of the incident light, the first optical interference film is formed in a portion from which a part of the second semiconductor substrate is removed, and a first semiconductor substrate on which a first photoelectric conversion unit which generates a signal charge corresponding to a light amount of light of a first color component on the short wavelength side out of the incident light is formed is attached to the second semiconductor substrate on which the first optical interference film is formed.

A method of manufacturing a solid-state imaging device according to a third aspect of the present technology is a method of manufacturing a solid-state imaging device including forming a first optical interference film which reflects light on a short wavelength side and transmits light on a long wavelength side out of incident light on a part of a semiconductor substrate on which a second photoelectric conversion unit which generates a signal charge corresponding to a light amount of light of a second component on the long wavelength side out of the incident light is formed, covering a side surface side of the first optical interference film by selectively growing a semiconductor of the semiconductor substrate, and covering an upper surface side of the first optical interference film by laterally growing a semiconductor of the semiconductor substrate to form a first photoelectric conversion unit which generates a signal charge corresponding to a light amount of light of a first color component on the short wavelength side out of the incident light by the semiconductor formed on the upper surface of the first optical interference film.

In the method of manufacturing a solid-state imaging device according to the third aspect of the present technology, a first optical interference film which reflects light on a short wavelength side and transmits light on a long wavelength side out of incident light is formed on a part of a semiconductor substrate on which a second photoelectric conversion unit which generates a signal charge corresponding to a light amount of light of a second component on the long wavelength side out of the incident light is formed, a side surface side of the first optical interference film is covered by selectively growing a semiconductor of the semiconductor substrate, and an upper surface side of the first optical interference film is covered by laterally growing a semiconductor of the semiconductor substrate to form a first photoelectric conversion unit which generates a signal charge corresponding to a light amount of light of a first color component on the short wavelength side out of the incident light by the semiconductor formed on the upper surface of the first optical interference film.

An electronic device according to a fourth aspect of the present technology is an electronic device provided with a solid-state imaging device including a first photoelectric conversion unit which generates a signal charge corresponding to a light amount of light of a first color component on a short wavelength side out of incident light, a second photoelectric conversion unit which generates a signal charge corresponding to a light amount of light of a second color component on a long wavelength side out of the incident light, and a first optical interference film provided between the first photoelectric conversion unit and the second photoelectric conversion unit formed below the first photoelectric conversion unit which transmits the light on the long wavelength side while reflecting the light on the short wavelength side out of the incident light.

In the electronic device according to the fourth aspect of the present technology, a first photoelectric conversion unit generates a signal charge corresponding to a light amount of light of a first color component on a short wavelength side out of incident light, a second photoelectric conversion unit generates a signal charge corresponding to a light amount of light of a second color component on a long wavelength side out of the incident light, and a first optical interference film provided between the first photoelectric conversion unit and the second photoelectric conversion unit formed below the first photoelectric conversion unit transmits the light on the long wavelength side while reflecting the light on the short wavelength side out of the incident light.

Effects of the Invention

According to the first to fourth aspects of the present technology, it is possible to improve the sensitivity in a certain wavelength band and at the same time reduce the color mixture of the light of other wavelength bands in the photoelectric conversion unit.

Meanwhile, the effects are not necessarily limited to the effects herein described and may be the effects described in the present disclosure.

MODE FOR CARRYING OUT THE INVENTION

An embodiment of the present technology is hereinafter described with reference to the drawings. Meanwhile, the description is given in the following order.
1. Problem Solved by Present Technology
2. Configuration of Solid-state Imaging Device
3. First Embodiment: Basic Structure
4. Second Embodiment: Two-sided Signal Readout Structure
5. Third Embodiment: OCCF Structure
6. Fourth Embodiment: PD Three-Layer Stacked Type Structure
7. Configuration of Camera Module
8. Configuration of Electronic Device
9. Usage Example of Solid-state Imaging Device 1. Problem Solved by Present Technology Patent Document 1 described above discloses a structure in which an optical interference film (reflection film) having a reflection ratio due to an interference effect of 50% or larger is provided below a G organic photoelectric conversion film to improve sensitivity of the G organic photoelectric conversion film, and a B photodiode and an R photodiode are formed inside a silicon substrate.

In order to provide the optical interference film between such G organic photoelectric conversion film and B and R photodiodes, it is necessary to reduce a thickness of the optical interference film to few µm or less such that mass production of device structures is realized. For that purpose, it is necessary to realize a multi-layer film structure with large difference in refractive index by combining a material with a high refractive index and a material with a low refractive index. As an example, there is a multi-layer film formed of a silicon nitride film ($Si_3N_4$: refractive index $n_2=2.03$) and a silicon oxide film ($SiO_2$: refractive index $n_1=1.46$); a reflection spectrum due to interference of this multi-layer film is as illustrated in FIG. 1.

Figure 1:
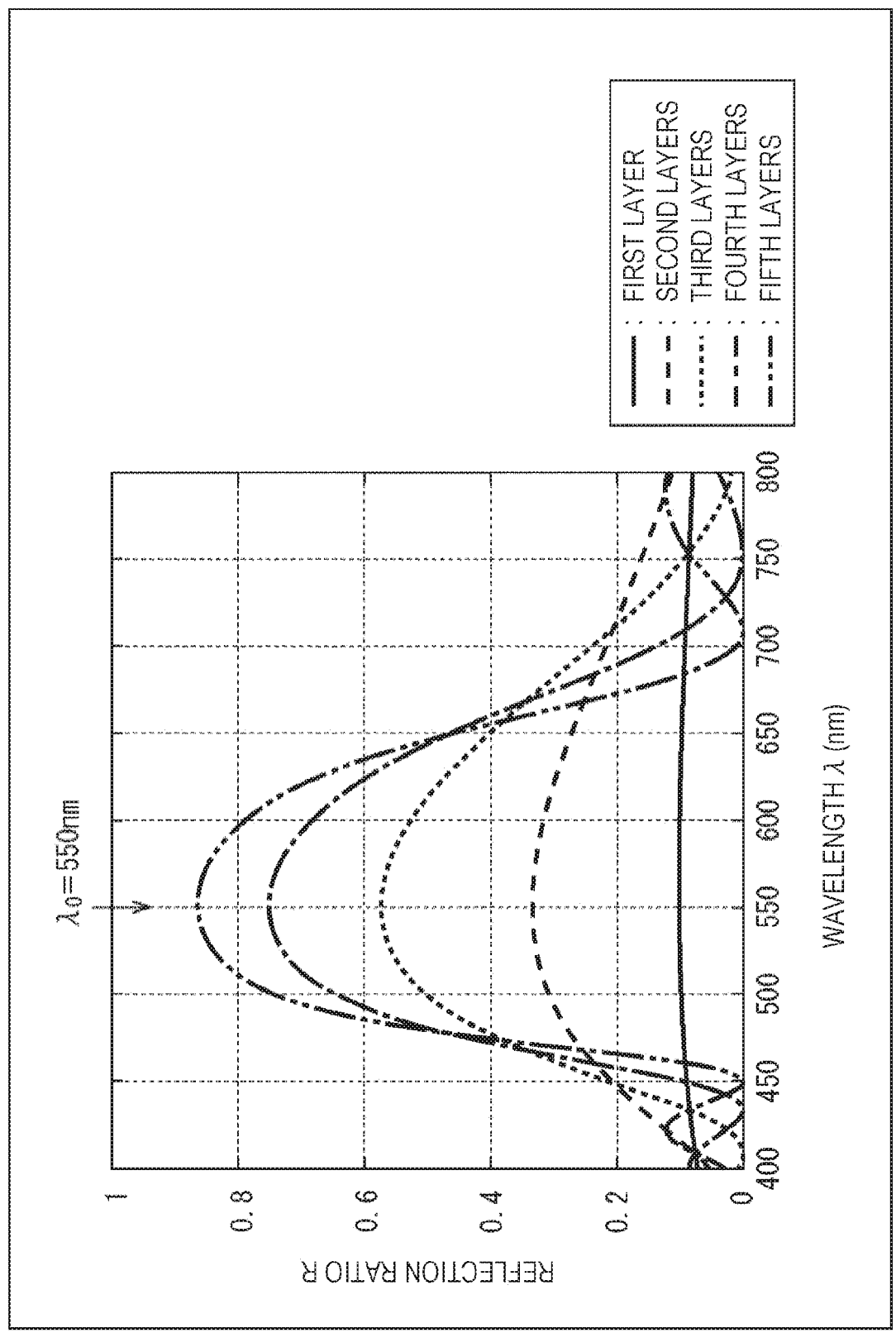
FIG. 1 is a view illustrating a reflection spectrum due to interference of a multi-layer film.

In FIG. 1, the abscissa axis represents a wavelength $\lambda$ (nm); a value thereof increases from a left side toward a right side in the drawing. Also, the ordinate axis represents the reflection ratio R; a value thereof falls within a range of 0 to 1.

Figure 2:
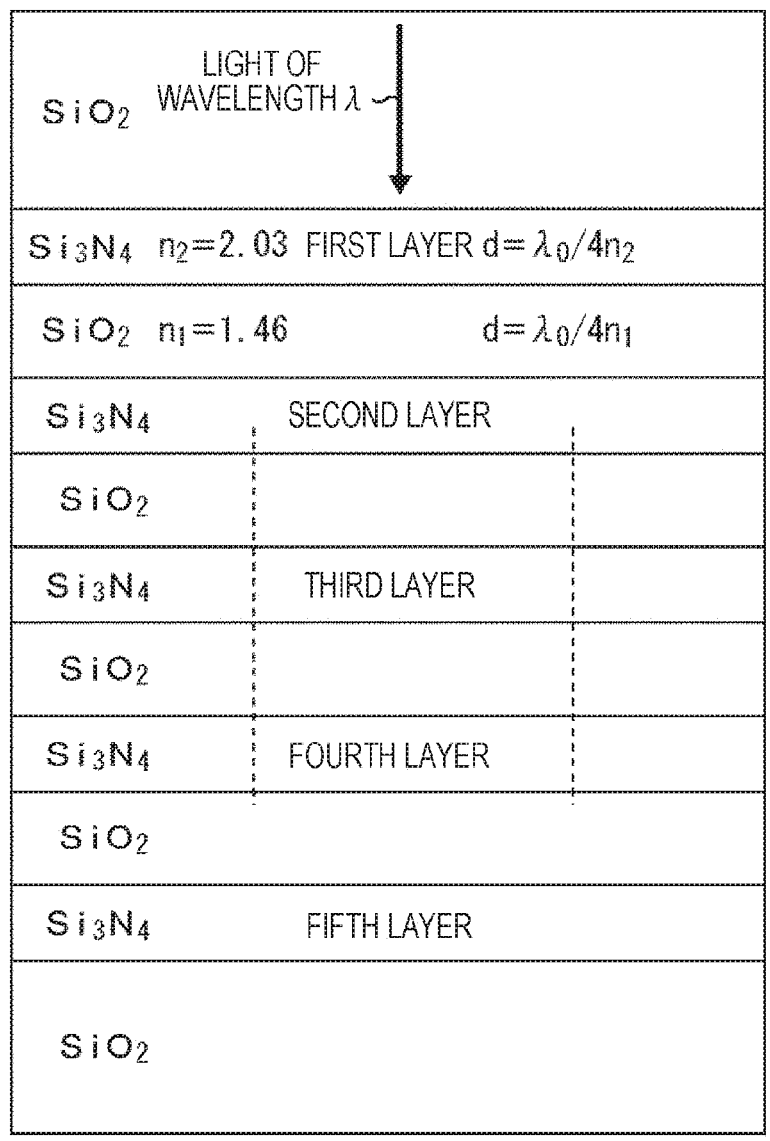
FIG. 2 is a cross-sectional view illustrating a structure corresponding to a condition of the reflection spectrum in FIG. 1.

FIG. 1 illustrates the reflection spectra of first to fifth layers when focusing only on the number of silicon nitride film ($Si_3N_4$) layers in a case where the silicon nitride film ($Si_3N_4$) having a thickness of 68 nm and a silicon oxide film ($SiO_2$) having a thickness of 94 nm with a center wavelength $\lambda_0$ of 550 nm and a thickness d of each layer of $\lambda_0/4n$ are alternately stacked as illustrated in FIG. 2.

In FIG. 1, a peak value of the reflection ratio becomes larger in a lower layer as compared with an upper layer; each layer has the maximum reflection ratio at the center wavelength of $\lambda_0$ (550 nm). In this case, since a light traveling direction is a direction from an upper side to a lower side in FIG. 2, in order to set the reflection ratio to 50% or larger, three or more layers (cycles) are required. At that time, the thickness of the three layers is 486 nm and the thickness of the five layers is 805 nm, so that a thin optical interference film may be formed.

However, as is apparent from the reflection spectrum in FIG. 1, since a shape of the reflection spectrum is broad, not only green light (G) of a medium wavelength (for example, 500 to 600 nm) but also blue light (B) of a short wavelength (for example, 450 to 500 nm) and red light (R) of a long wavelength (for example, 600 to 650 nm) are also reflected at the same time, sensitivity of the B and R photodiodes formed below the optical interference film decreases. Also, when the blue light (B) and the red light (R) are reflected by the optical interference film, they are incident again on the G organic photoelectric conversion film, so that color mixture increases.

On the other hand, in order to narrow the shape of the reflection spectrum, it is required to reduce the difference in refractive index of the optical interference film; in this case, however, it is necessary to increase the number of layers to increase the thickness of the optical interference film, so that it is not practical.

In this manner, in a longitudinal spectroscopic structure formed of one layer of organic photoelectric conversion film and two layers of silicon bulk, there is a problem in a method of providing the optical interference film below the G organic photoelectric conversion film to improve the sensitivity of the green light (G).

A solid-state imaging device to which the present technology is applied capable of solving such problem is hereinafter described.

2. Configuration of Solid-State Imaging Device (Configuration of Solid-State Imaging Device)

Figure 3:
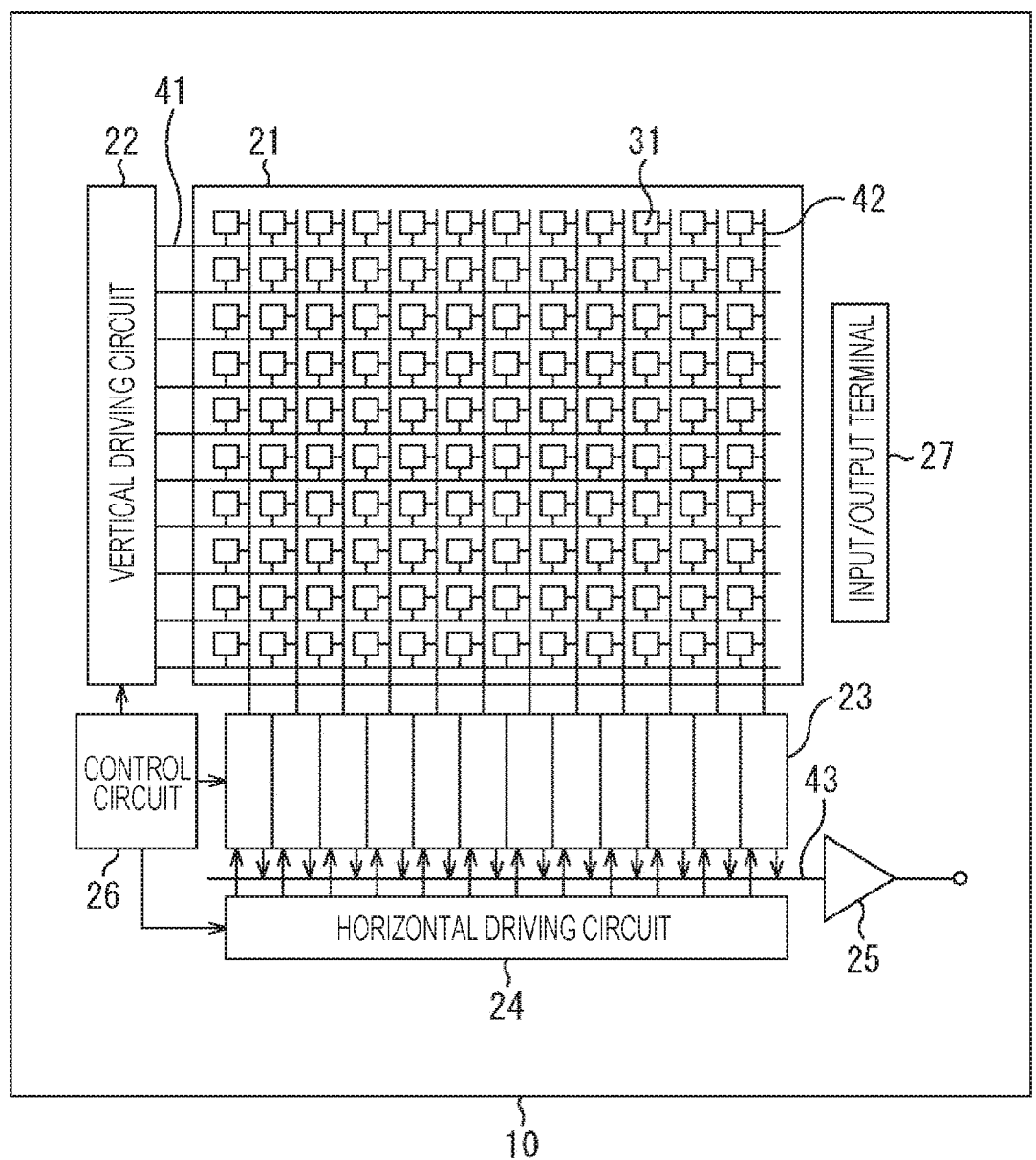
FIG. 3 is a view illustrating a configuration example of a solid-state imaging device.

FIG. 3 is a view illustrating a configuration example of the solid-state imaging device.

A solid-state imaging device 10 in FIG. 3 is, for example, an image sensor such as a complementary metal oxide semiconductor (CMOS) image sensor. The solid-state imaging device 10 captures incident light (image light) from an object through an optical lens system (not illustrated) and converts an amount of the incident light an image of which is formed on an imaging surface to electric signals in a pixel unit to output as pixel signals.

In FIG. 3, the solid-state imaging device 10 includes a pixel array unit 21, a vertical driving circuit 22, a column signal processing circuit 23, a horizontal driving circuit 24, an output circuit 25, a control circuit 26, and an input/output terminal 27.

In the pixel array unit 21, a plurality of pixels 31 is arranged in a two-dimensional manner. The pixel 31 includes a photodiode as a photoelectric conversion element and a plurality of pixel transistors.

The vertical driving circuit 22 formed of a shift register, for example, selects predetermined pixel driving wiring 41 and supplies a pulse for driving the pixel 31 to the selected pixel driving wiring 41 to drive the pixels 31 row by row. That is, the vertical driving circuit 22 sequentially selects to scan the pixels 31 in the pixel array unit 21 row by row in a vertical direction and supplies the pixel signal based on a signal charge generated according to a light receiving amount by the photodiode of each pixel 31 to the column signal processing circuit 23 through a vertical signal line 42.

The column signal processing circuits 23 arranged for respective columns of the pixels 31 perform signal processing such as noise removal on the signals output from the pixels 31 of one row for each pixel column. For example, the column signal processing circuit 23 performs the signal processing such as correlated double sampling (CDS) for removing a fixed pattern noise peculiar to the pixel and analog/digital (A/D) conversion.

The horizontal driving circuit 24 formed of a shift register, for example, selects each of the column signal processing circuits 23 in turn by sequentially outputting horizontal scanning pulses and allows each of the column signal processing circuits 23 to output the pixel signal to a horizontal signal line 43.

The output circuit 25 performs signal processing on the signals sequentially supplied from the respective column signal processing circuits 23 through the horizontal signal line 43 to output. Meanwhile, there is a case where the output circuit 25 merely buffers, for example, or a case where this performs black level adjustment, column variation correction, various types of digital signal processing and the like.

The control circuit 26 controls operation of each unit of the solid-state imaging device 10. For example, the control circuit 26 receives an input clock signal and data ordering an operation mode and the like or outputs data of internal information and the like of the solid-state imaging device 10. That is, the control circuit 26 generates a clock signal and a control signal serving as a reference of operation of the vertical driving circuit 22, the column signal processing circuit 23, the horizontal driving circuit 24 and the like on the basis of a vertical synchronization signal, a horizontal synchronization signal, and a master clock signal. The control circuit 26 outputs the generated clock signal and control signal to the vertical driving circuit 22, the column signal processing circuit 23, the horizontal driving circuit 24 and the like.

The input/output terminal 27 externally communicates signals.

The solid-state imaging device 10 in FIG. 3 configured in the above-described manner is the CMOS image sensor referred to as a column AD type in which the column signal processing circuit 23 which performs the CDS processing and A/D conversion processing is arranged for each pixel column. Also, the solid-state imaging device 10 in FIG. 3 may be a back-irradiation type CMOS image sensor.

3. First Embodiment (Structure of Pixel (Optical Interference Film: Multi-Layer Film))

Figure 4:
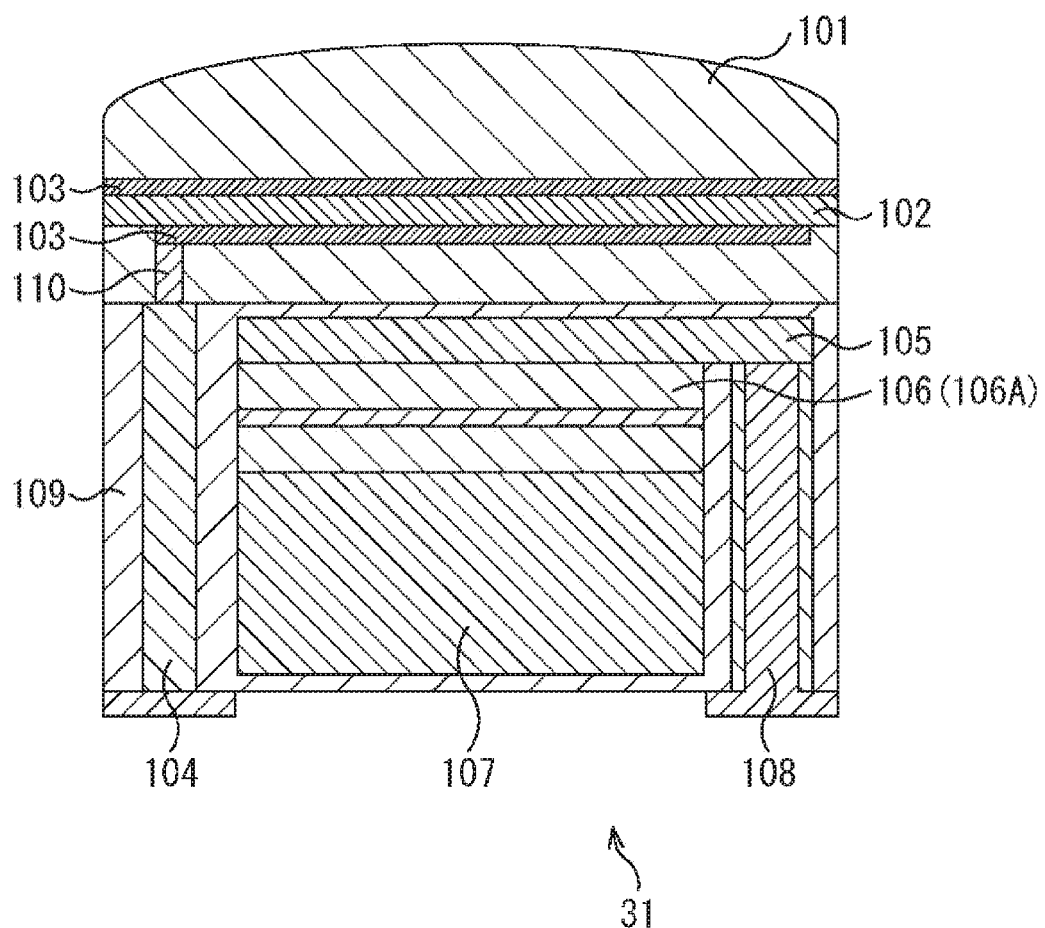
FIG. 4 is a cross-sectional view illustrating a structure of a pixel (optical interference film: multi-layer film) in a first embodiment.

A detailed structure of a solid-state imaging device 10 according to a first embodiment is next described. FIG. 4 is a cross-sectional view illustrating a structure of a pixel 31 (FIG. 3) including a longitudinal spectroscopic structure of a G organic photoelectric conversion film and R and B photodiodes (R-PD and B-PD) in a semiconductor bulk (silicon bulk). In FIG. 4, an arbitrary pixel 31 out of a plurality of pixels 31 arranged in a two-dimensional manner in a pixel array unit 21 (FIG. 3) is illustrated.

In the pixel 31, light condensed by an on-chip lens 101 is incident on a G organic photoelectric conversion film 102. The G organic photoelectric conversion film 102 absorbs light of a green (G) component (green light) out of the incident light from the on-chip lens 101 and generates a signal charge corresponding to a light amount of the green light (G). The signal charge generated by the G organic photoelectric conversion film 102 is taken out by a transparent electrode 103 to be supplied to a signal processing circuit (not illustrated) on a subsequent stage through an electrode 104 connected to an electrode plug 110.

Also, out of the incident light from the on-chip lens 101, the light transmitted through the G organic photoelectric conversion film 102 is incident on a B photodiode (B-PD) 105. Herein, the light transmitted through the G organic photoelectric conversion film 102 becomes light (transmitted light) including light of red (R) component (red light) and light of blue (B) component (blue light), so that the B photodiode 105 absorbs the blue light (B) from the transmitted light and generates a signal charge corresponding to a light amount of the blue light (B). The signal charge generated by the B photodiode 105 is read out by a vertical transistor 108 to be supplied to the signal processing circuit on the subsequent stage.

An optical interference film 106 is formed (inserted) between the B photodiode 105 and a R photodiode 107 formed of n-type silicon (Si). In the structure of the pixel 31 in FIG. 4, a multi-layer film 106A is formed as the optical interference film 106. The multi-layer film 106A reflects the blue light (B) on a short wavelength side and transmits the red light (R) on a long wavelength side out of the light transmitted through the B photodiode 105 (transmitted light). Meanwhile, in this embodiment, a short wavelength represents a range of 450 to 500 nm, 400 to 500 nm and the like, for example, a medium wavelength represents a range of 500 to 600 nm and the like, for example, and a long wavelength represents a range of 600 to 650 nm, 550 to 650 nm and the like, for example.

The multi-layer film 106A is formed of a hierarchical structure of, for example, a silicon oxide film ($SiO_2$) or a silicon nitride film ($Si_3N_4$), a silicon film (Si), a titanium oxide film ($TiO_2$), a $(SiO_2)_X(Si_3N_4)_{1-X}$ film and the like. For example, three layers of the silicon oxide film ($SiO_2$), the silicon film (Si), and the silicon oxide film ($SiO_2$) are stacked to form the multi-layer film 106A. Meanwhile, an interference effect by the multi-layer film 106A is described later in detail with reference to FIG. 5.

The light transmitted through the multi-layer film 106A is incident on the R photodiode (R-PD) 107. Herein, since the light transmitted through the multi-layer film 106A becomes the light (transmitted light) including the red light (R), the R photodiode 107 absorbs the red light (R) from the transmitted light and generates a signal charge corresponding to a light amount of the red light (R). The signal charge generated by the R photodiode 107 is read out by a signal readout circuit (pixel transistor) to be supplied to the signal processing circuit on the subsequent stage.

In this manner, in the pixel 31, the signal charges corresponding to the light amounts of the green light (G), the blue light (B), and the red light (R) are generated to be read out, and RGB signals corresponding to the signal charges are processed by the signal processing circuit on the subsequent stage to be output as image data.

Meanwhile, in the pixel 31, a p-type silicon (Si) layer 109 is formed in the vicinity of a boundary of the B photodiode 105 and the R photodiode 107 formed of the n-type silicon (Si), the multi-layer film 106A formed of the silicon oxide film ($SiO_2$) and the silicon film (Si) and the like.

(Interference Effect)

Figure 5:
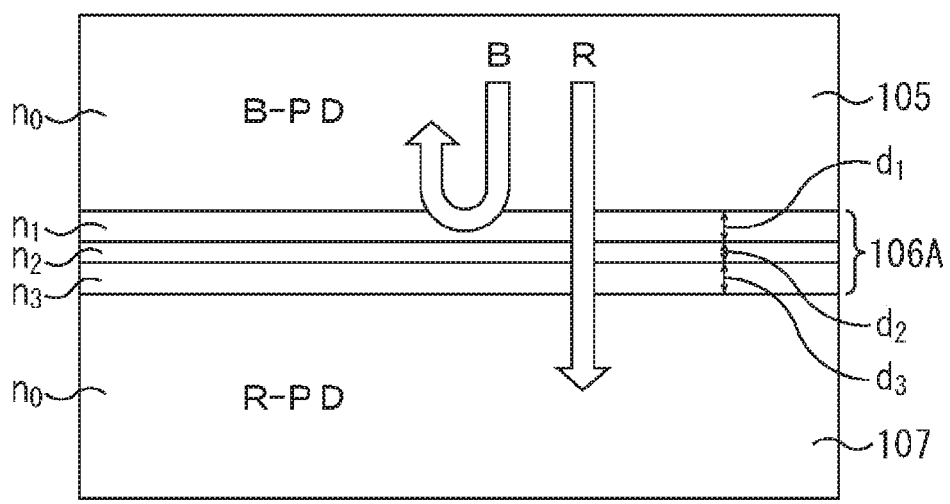
FIG. 5 is a view for explaining an interference effect by the optical interference film.

FIG. 5 is a view illustrating the interference effect by the optical interference film 106. Meanwhile, FIG. 5 illustrates a case where the multi-layer film 106A is formed as the optical interference film 106 between the B photodiode 105 and the R photodiode 107.

In FIG. 5, the multi-layer film 106A reflects the blue light (B) on the short wavelength side while transmitting the red light (R) on the long wavelength side. In order to obtain such interference effect in the multi-layer film 106A, it is necessary to design so as to satisfy a relationship of following expression (1).

$$d_X = \lambda_0 \times (2m_X+1)/4n_X \quad (1)$$

In expression (1), $d_X$ and $n_X$ represent a thickness and a refractive index in an X layer, respectively. Also, $m_X$ is set to an integer not smaller than 0.

Also, $\lambda_0$ represents a wavelength of the light. Herein, it is only necessary that $\lambda_0$ falls within a range of a wavelength band of the light which is wanted to be reflected, for example, in a range of 380 to 450 nm, and it is not necessarily required that this is a center wavelength of the wavelength band. A value of $\lambda_0$ may be different for each layer as long as this is within the range of the wavelength band of the light which is wanted to be reflected.

Herein, as the refractive index of the multi-layer film 106A which is the optical interference film, it is required to design to satisfy a relationship of following expression (2) such that the layers are stacked in the order that a high refractive index and a low refractive index are alternately repeated.

$$n_0 > n_1 < n_2 > n_3 < \ldots > n_{x-2} < n_{x-1} > n_x < n_0 \quad (2)$$

Specifically, in FIG. 5, in a case where the multi-layer film 106A formed between the B photodiode 105 (refractive index $n_0$) and the R photodiode 107 (refractive index $n_0$) formed of the n-type silicon (Si) is formed of the three layers of the silicon oxide film ($SiO_2$: refractive index $n_1$), the silicon film (Si: refractive index $n_2$), and the silicon oxide film ($SiO_2$: refractive index $n_3$) stacked on one another, the relationship of $n_0 > n_1$, $n_1 < n_2$, $n_2 > n_3$, and $n_3 < n_0$ is satisfied. If such a refractive index condition is satisfied, it is possible to obtain a high reflection ratio in a desired wavelength region.

(Structure of Pixel (Optical Interference Film: Single-Layer Film))

Figure 6:
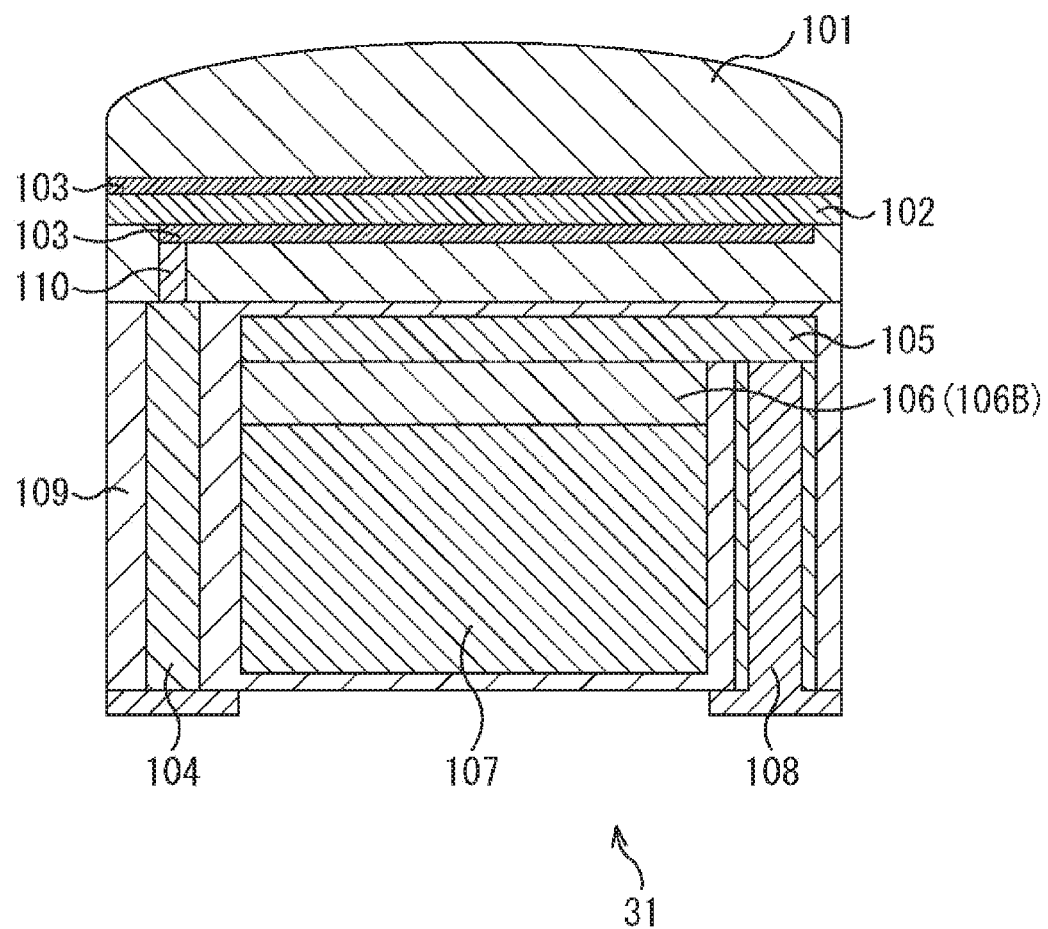
FIG. 6 is a cross-sectional view illustrating the structure of the pixel (optical interference film: single-layer film) in the first embodiment.

FIG. 6 is a cross-sectional view illustrating another structure of the pixel 31 (FIG. 3) including the longitudinal spectroscopic structure by the G organic photoelectric conversion film and the R and B photodiodes (B-PD and R-PD). In FIG. 6, the structure is different from that in FIG. 4 in that a single-layer film 106B is formed in place of the multi-layer film 106A as the optical interference film 106.

The single-layer film 106B is formed (inserted) between the B photodiode 105 and the R photodiode 107 formed of the n-type silicon (Si). The single-layer film 106B reflects the blue light (B) on the short wavelength side while transmitting the red light (R) on the long wavelength side out of the light transmitted through the B photodiode 105 (transmitted light).

The single-layer film 106B is formed of anyone of, for example, the silicon oxide film ($SiO_2$) or the silicon nitride film ($Si_3N_4$), the silicon film (Si), the titanium oxide film ($TiO_2$), the $(SiO_2)_X(Si_3N_4)_{1-X}$ and the like. Meanwhile, in the single-layer film 106B also, the interference effect in FIG. 5 may be obtained if the conditions of expressions (1) and (2) described above are satisfied as is the case with the multi-layer film 106A.

Meanwhile, in the structure of the pixel 31 in FIG. 6, the structure other than the single-layer film 106B formed between the B photodiode 105 and the R photodiode 107 in place of the multi-layer film 106A is the same as that of the pixel 31 in FIG. 4, so that the description thereof is omitted.

(Reflection Spectrum of Multi-Layer Film)

Figure 7:
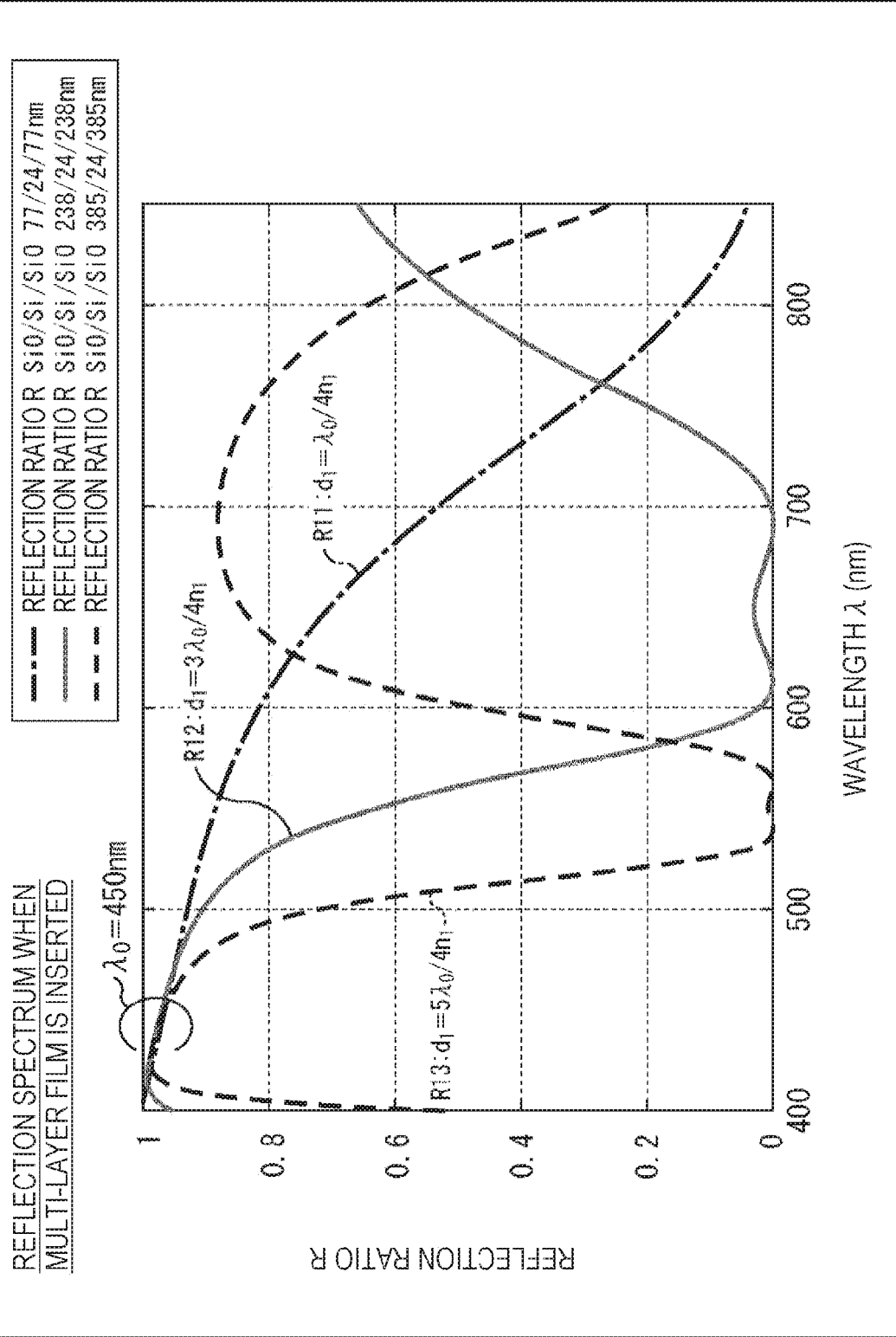
FIG. 7 is a view illustrating the reflection spectrum in a case where a multi-layer film structure is adopted.

FIG. 7 is a view illustrating a reflection spectrum in a case where the multi-layer film 106A is formed as the optical interference film 106 as in the structure of the pixel 31 illustrated in FIG. 4.

In FIG. 7, the abscissa axis represents a wavelength λ (nm); a value thereof increases from a left side toward a right side in the drawing. Also, the ordinate axis represents the reflection ratio R; a value thereof falls within a range of 0 to 1. Meanwhile, a relationship between these axes is similar also in the reflection spectrum in other drawings described later. Meanwhile, in order to obtain this reflection spectrum, an effective Fresnel coefficient method is used.

Figure 8:
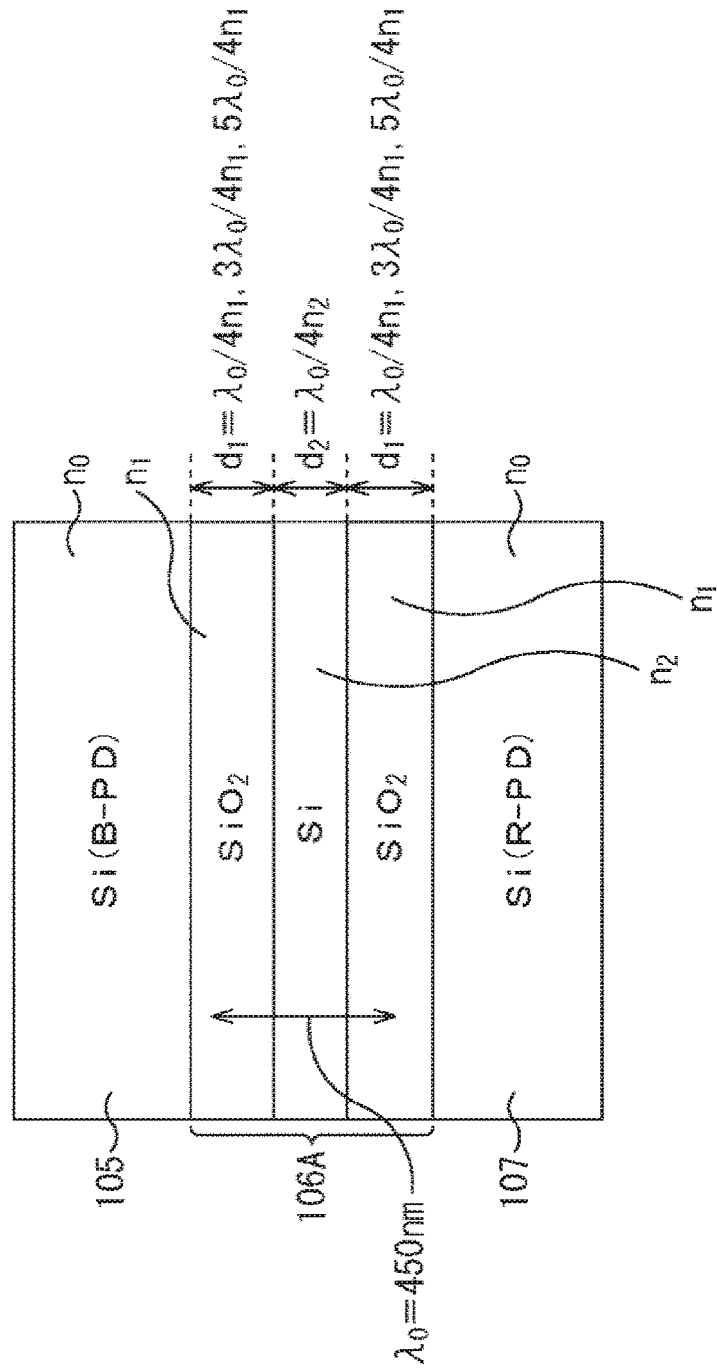
FIG. 8 is a cross-sectional view illustrating a structure corresponding to a condition of the reflection spectrum in FIG. 7.

FIG. 7 illustrates the reflection spectrum when the condition of expression (1) is changed in a case where the multi-layer film 106A obtained by stacking the three layers of the silicon oxide film ($SiO_2$), the silicon film (Si), and the silicon oxide film ($SiO_2$) is formed between the B photodiode 105 and the R photodiode 107 formed of silicon (Si) as illustrated in FIG. 8.

In FIG. 8, the silicon film (Si), the silicon oxide film ($SiO_2$), the silicon film (Si), the silicon oxide film ($SiO_2$), and the silicon film (Si) are stacked in this order from an upper layer toward a lower layer in a light traveling direction ($Si/SiO_2/Si/SiO_2/Si$), and further, each layer is designed to satisfy the relationship of expression (1). Also, the condition of expression (2), that is, the refractive index of each layer satisfies the relationship of $n_0 > n_1$ and $n_1 < n_2$.

A thickness of the silicon film (Si) out of the multi-layer film 106A is fixed to $d_2=\lambda_0/4n_2$ by setting $\lambda_0=450$ nm and $m_2=0$. Also, FIG. 7 illustrates the reflection spectrum when the thickness of the silicon oxide film (SiO$_2$) out of the multi-layer film 106A is changed.

In FIG. 7, a reflection spectrum R11 is the reflection spectrum in a case of forming the multi-layer film 106A whose thickness is $d_1=\lambda_0/4n_1$ by setting $\lambda_0=450$ nm and $m_1=0$. Also, a reflection spectrum R12 is the reflection spectrum in the case of forming the multi-layer film 106A whose thickness is $d_1=3\lambda_0/4n_1$ by setting $\lambda_0=450$ nm and $m_1=1$. Furthermore, a reflection spectrum R13 is the reflection spectrum in a case where the multi-layer film 106A whose thickness is $d_1=5\lambda_0/4n_1$ by setting $\lambda_0=450$ nm and $m_1=2$.

That is, from the results of the reflection spectra R11 to R13 with $\lambda_0=450$ nm, it is understood that a wave cycle of amplitude in a vertical direction of the reflection spectrum becomes shorter as the value of $m_1$ increases. Then, in the reflection spectrum R12 where $m_1=1$, the thickness of the multi-layer film 106A is $d_1=3\lambda_0/4n_1$; at that time, the blue light (B) of the short wavelength is reflected and the red light (R) of the long wavelength is transmitted, so that the multi-layer film 106A in FIG. 8 in which this condition is set meets the conditions required for the optical interference film 106.

(Spectral Sensitivity Characteristic Upon Insertion of Multi-Layer Film (B-PD 0.6 µm))

Figure 9:
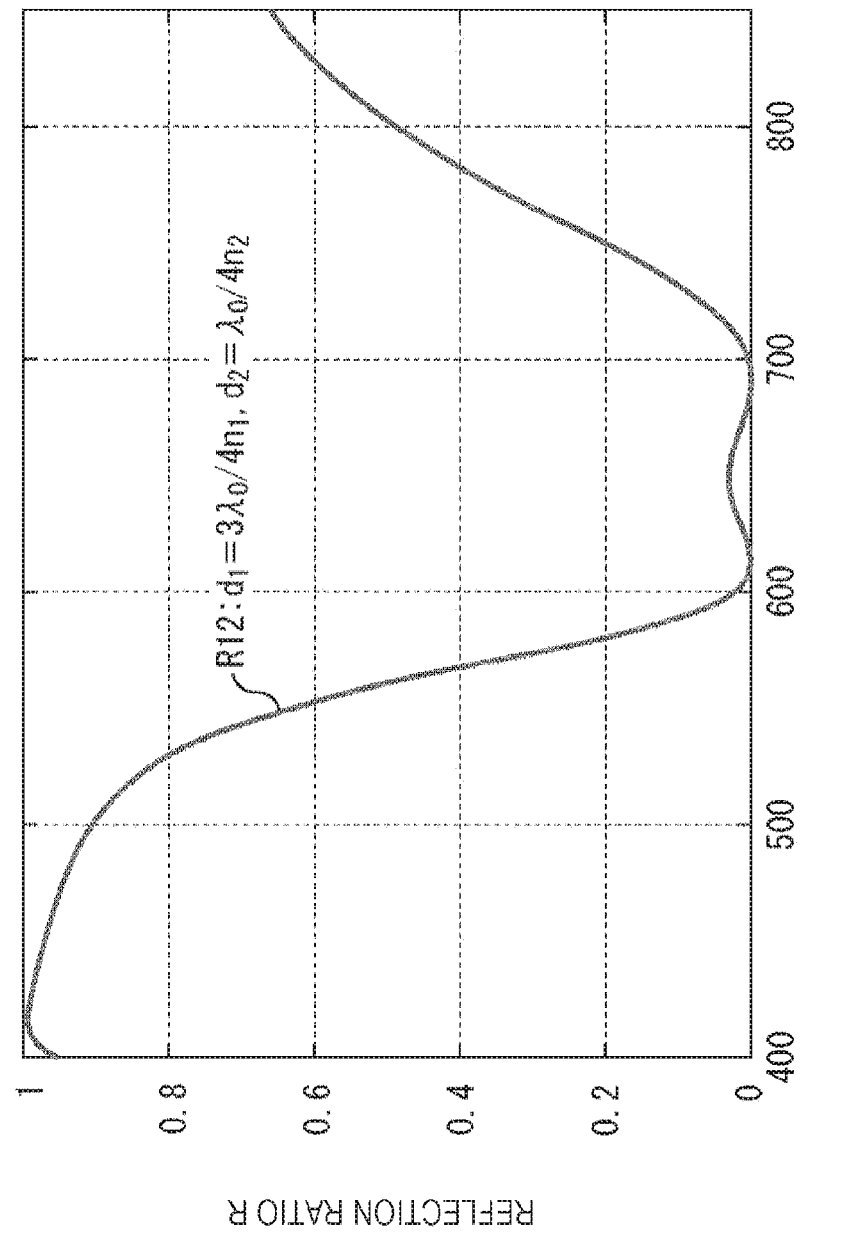
FIG. 9 is a view illustrating an optimum reflection spectrum in a case where the multi-layer film structure is adopted.

FIG. 9 is a view illustrating an optimum reflection spectrum out of the reflection spectra in the case of adopting the structure of the multi-layer film in FIG. 7. That is, the reflection spectrum in FIG. 9 corresponds to the reflection spectrum R12 in FIG. 7.

Figure 10:
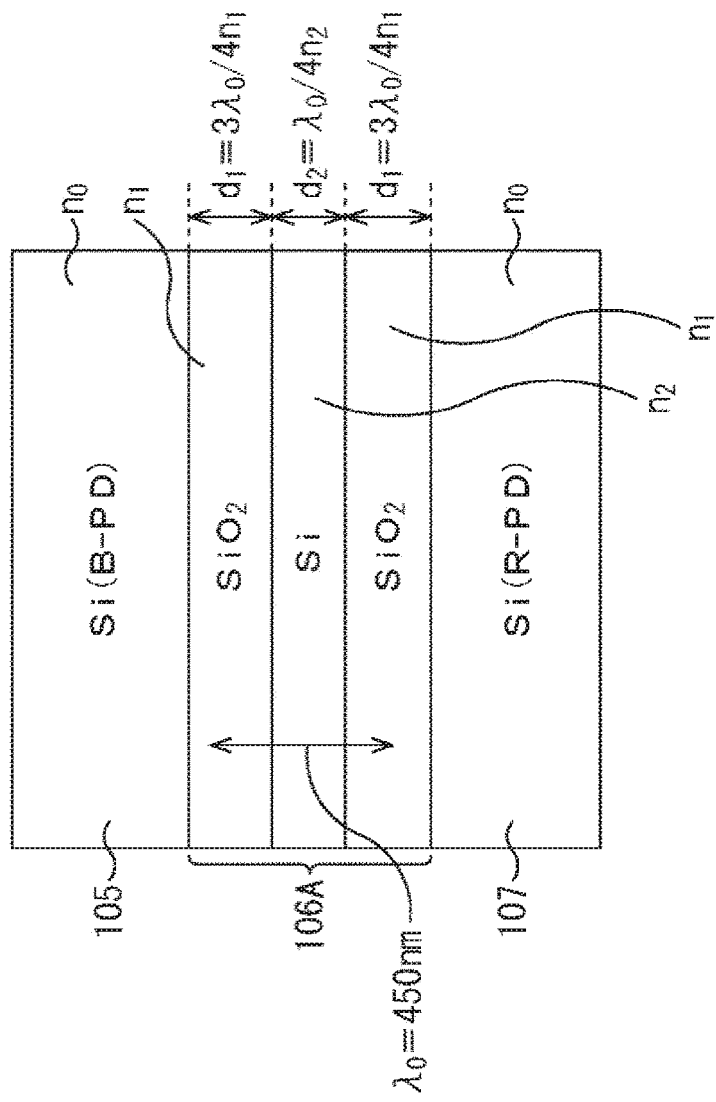
FIG. 10 is a cross-sectional view illustrating a structure corresponding to a condition of the reflection spectrum in FIG. 9.

That is, FIG. 9 illustrates the reflection spectrum R12 when $\lambda_0=450$ nm, $d_1=3\lambda_0/4n_1$, and $d_2=\lambda_0/4n_2$ are satisfied in a case where the multi-layer film 106A obtained by stacking the three layers of the silicon oxide film (SiO$_2$), the silicon film (Si), and the silicon oxide film (SiO$_2$) is formed between the B photodiode 105 and the R photodiode 107 formed of silicon (Si) as illustrated in FIG. 10.

Figure 11:
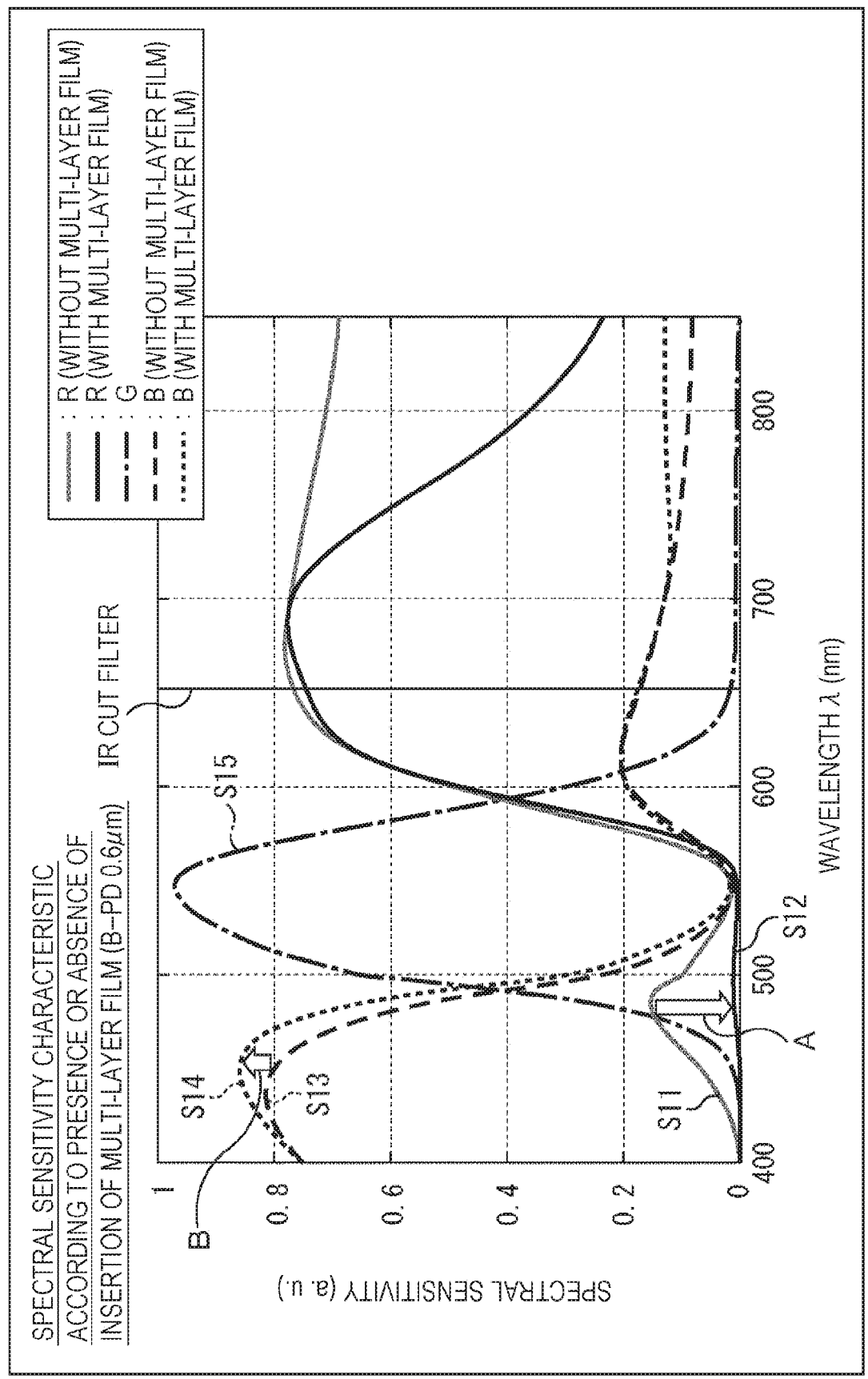
FIG. 11 is a view illustrating a spectral sensitivity characteristic (B-PD 0.6 μm) according to the presence or absence of insertion of the multi-layer film.

The spectral sensitivity characteristic in a case where the multi-layer film 106A (hereinafter, also referred to as optimum multi-layer film 106A) in FIG. 10 in which a condition for obtaining such optimum reflection spectrum is set is formed between the B photodiode 105 and the R photodiode 107 and a (normal) spectral sensitivity characteristic in a case where the optimum multi-layer film 106A is not formed are illustrated in FIG. 11. In FIG. 11, the spectral sensitivity characteristic when a thickness of the B photodiode 105 in FIG. 10 is set to 0.6 µm is illustrated.

In FIG. 11, the abscissa axis represents the wavelength λ (nm); a value thereof increases from a left side toward a right side in the drawing. Also, the ordinate axis represents spectral sensitivity (a.u.); a value thereof falls within a range of 0 to 1. Meanwhile, a relationship between these axes is similar in the spectral sensitivity characteristic in other drawings described later.

In FIG. 11, a spectral sensitivity curve S11 indicates the spectral sensitivity characteristic of the red light (R) in a case where the optimum multi-layer film 106A is not inserted. Also, a spectral sensitivity curve S12 indicates the spectral sensitivity characteristic of the red light (R) in a case where the optimum multi-layer film 106A is inserted. When comparing the spectral sensitivity curve S11 with the spectral sensitivity curve S12, the spectral sensitivity of the red light (R) in a blue wavelength region significantly decreases by the insertion of the optimum multi-layer film 106A to approach to zero as indicated by arrow A in the drawing.

Also, in FIG. 11, a spectral sensitivity curve S13 indicates the spectral sensitivity characteristic of the blue light (B) in a case where the optimum multi-layer film 106A is not inserted. Also, a spectral sensitivity curve S14 indicates the spectral sensitivity characteristic of the blue light (B) in a case where the optimum multi-layer film 106A is inserted. When comparing the spectral sensitivity curve S13 with the spectral sensitivity curve S14, the spectral sensitivity of the blue light (B) increases by the insertion of the optimum multi-layer film 106A as indicated by arrow B in the drawing.

In this manner, the spectral sensitivity characteristic may be improved by the insertion of the optimum multi-layer film 106A. Especially, color mixture due to the blue light (B) incident on the R photodiode 107 may be inhibited, and the sensitivity of the blue light (B) may be improved.

Meanwhile, since the spectral sensitivity characteristic illustrated in FIG. 11 is a result of optical simulation, actually, in the normal spectral sensitivity characteristic without the optimum multi-layer film 106A inserted, a color mixture component due to carriers electrically crossing a potential barrier is additionally present. On the other hand, by inserting the silicon oxide film (SiO$_2$) and the like having a wide band gap as in the optimum multi-layer film 106A, the potential barrier becomes larger, and as a result, there is an effect that the color mixture component is blocked. Therefore, by inserting the optimum multi-layer film 106A formed of the silicon oxide film (SiO$_2$) and the like, an effect of improving the spectral sensitivity characteristic further increases.

In this manner, as the spectral sensitivity characteristic approaches ideal spectroscopy, an absolute value of a matrix coefficient at the time of color correction calculation is controlled to be low, and as a result, an image quality with a high SN ratio may be obtained.

Meanwhile, although the spectral sensitivity characteristic in the wavelength region of 650 nm or longer is illustrated in FIG. 11, since an IR cut filter is actually inserted, regarding the light in this wavelength region, even if the spectral sensitivity characteristic especially changes, an effect thereof is small. Also, in FIG. 11, the spectral sensitivity characteristic of the green light (G) is illustrated as a spectral sensitivity curve S15 for comparison.

(Spectral Sensitivity Characteristic Upon Insertion of Multi-Layer Film (B-PD 0.3 µm))

Figure 12:
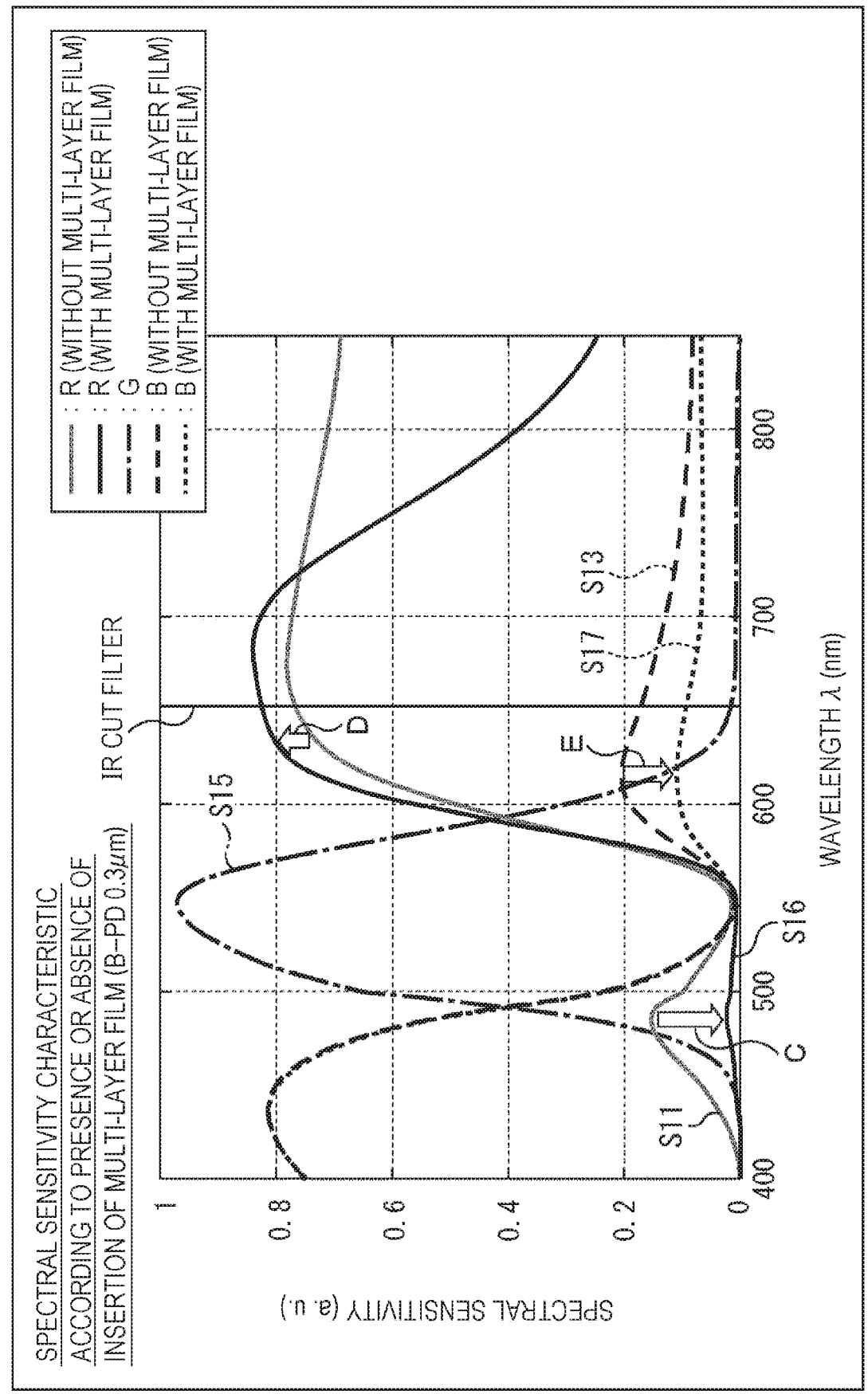
FIG. 12 is a view illustrating the spectral sensitivity characteristic (B-PD 0.3 μm) according to the presence or absence of the insertion of the multi-layer film.

FIG. 12 is a view illustrating the spectral sensitivity characteristic at the time of the insertion of the interference film (B-PD 0.3 µm).

That is, although the spectral sensitivity characteristic in a case where the thickness of the B photodiode 105 is set to 0.6 µm is illustrated in FIG. 11 described above, in FIG. 12, that in a case where the thickness of the B photodiode 105 is reduced to 0.3 µm is illustrated.

In FIG. 12, the spectral sensitivity characteristic in a case where the thickness of the B photodiode 105 is set to 0.6 µm and the optimum multi-layer film 106A in FIG. 10 is not formed is also illustrated in addition to the spectral sensitivity characteristic in a case where the thickness of the B photodiode 105 is set to 0.3 µm and the optimum multi-layer film 106A in FIG. 10 is formed between the B photodiode 105 and the R photodiode 107 for comparison.

In FIG. 12, as is the case with the spectral sensitivity curve S11 in FIG. 11, the spectral sensitivity curve S11 indicates the spectral sensitivity characteristic of the red light (R) when the optimum multi-layer film 106A is not inserted in a case where the thickness of the B photodiode 105 is 0.6 µm. Also, a spectral sensitivity curve S16 indicates the spectral sensitivity characteristic of the red light (R) when the optimum multi-layer film 106A is inserted in a case where the thickness of the B photodiode 105 is 0.3 µm.

When comparing the spectral sensitivity curve S11 with the spectral sensitivity curve S16, by making the B photodiode 105 thinner and inserting the optimum multi-layer film 106A, the spectral sensitivity of the red light (R) in the blue wavelength region significantly decreases, and its value approaches to zero as indicated by arrow C in the drawing. Also, when comparing the spectral sensitivity curve S11 with the spectral sensitivity curve S16, by making the B photodiode 105 thinner and inserting the optimum multi-layer film 106A, the spectral sensitivity of the red light (R) increases as indicated by arrow D in the drawing.

Also, in FIG. 12, the spectral sensitivity curve S13 indicates the spectral sensitivity characteristic of the blue light (B) when the optimum multi-layer film 106A is not inserted in a case where the thickness of the B photodiode 105 is 0.6 µm as is the case with the spectral sensitivity curve S13 in FIG. 11. Also, a spectral sensitivity curve S17 indicates the spectral sensitivity characteristic of the blue light (B) when the optimum multi-layer film 106A is inserted in a case where the thickness of the B photodiode 105 is 0.3 µm.

When comparing the spectral sensitivity curve S13 with the spectral sensitivity curve S17, the spectral sensitivity of the blue light (B) in the red wavelength region is lowered by making the B photodiode 105 thinner and inserting the optimum multi-layer film 106A as indicated by arrow E in the drawing.

In this manner, by inserting the optimum multi-layer film 106A and further thinning the B photodiode 105, the spectral sensitivity characteristic may be improved. Especially, it is possible to simultaneously inhibit the color mixture due to the blue light (B) incident on the R photodiode 107 and the color mixture due to the red light (R) incident on the B photodiode 105 and improve the spectral sensitivity of the red light (R).

Herein, the color mixture due to the blue light (B) incident on the R photodiode 107 is reduced mainly by an effect of the insertion of the optimum multi-layer film 106A. Also, the color mixture due to the red light (R) incident on the B photodiode 105 is reduced and the spectral sensitivity of the red light (R) is improved because the B photodiode 105 is thinned so that an optical path length of the red light (R) in the B photodiode 105 is shortened, and the component of the red light (R) incident on the R photodiode 107 increases accordingly.

Meanwhile, since the spectral sensitivity characteristic illustrated in FIG. 12 is the result of the optical simulation, in the normal spectral sensitivity characteristics, there actually is an additional color mixture component due to the carriers electrically crossing the potential barrier. By inserting the silicon oxide film ($SiO_2$) and the like having a wide band gap as the optimum multi-layer film 106A, the potential barrier becomes large, and as a result, there is an effect that the color mixture component is blocked. Therefore, by forming the optimum multi-layer film 106A formed of the silicon oxide film ($SiO_2$) and the like, the effect of improving the spectral sensitivity characteristic is further increased.

In this manner, as the spectral sensitivity characteristic approaches ideal spectroscopy, an absolute value of a matrix coefficient at the time of color correction calculation is controlled to be low, and as a result, an image quality with a high SN ratio may be obtained.

(Variation in Wavelength $\lambda_0$ Upon Insertion of Multi-Layer Film)

Figure 13:
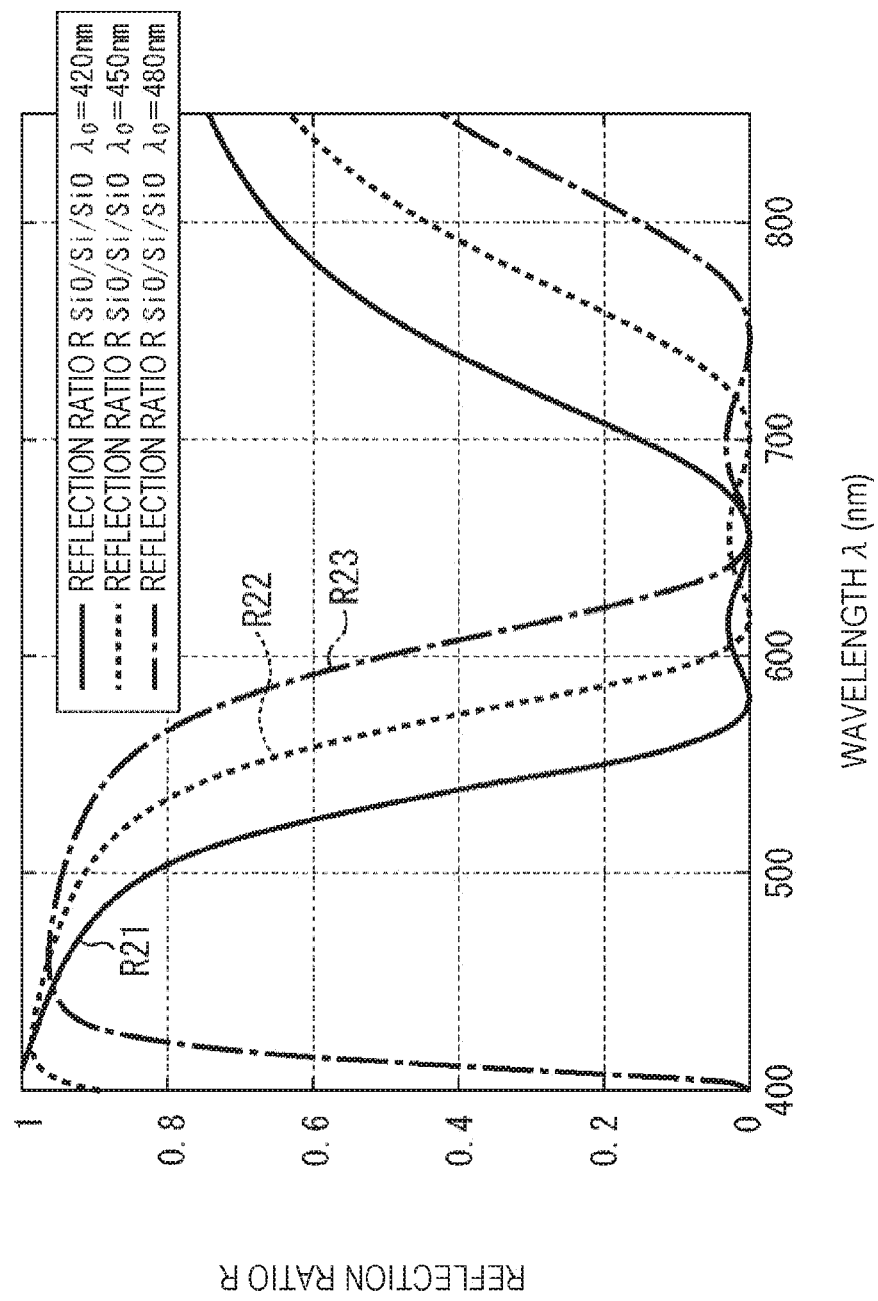
FIG. 13 is a view illustrating the reflection spectrum corresponding to variation in wavelength $\lambda_0$ at the time of the insertion of the multi-layer film.

Variation in thickness in a manufacturing process within a wafer surface and a process run is set within approximately ±8%. That is, in the optimum multi-layer film 106A, it is necessary to satisfy wavelength $\lambda_0$=450 nm as a condition for obtaining the optimum reflection spectrum, so that $\lambda_0$=420 to 480 nm around 450 nm is made a variation range. FIG. 13 illustrates the reflection spectrum within the range of $\lambda_0$=420 to 480 nm.

Figure 14:
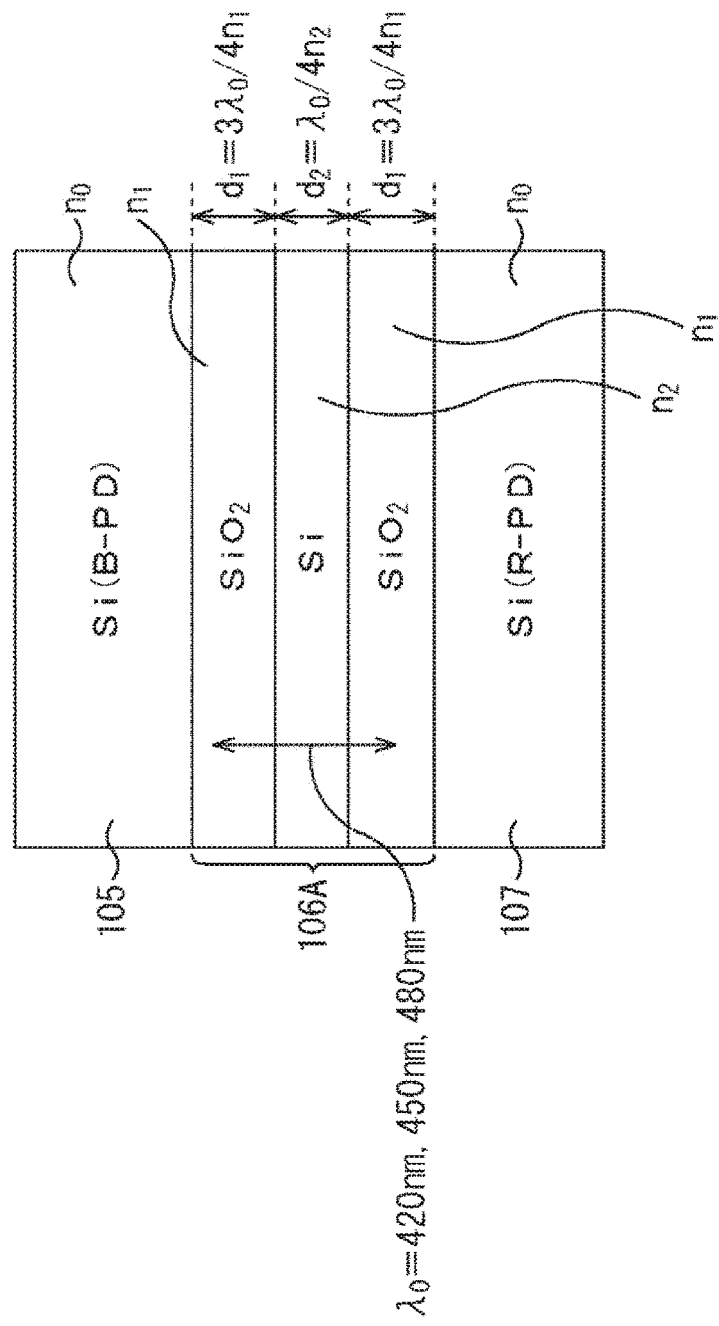
FIG. 14 is a cross-sectional view illustrating a structure corresponding to a condition of the reflection spectrum in FIG. 13.

In FIG. 13, the reflection spectra when the value of the wavelength $\lambda_0$ in expression (1) is set to 420 nm, 450 nm, and 480 nm in a case where the optimum multi-layer film 106A obtained by stacking the three layers of the silicon oxide film ($SiO_2$), the silicon film (Si), and the silicon oxide film ($SiO_2$) is formed between the B photodiode 105 and the R photodiode 107 formed of silicon (Si) as illustrated in FIG. 14 are illustrated. In this case also, it is assumed that the condition of expression (2) is satisfied.

In FIG. 13, a reflection spectrum R21 is the reflection spectrum in a case where the optimum multi-layer film 106A is inserted when $\lambda_0$=420 nm. Also, a reflection spectrum R22 is the reflection spectrum in a case where the optimum multi-layer film 106A is inserted when $\lambda_0$=450 nm. Furthermore, a reflection spectrum R23 is the reflection spectrum in a case where the multi-layer film 106A is inserted when $\lambda_0$=480 nm.

In the reflection spectra R21 to R23, an effect by the insertion of the optimum multi-layer film 106A may be obtained within the variation range of $\lambda_0$=420 to 480 nm, because the reflection ratio of the blue light (B) on the short wavelength (400 to 500 nm) side is large and the reflection ratio of the red light (R) on the long wavelength (550 to 650 nm) side is small.

(Reflection Spectrum of Single-Layer Film)

Figure 15:
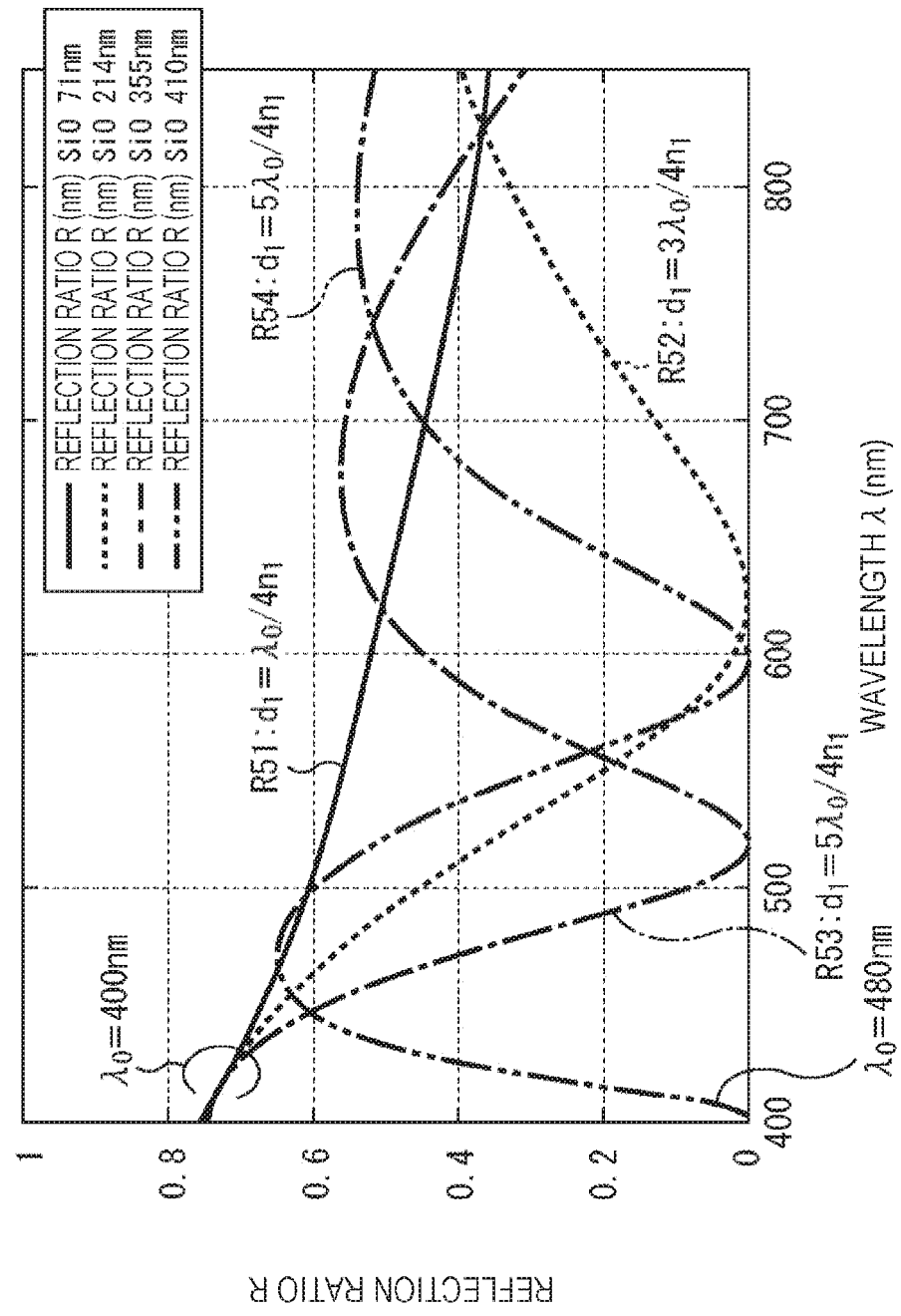
FIG. 15 is a view illustrating the reflection spectrum in a case where a structure of a single-layer film is adopted.

FIG. 15 is a view illustrating the reflection spectrum in a case where the single-layer film 106B is formed as the optical interference film 106 as in the structure of the pixel 31 illustrated in FIG. 6.

Figure 16:
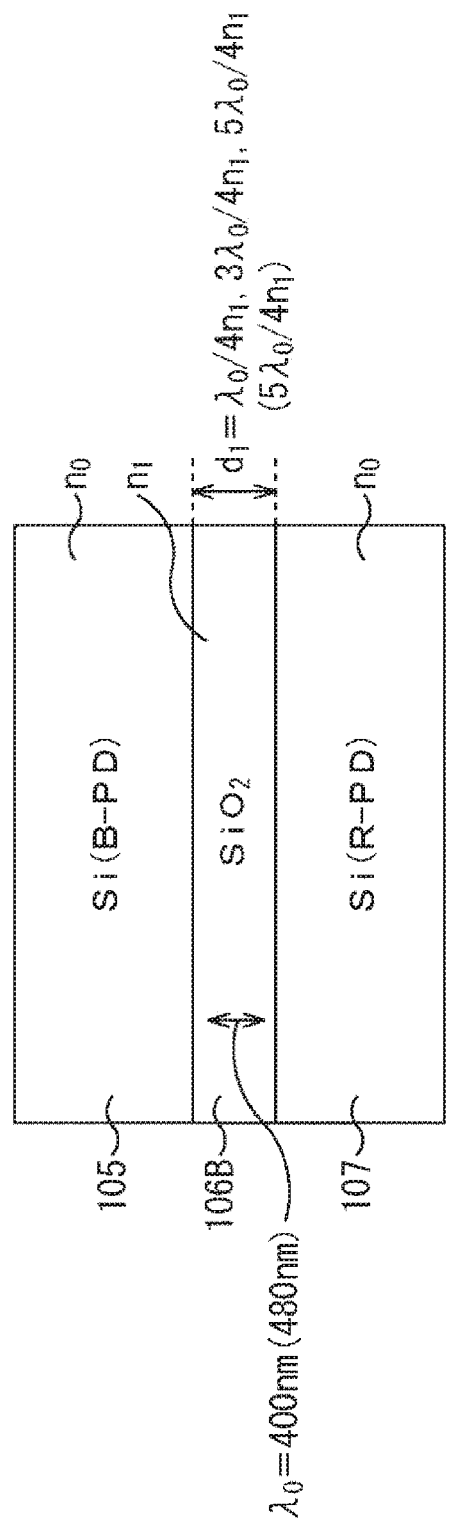
FIG. 16 is a cross-sectional view illustrating a structure corresponding to a condition of the reflection spectrum in FIG. 15.

FIG. 15 illustrates the reflection spectrum when changing the condition of expression (1) in a case where the single-layer film 106B formed of the silicon oxide film ($SiO_2$) is formed between the B photodiode 105 and the R photodiode 107 formed of silicon (Si) as illustrated in FIG. 16.

In FIG. 16, the silicon film (Si), the silicon oxide film ($SiO_2$), and the silicon film (Si) are stacked in this order (Si/$SiO_2$/Si) from the upper layer toward the lower layer in the light traveling direction, and further, each layer is designed to satisfy the relationship of expression (1). Also, it is assumed that the condition of expression (2), that is, the relationship of $n_0 > n_1$ of the refractive index of each layer is satisfied.

FIG. 15 illustrates the reflection spectrum when the thickness of the silicon oxide film ($SiO_2$) forming the single-layer film 106B is changed.

In FIG. 15, a reflection spectrum R51 is the reflection spectrum in a case of forming the single-layer film 106B whose thickness is $d_1 = \lambda_0/4n_1$ by setting $\lambda_0$=400 nm and $m_1$=0. Also, a reflection spectrum R52 is the reflection spectrum in a case of forming the single-layer film 106B whose thickness is $d_1 = 3\lambda_0/4n_1$ by setting $\lambda_0$=400 nm and $m_1$=1. Furthermore, a reflection spectrum R53 is the reflection spectrum in a case of forming the single-layer film 106B whose thickness is $d_1 = 5\lambda_0/4n_1$ by setting $\lambda_0$=400 nm and $m_1$=2.

That is, from the results of the reflection spectra R51 to R53 with $\lambda_0$=400 nm, it is understood that the wave cycle of the amplitude in the vertical direction of the reflection spectrum becomes shorter as the value of $m_1$ increases. Then, in the reflection spectrum R52 where $m_1$=1, the thickness of the single-layer film 106B is $d_1$=3$\lambda_0$/4$n_1$; at that time, the blue light (B) of the short wavelength is reflected and the red light (R) of the long wavelength is transmitted, so that the single-layer film 106B in FIG. 16 in which this condition is set meets the conditions required for the optical interference film 106.

Also, in FIG. 15, a reflection spectrum R54 is the reflection spectrum in a case of forming the single-layer film 106B whose thickness is $d_1$=5$\lambda_0$/4$n_1$ by setting $\lambda_0$=480 nm and $m_1$=2. In the reflection spectrum R54 where $m_1$=2, since the blue light (B) of the short wavelength is reflected and the red light (R) of the long wavelength is transmitted in a case of $\lambda_0$=480 nm, the single-layer film 106B in FIG. 16 in which this condition is set meets the condition required for the optical interference film 106.

(Spectral Sensitivity Characteristics Upon Insertion of Single Layer (B-PD 0.5 μm))

It is described that the reflection spectrum R52 is the optimum reflection spectrum in a case where the structure of the single-layer film is adopted in FIG. 15 described above. That is, the reflection spectrum R52 in FIG. 15 is the reflection spectrum when $\lambda_0$=400 nm and $d_1$=3$\lambda_0$/4$n_1$ in a case where the single-layer film 106B formed of the silicon oxide film (SiO$_2$) is formed between the B photodiode 105 and the R photodiode 107 formed of silicon (Si) as illustrated in FIG. 16.

Figure 17:
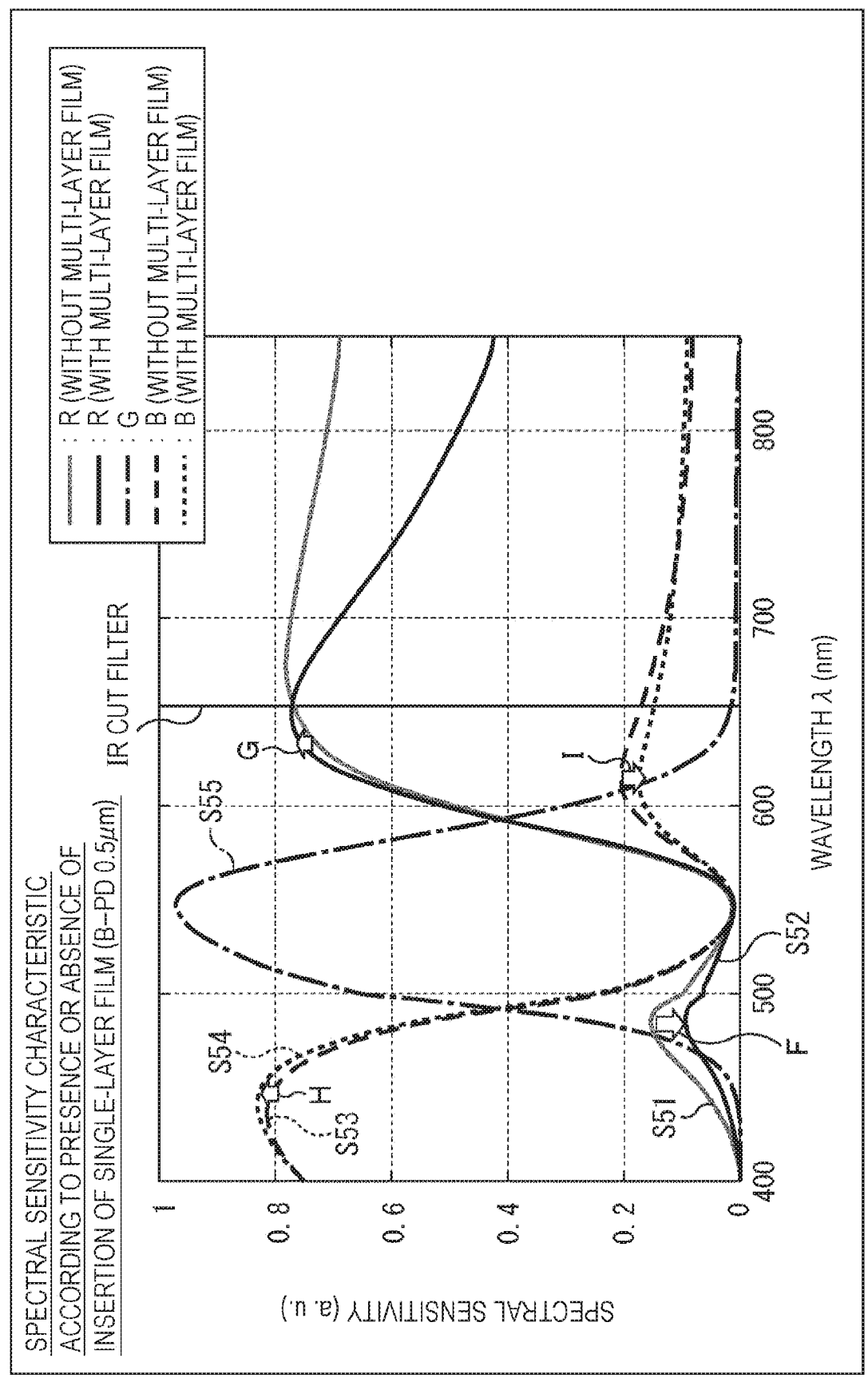
FIG. 17 is a view illustrating a spectral sensitivity characteristic according to the presence or absence of insertion of the single-layer film (B-PD 0.5 µm).

The spectral sensitivity characteristic in a case where the single-layer film 106B (hereinafter, also referred to as optimum single-layer film 106B) in FIG. 16 meeting such condition of obtaining the optimum reflection spectrum is formed between the B photodiode 105 and the R photodiode 107 and the (normal) spectral sensitivity characteristic in a case where the optimum single-layer film 106B is not formed are illustrated in FIG. 17. In FIG. 17, the spectral sensitivity characteristic when the thickness of the B photodiode 105 in FIG. 16 is set to 0.5 μm is illustrated.

In FIG. 17, a spectral sensitivity curve S51 indicates the spectral sensitivity characteristic of the red light (R) in a case where the optimum single-layer film 106B is not inserted. Also, a spectral sensitivity curve S52 indicates the spectral sensitivity characteristic of the red light (R) in a case where the optimum single-layer film 106B is inserted.

When comparing the spectral sensitivity curve S51 with the spectral sensitivity curve S52, as indicated by arrow F in the drawing, the spectral sensitivity of the red light (R) in the blue wavelength region decreases by the insertion of the optimum single-layer film 106B. Also, when comparing the spectral sensitivity curve S51 with the spectral sensitivity curve S52, as indicated by arrow G in the drawing, the spectral sensitivity of the red light (R) increases by the insertion of the optimum single-layer film 106B.

Also, in FIG. 17, a spectral sensitivity curve S53 indicates the spectral sensitivity characteristic of the blue light (B) in a case where the optimum single-layer film 106B is not inserted. Also, a spectral sensitivity curve S54 indicates the spectral sensitivity characteristic of the blue light (B) in a case where the optimum single-layer film 106B is inserted.

When comparing the spectral sensitivity curve S53 with the spectral sensitivity curve S54, the spectral sensitivity of the blue light (B) increases by the insertion of the optimum single-layer film 106B as indicated by arrow H in the drawing. Also, when comparing the spectral sensitivity curve S53 with the spectral sensitivity curve S54, the spectral sensitivity of the blue light (B) in the red wavelength region decreases by the insertion of the optimum single layer 106B as indicated by arrow I in the drawing.

In this manner, by the insertion of the optimum single-layer film 106B, the spectral sensitivity characteristic may be improved. Especially, it is possible to inhibit the color mixture due to the blue light (B) incident on the R photodiode 107 and the color mixture due to the red light (R) incident on the B photodiode 105 and improve the spectral sensitivity of the blue light (B) and the red light (R).

Meanwhile, since the spectral sensitivity characteristic illustrated in FIG. 17 is the result of the optical simulation, actually, in the normal spectral sensitivity characteristic, the color mixture component due to the carriers electrically crossing the potential barrier is additionally present. On the other hand, by inserting the silicon oxide film (SiO$_2$) and the like having a wide band gap like the optimum single-layer film 106B, the potential barrier becomes large, and as a result, there is an effect that the color mixture component is blocked. Therefore, by inserting the optimum single-layer film 106B formed of the silicon oxide film (SiO$_2$) and the like, the effect of improving the spectral sensitivity characteristic further increases.

In this manner, as the spectral sensitivity characteristic approaches ideal spectroscopy, an absolute value of a matrix coefficient at the time of color correction calculation is controlled to be low, and as a result, an image quality with a high SN ratio may be obtained.

Meanwhile, although the spectral sensitivity characteristic in the wavelength region of 650 nm or longer is illustrated in FIG. 17, since an IR cut filter is actually inserted, regarding the light in this wavelength region, even if the spectral sensitivity characteristic especially changes, an effect thereof is small. Also, in FIG. 17, the spectral sensitivity characteristic of the green light (G) is illustrated as a spectral sensitivity curve S55 for comparison.

(Variation in Wavelength $\lambda_0$ Upon Insertion of Single-Layer Film)

Figure 18:
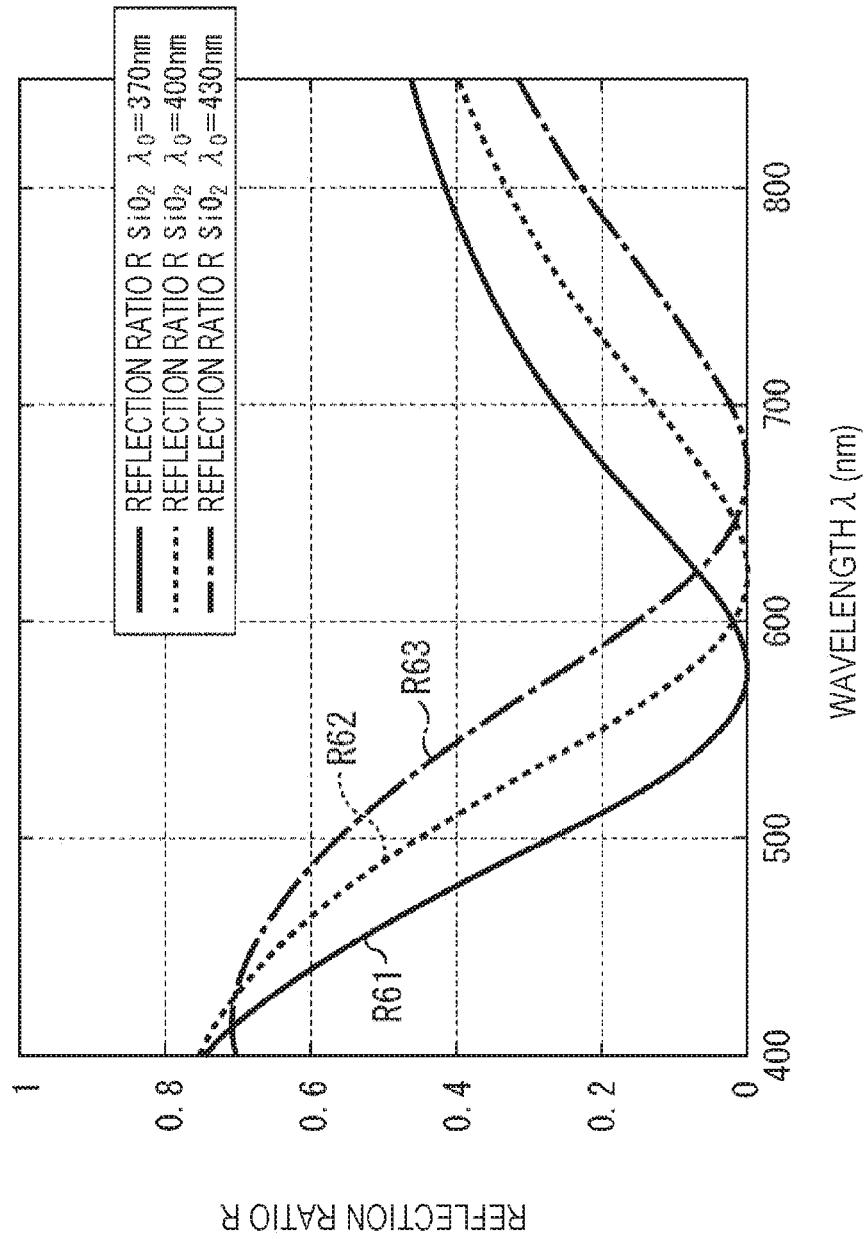
FIG. 18 is a view illustrating a reflection spectrum corresponding to variation in wavelength $\lambda_0$ at the time of the insertion of the single-layer film.

As described above, since the variation in the thickness in the manufacturing process within the wafer surface and the process run is set within approximately ±8%, in the optimum single-layer film 106B, it is necessary to satisfy the wavelength $\lambda_0$=400 nm as a condition for obtaining the optimum reflection spectrum, so that $\lambda_0$=370 to 430 nm around 400 nm is made the variation range. FIG. 18 illustrates the reflection spectrum in the range of $\lambda_0$=370 to 430 nm.

Figure 19:
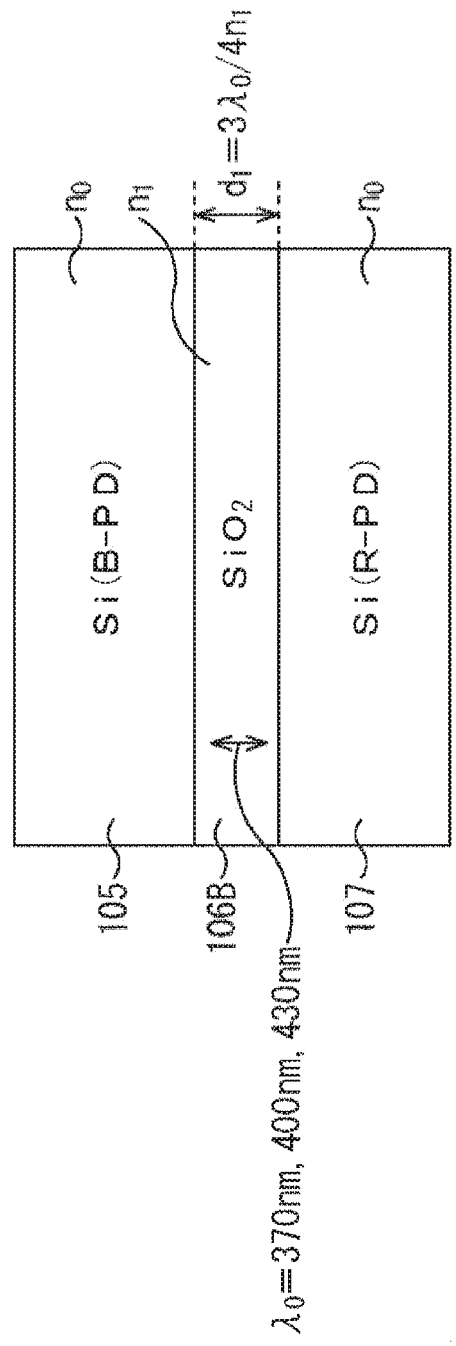
FIG. 19 is a cross-sectional view illustrating a structure corresponding to a condition of the reflection spectrum in FIG. 18.

In FIG. 18, the reflection spectra when the value of the wavelength $\lambda_0$ in expression (1) is set to 370 nm, 400 nm, and 430 nm in a case where the single-layer film 106B formed of the silicon oxide film (SiO$_2$) is formed between the B photodiode 105 and the R photodiode 107 formed of silicon (Si) as illustrated in FIG. 19 are illustrated. In this case also, it is assumed that the condition of expression (2) is satisfied.

In FIG. 18, a reflection spectrum R61 is the reflection spectrum in a case where the optimum single-layer film 106B is formed when $\lambda_0$=370 nm. Also, a reflection spectrum R62 is the reflection spectrum in a case of forming the optimum single-layer film 106B when $\lambda_0$=400 nm. Furthermore, a reflection spectrum R63 is the reflection spectrum in a case of forming the optimum single-layer film 106B when $\lambda_0$=430 nm.

In the reflection spectra R61 to R63, an effect by the insertion of the optimum single-layer film 106B may be obtained within the variation range of $\lambda_0$=370 to 430 nm, because the reflection ratio of the blue light (B) on the short wavelength (400 to 500 nm) side is large and the reflection ratio of the red light (R) on the long wavelength (550 to 650 nm) side is small.

Meanwhile, it is described with reference to FIG. 15 that a case of the reflection spectrum when the single-layer film 106B whose thickness is $d_1=5\lambda_0/4n_1$ is formed by setting $\lambda_0=480$ nm and $m_1=2$ as the reflection spectrum R54 also meets the condition required for the optical interference film 106; the single-layer film 106B meeting the condition for obtaining the reflection spectrum R54 may also be made the optimum single-layer film 106B. Herein, although the result of the optical simulation is not illustrated, it is confirmed that the spectral sensitivity characteristic approaches the ideal spectroscopy as in the above-described case by inserting the optimum single-layer film 106B between the B photodiode 105 and the R photodiode 107. Also, the variation in the wavelength $\lambda_0$ in this case is set within approximately ±8%, so that it is possible to make the range of $\lambda_0=440$ to 500 nm around $\lambda_0=480$ nm, for example, the variation range.

(Reflection Spectrum in Case where Value of Wavelength $\lambda_0$ is Changed)

Figure 20:
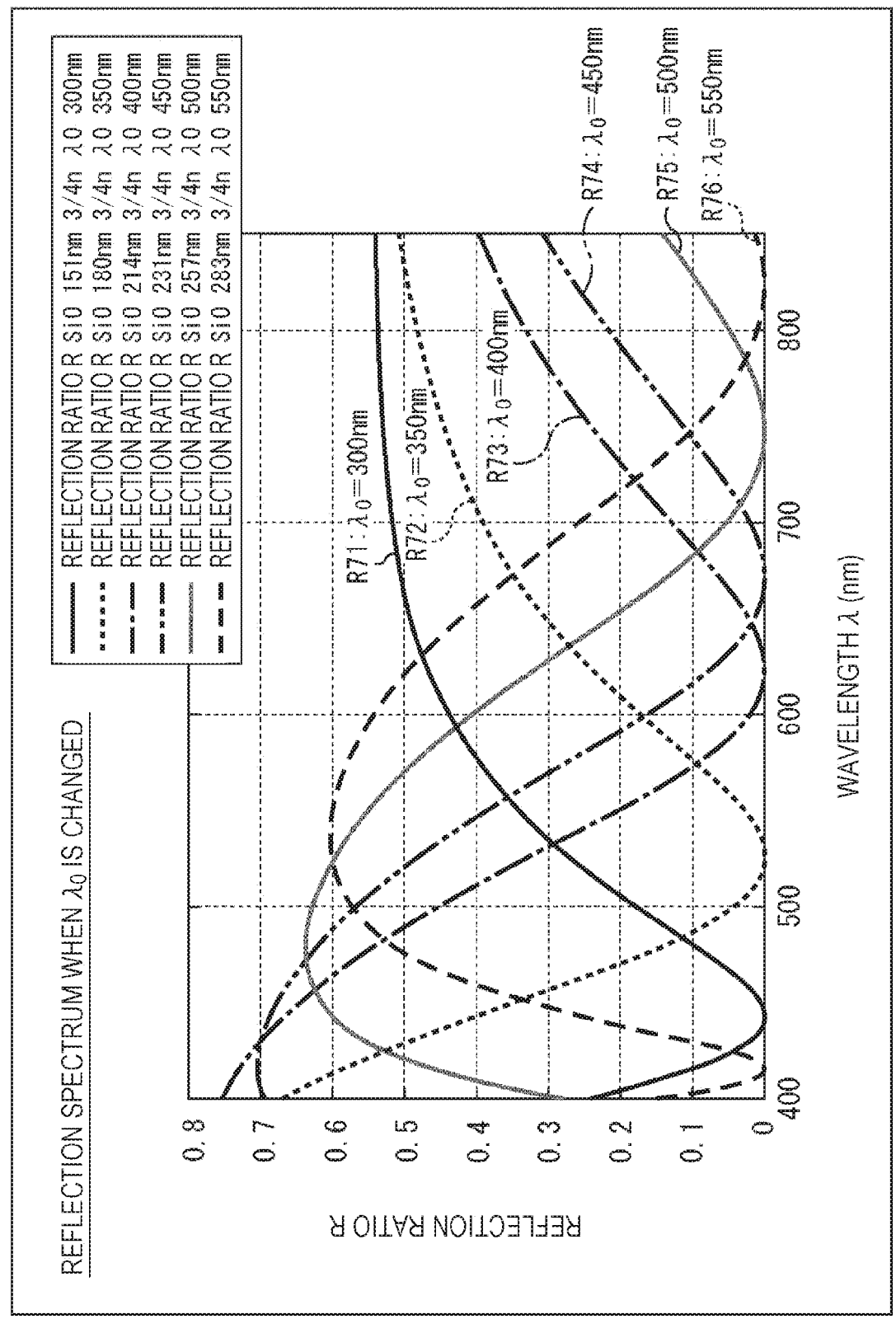
FIG. 20 is a view illustrating the reflection spectrum in a case where the wavelength $\lambda_0$ is changed.

FIG. 20 is a view illustrating the reflection spectrum in a case where the value of the wavelength $\lambda_0$ is changed.

Figure 21:
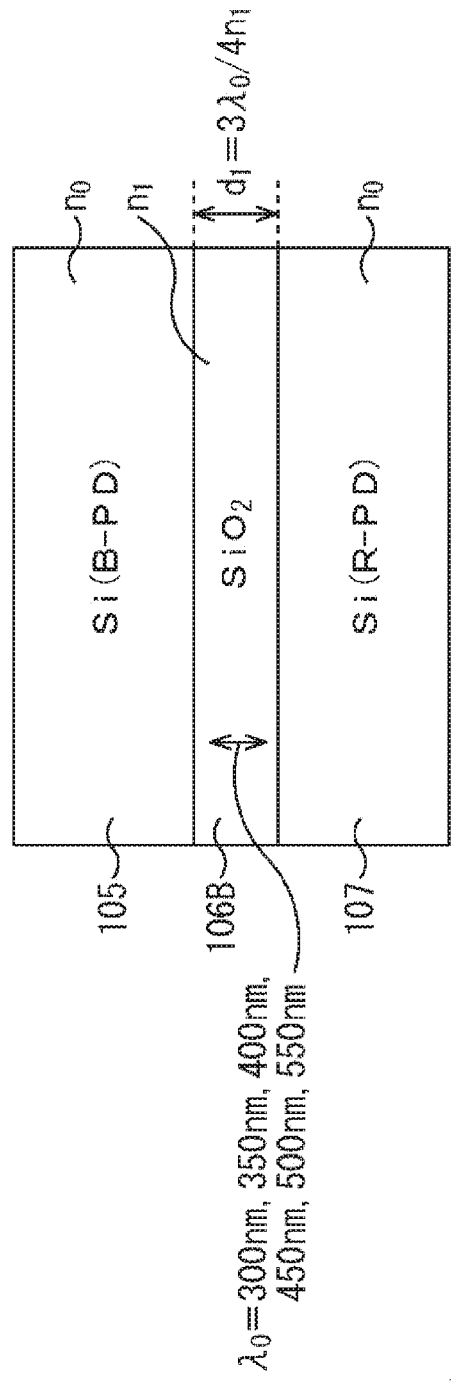
FIG. 21 is a cross-sectional view illustrating a structure corresponding to a condition of the reflection spectrum in FIG. 16.

FIG. 20 illustrates the reflection spectrum when the value of the wavelength $\lambda_0$ is changed when a relationship of $d_1=3\lambda_0/4n_1$ is satisfied as expression (1) in a case where the single-layer film 106B formed of the silicon oxide film ($SiO_2$) is formed between the B photodiode 105 and the R photodiode 107 formed of silicon (Si) as illustrated in FIG. 21. Also, it is assumed that the condition of expression (2), that is, the relationship of $n_0>n_1$ of the refractive index of each layer is satisfied.

In FIG. 20, a reflection spectrum R71 is the reflection spectrum in a case where the single-layer film 106B is formed when $\lambda_0=300$ nm. Also, a reflection spectrum R72 is the reflection spectrum in a case where the single-layer film 106B is formed when $\lambda_0=350$ nm. Furthermore, a reflection spectrum R73 is the reflection spectrum in a case where the single-layer film 106B is formed when $\lambda_0=400$ nm.

Also, in FIG. 20, a reflection spectrum R74 is the reflection spectrum in a case of forming the single-layer film 106B when $\lambda_0=450$ nm. Also, a reflection spectrum R75 is the reflection spectrum in a case of forming the single-layer film 106B when $\lambda_0=500$ nm. Furthermore, a reflection spectrum R76 is the reflection spectrum in a case of forming the single-layer film 106B when $\lambda_0=550$ nm.

In FIG. 20, in the reflection spectrum R71 with $\lambda_0=300$ nm and the reflection spectrum R76 with $\lambda_0=550$ nm, the reflection ratio of the blue light (B) on the short wavelength (400 to 500 nm) side is small and the reflection ratio of the red light (R) on the long wavelength (550 to 650 nm) side is large, so that an effect by the insertion of the single-layer film 106B is hardly obtained.

On the other hand, in FIG. 20, with the reflection spectra R72 to R75 within the range of $\lambda_0=350$ to 500 nm, the effect by the insertion of the single-layer film 106B may be obtained because the reflection ratio of the blue light (B) on the short wavelength (400 to 500 nm) side is large and the reflection ratio of the red light (R) on the long wavelength (550 to 650 nm) side is small.

As described above, within the range of $\lambda_0=350$ to 500 nm, the effect of improvement in the spectral sensitivity characteristic may be obtained by the insertion of the single-layer film 106B.

(First Manufacturing Process)

Figure 22:
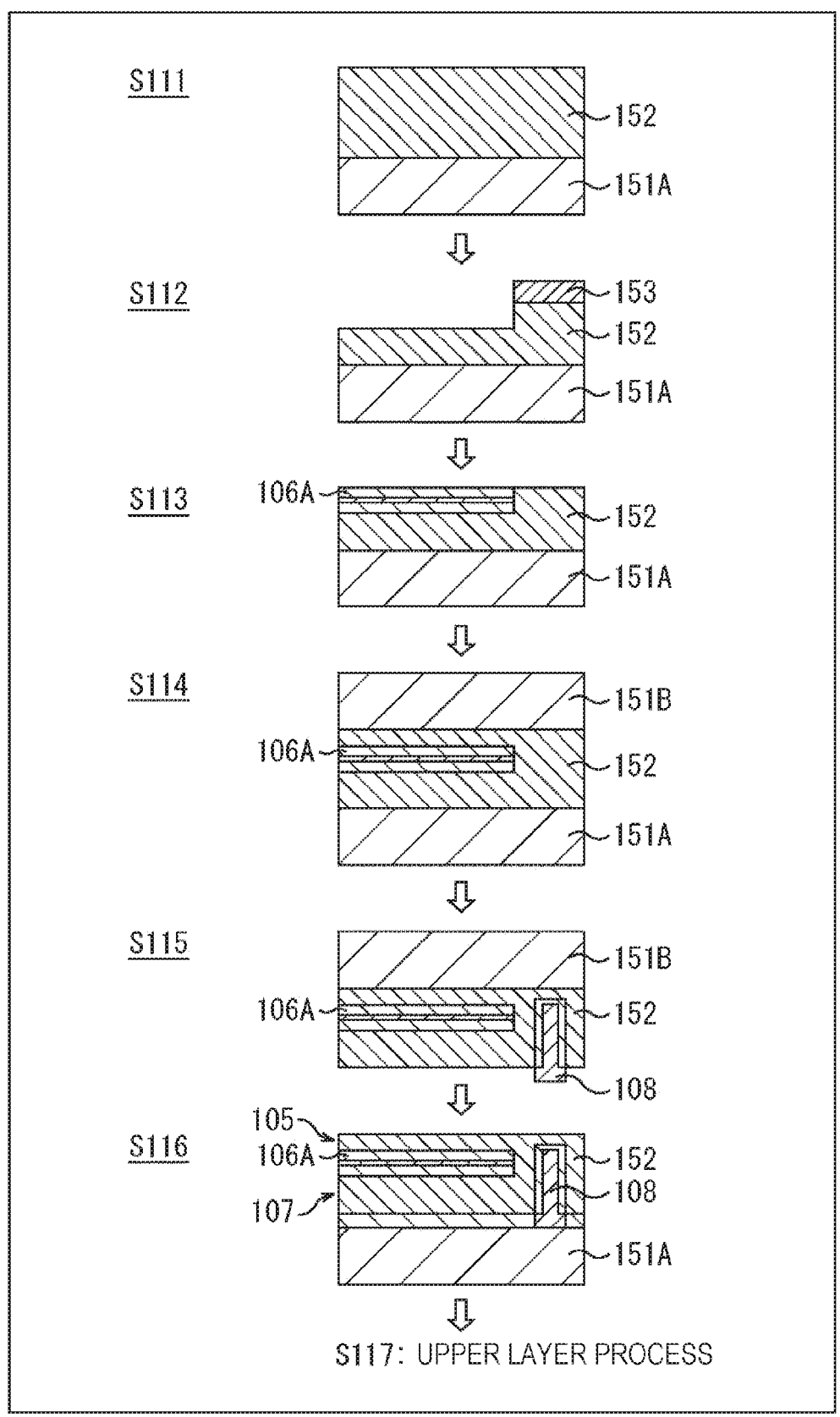
FIG. 22 is a flowchart illustrating a flow of a first manufacturing process.

A flow of a manufacturing process of the solid-state imaging device 10 is next described. FIG. 22 is a flowchart illustrating the flow of a first manufacturing process of the solid-state imaging device 10. In the first manufacturing process, case where the multi-layer film 106A is formed as the optical interference film 106 in each of the pixels 31 arranged in a two-dimensional manner in the pixel array unit 21 is described.

At step S111, a substrate receiving process is performed. In this substrate receiving process, a silicon on insulator (SOI) substrate formed of a supporting substrate 151A and a silicon substrate 152 is received. Meanwhile, for convenience of description, the supporting substrate 151 attached on a lower side in the drawing to the silicon substrate 152 is referred to as the supporting substrate 151A, and the supporting substrate 151 attached on an upper side in the drawing is referred to as a supporting substrate 151B. The description of the supporting substrate 151 is similar in other manufacturing processes.

At step S112, a lithography process and an etching process are performed. In the lithography process, a resist protection film 153 is applied to the SOI substrate. Also, in the etching process, the silicon substrate 152 with the resist protection film 153 attached thereto is etched, for example, by reactive ion etching (RIE) processing to remove a part of the silicon substrate 152.

At step S113, an optical interference film forming process is performed. In this optical interference film forming process, the multi-layer film 106A is deposited on a portion from which a part of the silicon substrate 152 is removed as the optical interference film 106 by a sputtering device and the like. Also, after the optical interference film 106 is deposited, the resist protection film 153 is removed.

Herein, as a design condition of the multi-layer film 106A, it is necessary to satisfy the relationships of expressions (1) and (2) described above, for example; and this is as follows. That is, it is derived from the result of the above-described optical simulation that the optimum optical characteristic may be obtained in the multi-layer film 106A obtained by stacking the three layers of the silicon oxide film ($SiO_2$), the silicon film (Si), and the silicon oxide film ($SiO_2$) when the silicon oxide film ($SiO_2$) satisfies the relationship of $d_x=3\lambda_0/4n_x$ and the silicon film (Si) satisfies the relationship of $d_x=\lambda_0/4n_x$ when $\lambda_0=450$ nm (420 to 480 nm). That is, the multi-layer film 106A corresponds to the optimum multi-layer film 106A described above.

At step S114, a surface treatment process, a substrate attaching process, and a heat treatment process are performed. First, in the surface treatment process, contaminants, oxides and the like on a silicon (Si) surface of the silicon substrate 152 are removed. Next, in the substrate attaching process, the SOI substrate formed of the supporting substrate 151B and the silicon substrate 152 is attached to the silicon (Si) surface from which the contaminants and the like are removed by the surface treatment process. Then, in the heat treatment process, bonding hands of silicon (Si) crystals to be attached are joined by annealing.

Figure 23:
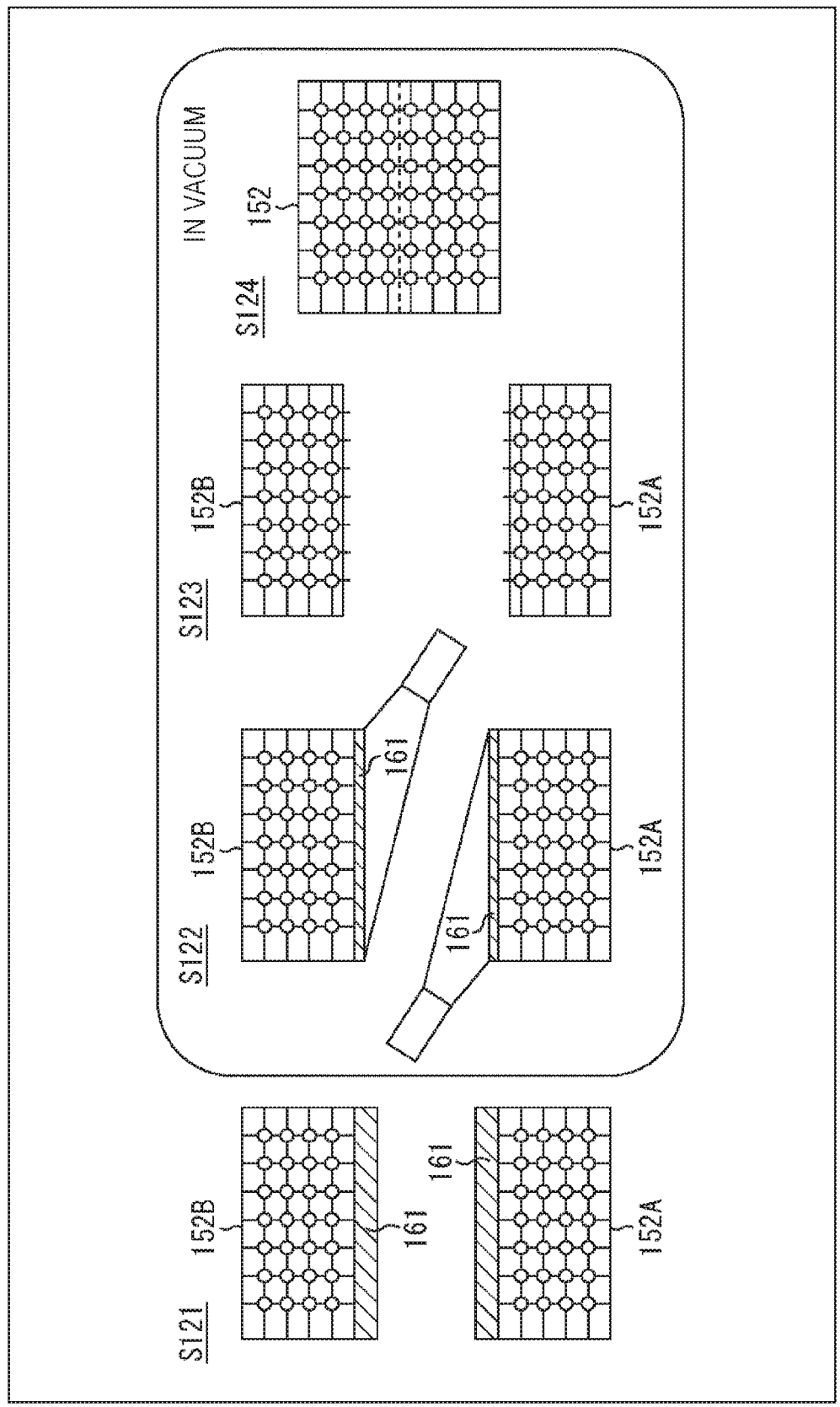
FIG. 23 is a view illustrating an example of a joining method.

Herein, in the surface treatment process, a fast atom beam (FAB) method illustrated in FIG. 23 may be used. Meanwhile, in FIG. 23, out of the silicon substrates 152 to be attached, a lower silicon substrate 152 in the drawing is referred to as a silicon substrate 152A, and an upper silicon substrate 152 in the drawing is referred to as a silicon substrate 152B.

The surfaces of the silicon substrates 152A and 152B are covered with contaminants 161 (S121). At steps S122 and S123, an etching process is performed. In this etching process, the surfaces of the silicon substrates 152A and 152B covered with the contaminants 161 are etched with Ar ion (S122). By performing such etching, the contaminants 161 are removed, and the bonding hands may be generated on the surfaces of the silicon substrates 152A and 152B (S123).

Then, by bringing such surfaces into contact with each other, the silicon substrate 152A and the silicon substrate 152B may be strongly joined together (S124). Generation of dark current may be inhibited by performing such crystallographically defect-free joining. Meanwhile, steps S122 to S124 are processes performed in a vacuum.

Returning to the illustration in FIG. 22, at step S115, a substrate removing process and a circuit forming process are performed. In the substrate removing process, the supporting substrate 151A is removed. Also, in the circuit forming process, circuits such as the vertical transistor 108 and the signal processing circuit are formed in silicon (Si) of the silicon substrate 152.

At step S116, a substrate attaching/removing process is performed. In this substrate attaching/removing process, the supporting substrate 151A is attached to the silicon substrate 152 and the supporting substrate 151B is removed therefrom, so that the supporting substrate is replaced.

Meanwhile, the B photodiode 105 is formed of silicon (Si) on an upper side of the multi-layer film 106A out of silicon (Si) of the silicon substrate 152, and the R photodiode 107 is formed of silicon (Si) on a lower side of the multi-layer film 106A. Herein, it is obtained from the result of the above-described optical simulation that a more ideal spectral sensitivity characteristic may be obtained by setting the thickness of the B photodiode 105 to 0.3 µm.

When the processes at steps S111 to S116 are finished, the procedure shifts to a process at step S117. At step S117, the transparent electrode 103, the G organic photoelectric conversion film 102, the on-chip lens 101 and the like are formed by performing a process step of an upper layer. As a result, the structure of the pixel 31 in FIG. 4 is formed. Then, the solid-state imaging device 10 is manufactured by performing the process of forming other circuits and wiring forming the solid-state imaging device 10 and the like.

Meanwhile, as in the structure of the pixel 31 in FIG. 4, it is possible to reduce the dark current caused by a surface level or an interface level by making the silicon (Si) side in the vicinity of the boundary with the multi-layer film 106A (optical interference film 106) p-type conductive to provide the potential barrier and making the B photodiode 105 and the R photodiode 107 embedded photodiodes. Also, a p-type silicon (Si) layer is formed between the multi-layer film 106A and the B photodiode 105 or the R photodiode 107.

For example, in a case of using the attaching method in the first manufacturing process, before the multi-layer film 106A is deposited in the process at step S113, the SOI substrate is p-type dopant-dosed in advance by ion implantation and the dopant is activated by annealing, thereafter the multi-layer film 106A is deposited. Next, in the process at step S114, the other SOI substrate to be attached is also p-type dopant-dosed by ion implantation and the dopant is activated by annealing, thereafter the SOI substrate may be attached to form the structure of the pixel 31 in FIG. 4. Meanwhile, as the p-type dopant, boron (B), indium (In) and the like may be used.

The flow of the first manufacturing process of the solid-state imaging device 10 is described above.

(Second Manufacturing Process)

Figure 24:
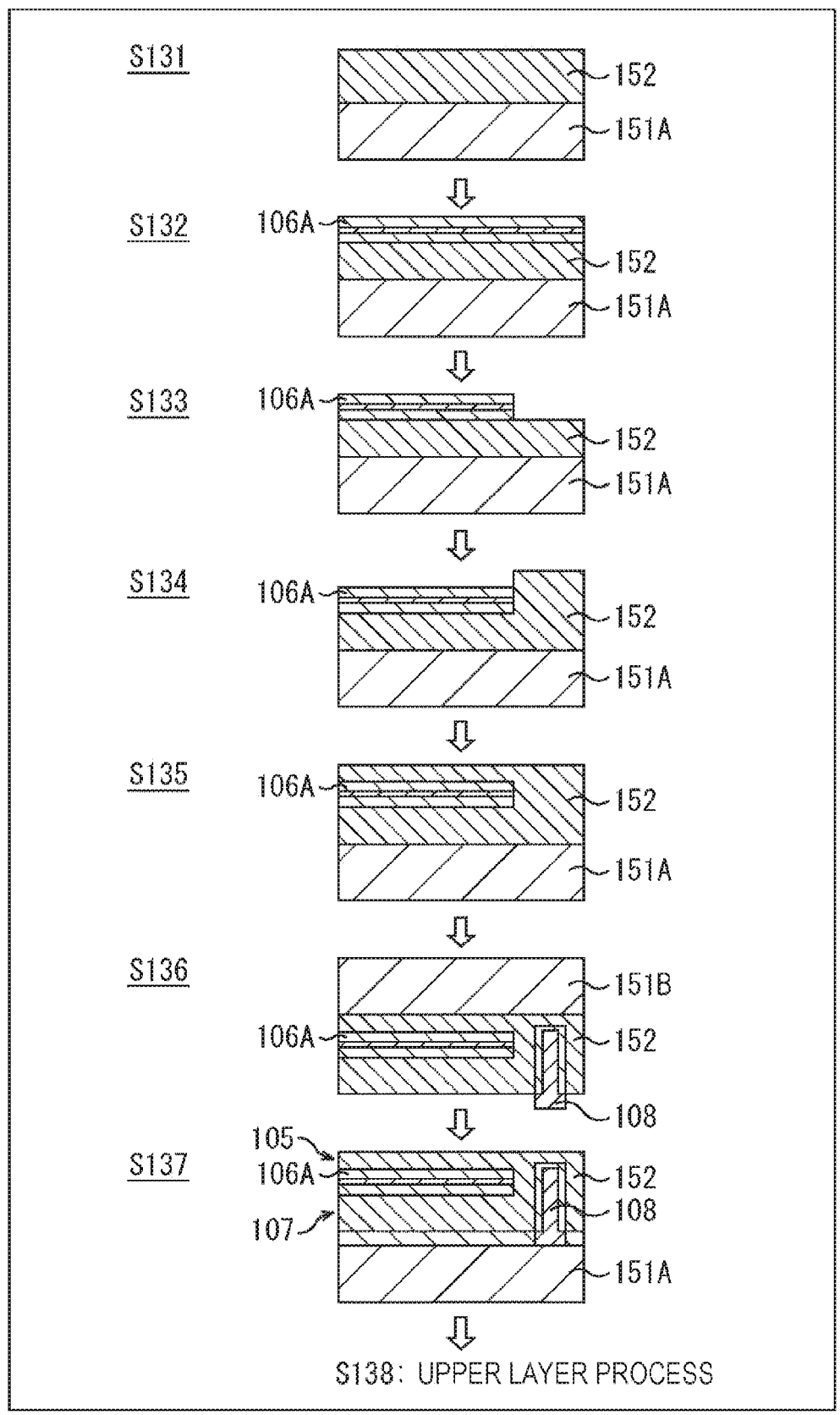
FIG. 24 is a flowchart illustrating a flow of a second manufacturing process.

A flow of a second manufacturing process of the solid-state imaging device 10 is next described with reference to a flowchart in FIG. 24. In the second manufacturing process, a case where the multi-layer film 106A is formed as the optical interference film 106 in each of the pixels 31 arranged in a two-dimensional manner in the pixel array unit 21 is described.

At step S131, a substrate receiving process is performed. In this substrate receiving process, the SOI substrate formed of the supporting substrate 151A and the silicon substrate 152 is received.

At step S132, an optical interference film forming process is performed. In this optical interference film forming process, the multi-layer film 106A is deposited as the optical interference film 106 on the silicon substrate 152 (SOI substrate) by a sputtering device and the like.

Herein, as a design condition of the multi-layer film 106A, it is necessary to satisfy the relationships of expressions (1) and (2) described above, for example; and this is as follows. That is, it is derived from the result of the above-described optical simulation that the optimum optical characteristic may be obtained in the multi-layer film 106A obtained by stacking the three layers of the silicon oxide film ($SiO_2$), the silicon film (Si), and the silicon oxide film ($SiO_2$) when the silicon oxide film ($SiO_2$) satisfies the relationship of $d_x = 3\lambda_0/4n_x$ and the silicon film (Si) satisfies the relationship of $d_x = \lambda_0/4n_x$ when $\lambda_0 = 450$ nm (420 to 480 nm). That is, the multi-layer film 106A corresponds to the optimum multi-layer film 106A described above.

At step S133, a lithography process and an etching process are performed. In the lithography process, a resist protection film is applied to the multi-layer film 106A. Also, in the etching process, the multi-layer film 106A to which the resist protection film is attached is etched, for example, by RIE processing, to remove a part of the multi-layer film 106A.

At steps S134 and S135, a surface treatment process and a silicon growth process are performed. In the surface treatment process, contaminants, oxides and the like on the silicon (Si) surface of the silicon substrate 152 are removed. Also, in the silicon growth process, silicon (Si) of the silicon substrate 152 is selectively grown (S134) by a method such as a chemical vapor deposition (CVD) method, for example. Then, silicon (Si) is laterally grown on the silicon substrate 152 to form silicon (Si) on an upper side of the multi-layer film 106A (S135).

Meanwhile, in the surface treatment process here, as in the FAB method (FIG. 23) described above, the surface may be etched with Ar ion. Also, since a silicon bulk structure is herein formed by crystal growth, crystal defects are small and the generation of the dark current is inhibited.

At step S136, a substrate removing/attaching process and a circuit forming process are performed. In the substrate removing/attaching process, the supporting substrate 151A is removed from the silicon substrate 152 and the supporting substrate 151B is attached thereto. Also, in the circuit forming process, circuits such as the vertical transistor 108 and the signal processing circuit are formed in silicon (Si) of the silicon substrate 152.

At step S137, the substrate attaching/removing process is performed. In this substrate attaching/removing process, the supporting substrate 151A is attached to the silicon substrate 152 and the supporting substrate 151B is removed therefrom, so that the supporting substrate 151 is replaced.

Meanwhile, the B photodiode 105 is formed of silicon (Si) on an upper side of the multi-layer film 106A out of silicon (Si) of the silicon substrate 152, and the R photodiode 107 is formed of silicon (Si) on a lower side of the multi-layer film 106A. Herein, it is obtained from the result of the above-described optical simulation that a more ideal spectral sensitivity characteristic may be obtained by setting the thickness of the B photodiode 105 to 0.3 μm.

When the processes at steps S131 to S137 are finished, the procedure shifts to a process at step S138. At step S138, the transparent electrode 103, the G organic photoelectric conversion film 102, the on-chip lens 101 and the like are formed by performing a process step of an upper layer. As a result, the structure of the pixel 31 in FIG. 4 is formed. Then, the solid-state imaging device 10 is manufactured by performing the process of forming other circuits and wiring forming the solid-state imaging device 10 and the like.

Meanwhile, as in the structure of the pixel 31 in FIG. 4, it is possible to reduce the dark current caused by a surface level or an interface level by making the silicon (Si) side in the vicinity of the boundary with the multi-layer film 106A (optical interference film 106) p-type conductive to provide the potential barrier and making the B photodiode 105 and the R photodiode 107 embedded photodiodes. Also, a p-type silicon (Si) layer is formed between the multi-layer film 106A and the B photodiode 105 or the R photodiode 107.

For example, in the case of the second manufacturing process, before the multi-layer film 106A is deposited in the process at step S132, the SOI substrate is p-type dopant-dosed in advance by ion implantation, and thereafter the dopant is activated by annealing. Then, after the multi-layer film 106A is deposited, crystals are grown while controlling the p-type and n-type by the doping during the growth in the processes at steps S134 and S135, thereby forming the structure of the pixel 31 in FIG. 4. Meanwhile, as the p-type dopant, boron (B), indium (In) and the like may be used. Also, as the n-type dopant, phosphorus (P), arsenic (As), antimony (Sb), bismuth (Bi) and the like may be used.

The flow of the second manufacturing process of the solid-state imaging device 10 is described above.

(Third Manufacturing Process)

Figure 25:
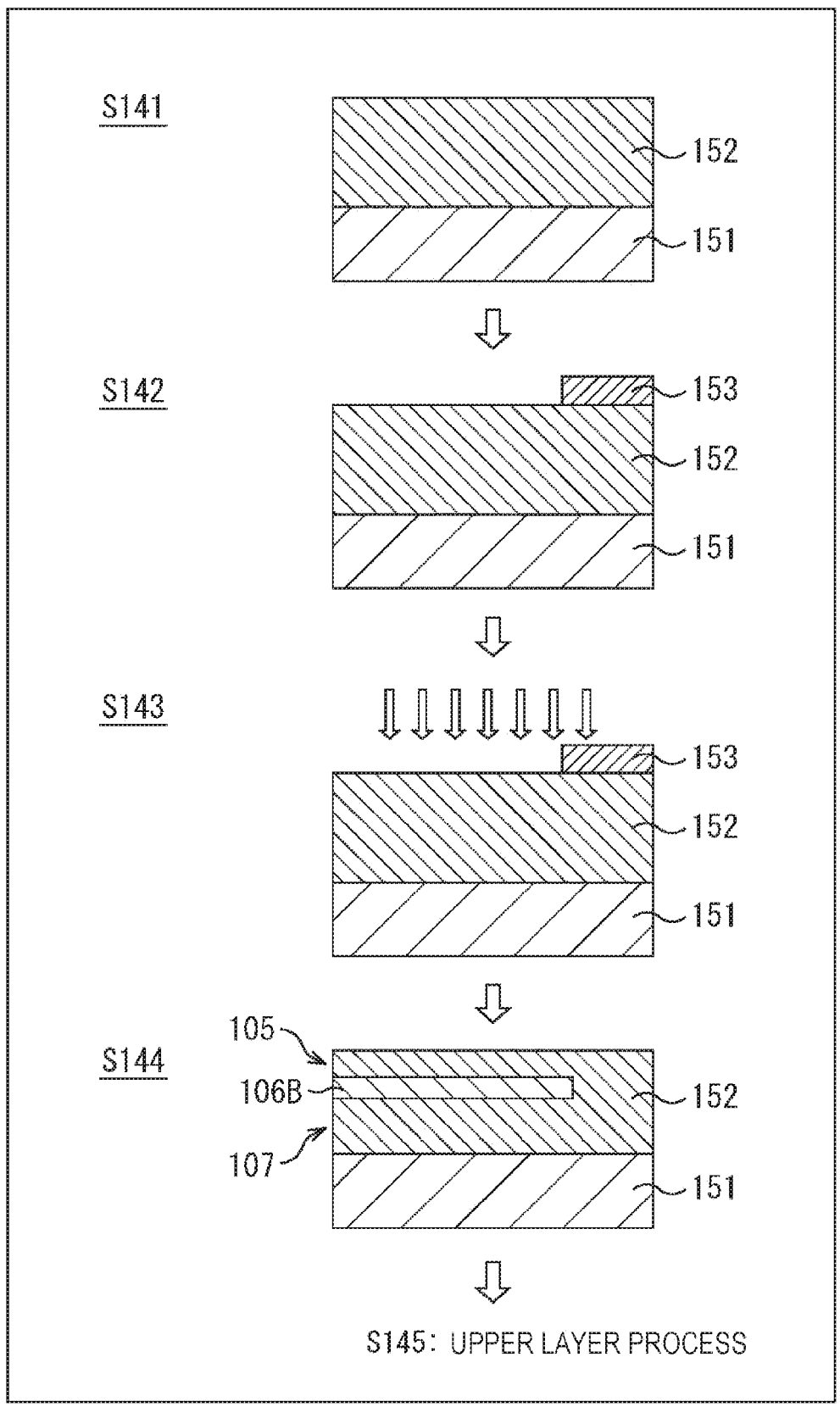
FIG. 25 is a flowchart illustrating a flow of a third manufacturing process.

A flow of a third manufacturing process of the solid-state imaging device 10 is next described with reference to a flowchart in FIG. 25. In the third manufacturing process, a case where the single-layer film 106B is formed as the optical interference film 106 in each of the pixels 31 arranged in a two-dimensional manner in the pixel array unit 21 is described.

At step S141, a substrate receiving process is performed. In this substrate receiving process, the SOI substrate formed of the supporting substrate 151 and the silicon substrate 152 is received.

At step S142, a lithography process is performed. In this lithography process, the resist protection film 153 is applied to the SOI substrate.

At step S143, an ion implantation process is performed. In this ion implantation process, oxygen is ion-implanted (arrow in the drawing) on the silicon substrate 152 side of the SOI substrate so that an oxygen rich layer is formed.

At step S144, an optical interference film forming process is performed. In this optical interference film forming process, annealing is performed so that the single-layer film 106B is formed in silicon (Si) of the silicon substrate 152. That is, the single-layer film 106B is formed by SIMOX technology by oxygen ion implantation.

Herein, as a design condition of the single-layer film 106B, it is required to satisfy the relationships of expressions (1) and (2) described above; for example, this is as follows. That is, it is derived from the result of the above-described optical simulation that the optimum optical characteristic may be obtained in the single-layer film 106B formed of a single layer of the silicon oxide film ($SiO_2$) when the silicon oxide film ($SiO_2$) satisfies the relationship of $d_x = 3\lambda_0/4n_x$ when $\lambda_0 = 400$ nm (370 to 430 nm). That is, this single-layer film 106B corresponds to the optimum single-layer film 106B described above.

Meanwhile, out of silicon (Si) of the silicon substrate 152, the B photodiode 105 is formed of silicon (Si) on the upper side of the single-layer film 106B, and the R photodiode 107 is formed of the silicon (Si) on the lower side of the single-layer film 106B. Herein, it is obtained from the result of the above-described optical simulation that a more ideal spectral sensitivity characteristic may be obtained by setting the thickness of the B photodiode 105 to 0.5 μm.

When the processes at steps S141 to S144 are finished, the procedure shifts to a process at step S145. At step S145, the transparent electrode 103, the G organic photoelectric conversion film 102, the on-chip lens 101 and the like are formed by performing a process step of an upper layer. As a result, the structure of the pixel 31 in FIG. 6 is formed. Then, the solid-state imaging device 10 is manufactured by performing the process of forming other circuits and wiring forming the solid-state imaging device 10 and the like.

The flow of the third manufacturing process of the solid-state imaging device 10 is described above.

4. Second Embodiment (Structure of Pixel: Two-Sided Signal Readout Structure)

Figure 26:
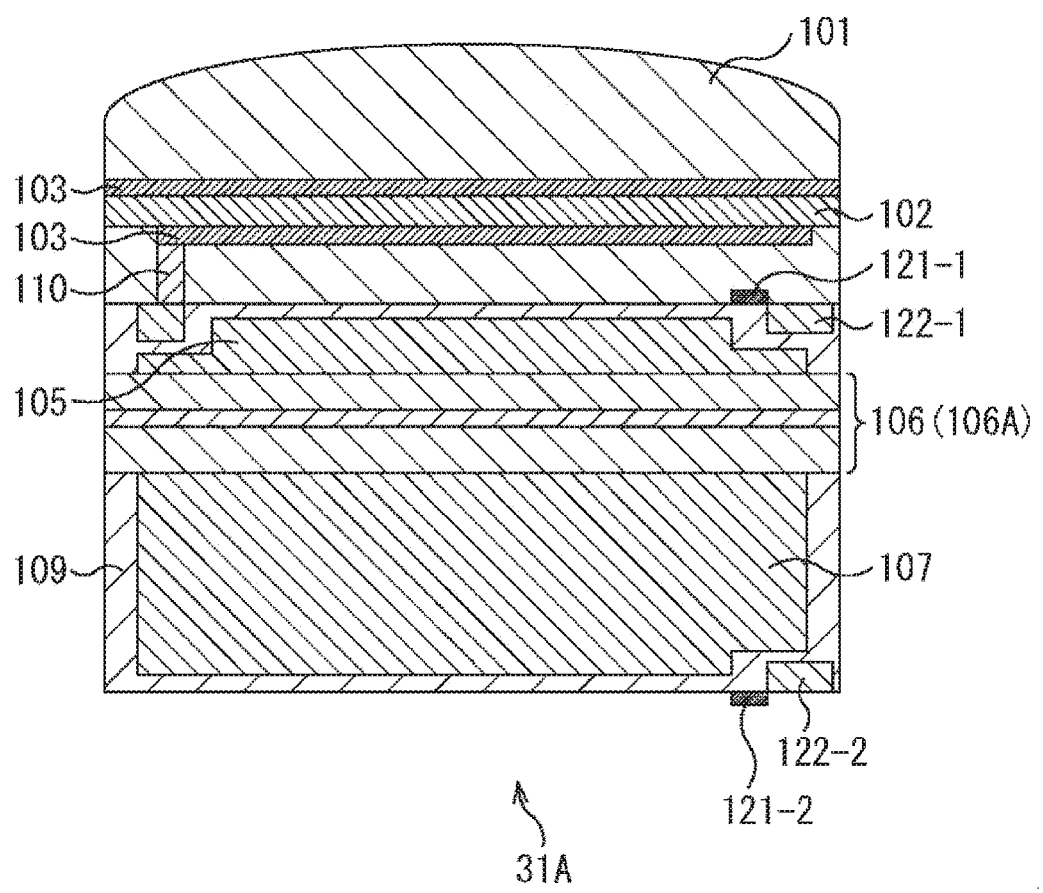
FIG. 26 is a cross-sectional view illustrating a structure of a pixel in a second embodiment.

FIG. 26 is a cross-sectional view illustrating a structure of a pixel 31 (FIG. 3) in a second embodiment. A pixel 31A in FIG. 26 is different from a basic structure in FIG. 4 in that this has a two-sided signal readout structure for reading signals from both an upper side of a B photodiode 105 and a lower side of a R photodiode 107.

In the pixel 31A, light condensed by an on-chip lens 101 is incident on a G organic photoelectric conversion film 102. The G organic photoelectric conversion film 102 absorbs light of a green (G) component (green light) out of the incident light from the on-chip lens 101 and generates a signal charge corresponding to a light amount of the green light (G). The signal charge generated by the G organic photoelectric conversion film 102 is taken out by a transparent electrode 103 to be supplied to a signal processing circuit on a subsequent stage.

Also, out of the incident light from the on-chip lens 101, the light transmitted through the G organic photoelectric conversion film 102 is incident on a B photodiode (B-PD) 105. Herein, since the light transmitted through the G organic photoelectric conversion film 102 is light (transmitted light) including red light (R) and blue light (B), the B photodiode 105 absorbs the blue light (B) from the transmitted light and generates a signal charge corresponding to a light amount of the blue light (B).

Herein, a gate 121-1 and a floating diffusion (FD) region 122-1 are formed above the B photodiode 105. The signal charge generated by the B photodiode 105 is transferred to the floating diffusion region 122-1 by the gate 121-1. In the floating diffusion region 122-1, the signal charge is converted to voltage to be supplied to the signal processing circuit on the subsequent stage.

An optical interference film 106 is formed (inserted) between the B photodiode 105 and a R photodiode 107 formed of n-type silicon (Si). In the structure of the pixel 31A in FIG. 26, a multi-layer film 106A is formed as the optical interference film 106. The multi-layer film 106A reflects the blue light (B) on a short wavelength side and transmits the red light (R) on a long wavelength side out of the light transmitted through the B photodiode 105 (transmitted light).

The light transmitted through the multi-layer film 106A is incident on the R photodiode (R-PD) 107. Herein, since the light transmitted through the multi-layer film 106A becomes the light (transmitted light) including the red light (R), the R photodiode 107 absorbs the red light (R) from the transmitted light and generates a signal charge corresponding to a light amount of the red light (R).

Herein, a gate 121-2 and a floating diffusion region 122-2 are formed below the R photodiode 107. The signal charge generated by the R photodiode 107 is transferred to the floating diffusion region 122-2 by the gate 121-2. In the floating diffusion region 122-2, the signal charge is converted to voltage to be supplied to the signal processing circuit on the subsequent stage.

In this manner, in the pixel 31A, the signal charges corresponding to the light amounts of the green light (G), the blue light (B), and the red light (R) are generated to be read out, and RGB signals corresponding to the signal charges are processed by the signal processing circuit on the subsequent stage to be output as image data.

(Fourth Manufacturing Process)

Figure 27:
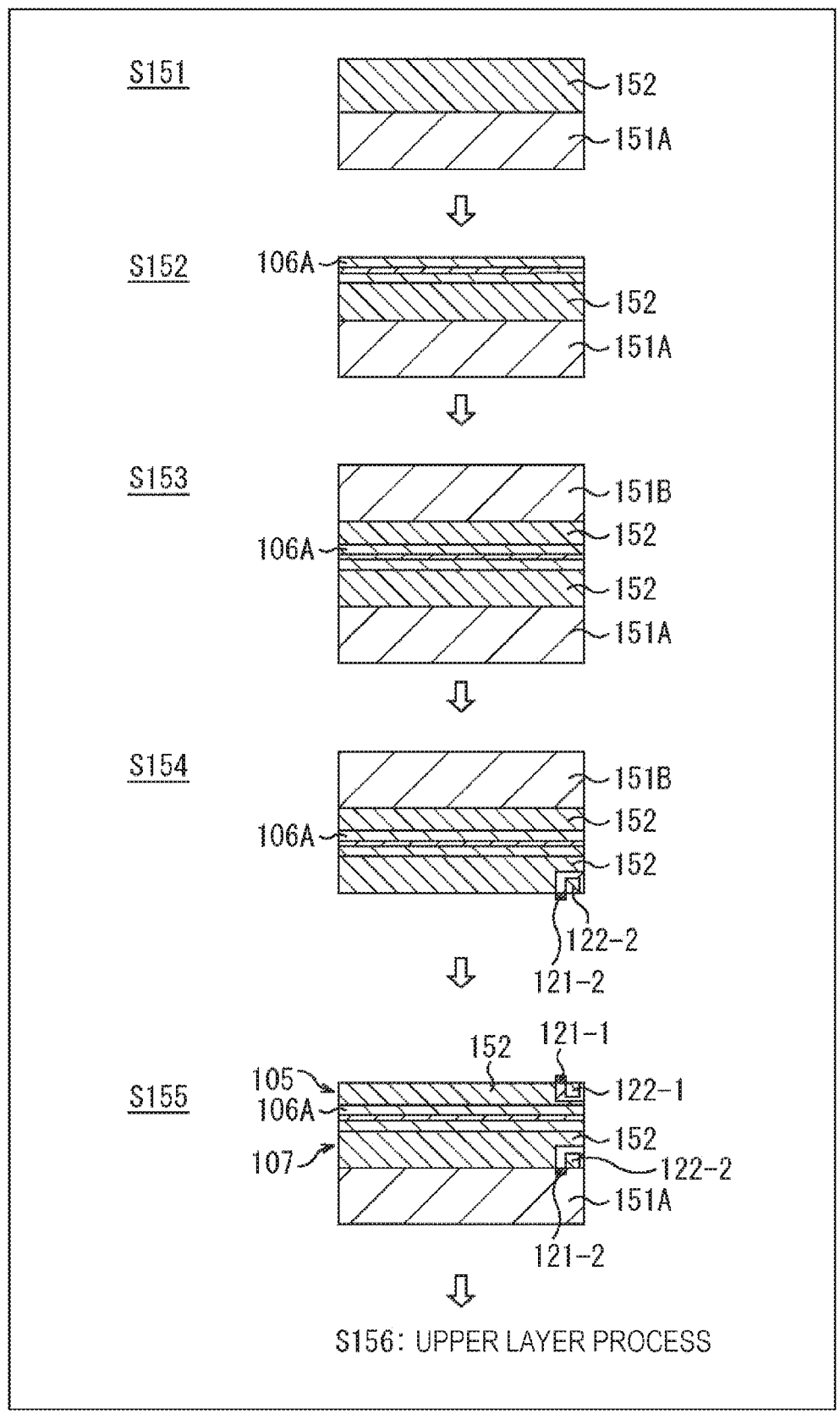
FIG. 27 is a flowchart illustrating a flow of a fourth manufacturing process.

A flow of a manufacturing process of the solid-state imaging device 10 is next described. FIG. 27 is a flowchart illustrating the flow of a fourth manufacturing process of the solid-state imaging device 10 according to the second embodiment.

At step S151, a substrate receiving process is performed. In this substrate receiving process, the SOI substrate formed of the supporting substrate 151A and the silicon substrate 152 is received.

At step S152, an optical interference film forming process is performed. In this optical interference film forming process, the multi-layer film 106A is deposited as the optical interference film 106 on the silicon substrate 152 (SOI substrate) by a sputtering device and the like.

Herein, as a design condition of the multi-layer film 106A, it is necessary to satisfy the relationships of expressions (1) and (2) described above, for example; and this is as follows. That is, it is derived from the result of the above-described optical simulation that the optimum optical characteristic may be obtained in the multi-layer film 106A obtained by stacking the three layers of the silicon oxide film ($SiO_2$), the silicon film (Si), and the silicon oxide film ($SiO_2$) when the silicon oxide film ($SiO_2$) satisfies the relationship of $d_x=3\lambda_0/4n_x$ and the silicon film (Si) satisfies the relationship of $d_x=\lambda_0/4n_x$ when $\lambda_0=450$ nm (420 to 480 nm). That is, the multi-layer film 106A corresponds to the optimum multi-layer film 106A described above.

At step S153, an attaching process is performed. At this attaching process, silicon (Si) is formed on an upper side of the multi-layer film 106A by attaching the SOI substrate in which the supporting substrate 151 and the silicon substrate 152 are upside down to the SOI substrate on which the multi-layer film 106A is formed at the process at step S152.

As a result, the B photodiode 105 is formed on the upper side of the multi-layer film 106A, and the R photodiode 107 is formed on a lower side of the B photodiode 105. Meanwhile, it is understood that a more ideal spectral sensitivity characteristic may be obtained by setting a thickness of the B photodiode 105 to, for example, 0.3 µm from the result of the optical simulation described above. Also herein, since the SOI substrates are attached to each other, crystal defects are small and generation of dark current may be inhibited.

At step S154, a substrate removing process and a circuit forming process are performed. In the substrate removing process, the supporting substrate 151A on the lower side of the silicon substrate 152 is removed. Also, in the circuit forming process, the gate 121-2, the floating diffusion region 122-2 and the like are formed as a signal readout circuit below the R photodiode 107.

At step S155, a substrate attaching/removing process and a circuit forming process are performed. In the substrate attaching/removing process, the supporting substrate 151B on the upper side of the silicon substrate 152 is removed. Also, in the circuit forming process, the gate 121-1, the floating diffusion region 122-1 and the like are formed as the signal readout circuit above the B photodiode 105. Then, in the substrate attaching/removing process, the supporting substrate 151A is attached to the silicon substrate 152, and the supporting substrate 151 is replaced.

When the processes at steps S151 to S155 are finished, the procedure shifts to a process at step S156. At step S156, the transparent electrode 103, the G organic photoelectric conversion film 102, the on-chip lens 101 and the like are formed by performing a process step of an upper layer. As a result, the structure of the pixel 31A in FIG. 26 is formed. Then, the solid-state imaging device 10 is manufactured by performing the process of forming other circuits and wiring forming the solid-state imaging device 10 and the like.

The flow of the fourth manufacturing process of the solid-state imaging device 10 is described above.

Meanwhile, although the case of forming the multi-layer film 106A (optimum multi-layer film 106A) as the optical interference film 106 formed between the B photodiode 105 and the R photodiode 107 is described in the structure of the pixel 31A in FIG. 26, the single-layer film 106B (optimum single-layer film 106B) may also be formed in place of the multi-layer film 106A.

5. Third Embodiment (Structure of Pixel: OCCF Structure)

Figure 28:
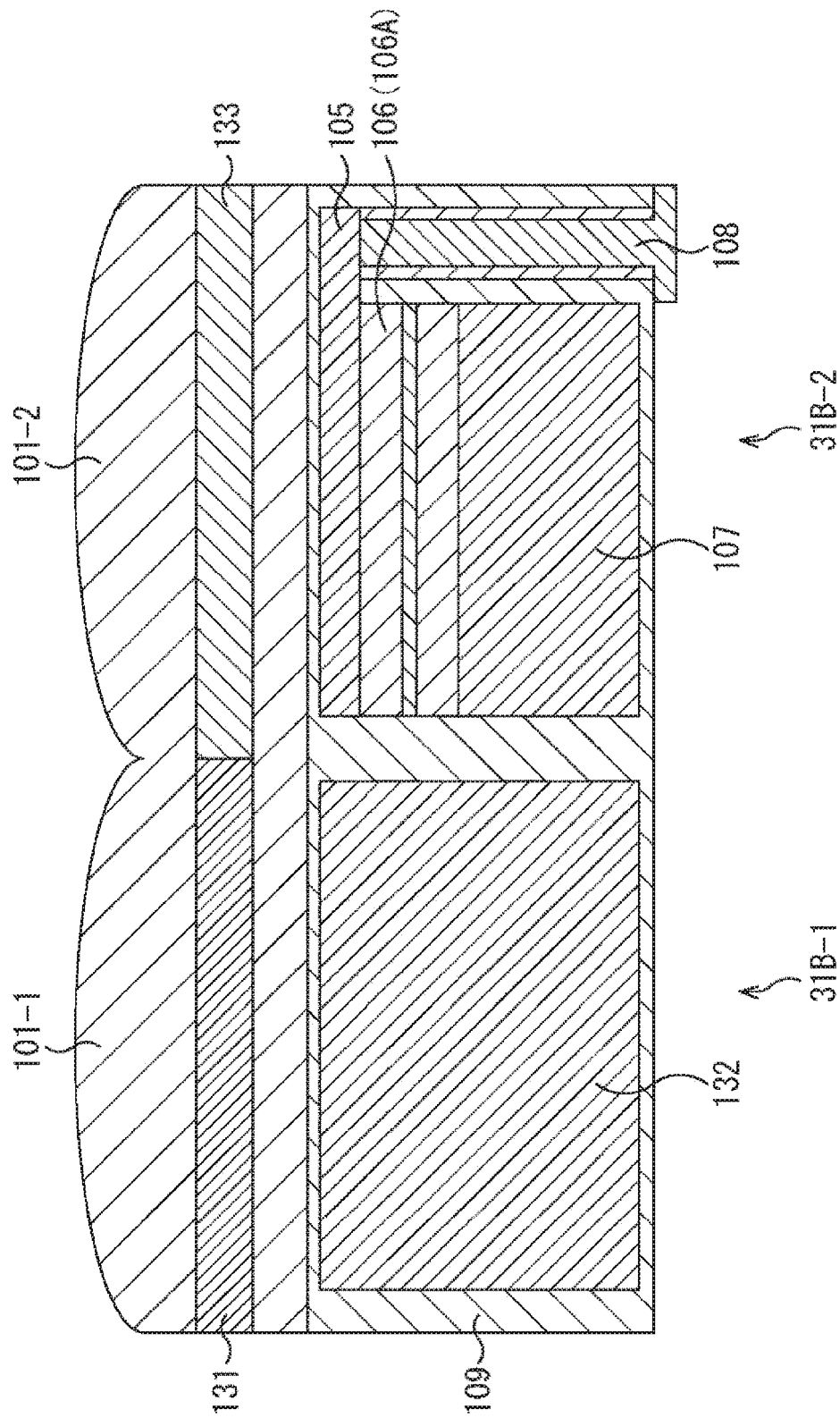
FIG. 28 is a cross-sectional view illustrating a structure of a pixel in a third embodiment.

FIG. 28 is a cross-sectional view illustrating a structure of a pixel 31 (FIG. 3) in a third embodiment. Pixels 31B-1 and 31B-2 in FIG. 28 are different from a basic structure in FIG. 4 in that they are formed of an OCCF structure in which an on-chip color filter (OCCF) is formed. Meanwhile, in FIG. 28, the two pixels 31B-1 and 31B-2 arranged in an arbitrary row direction out of a plurality of pixels 31 arranged in a two-dimensional manner in a pixel array unit 21 are illustrated.

In the pixel 31B-1, light condensed by an on-chip lens 101-1 is incident on a G color filter (G-OCCF) 131. Green light (G) out of the incident light from the on-chip lens 101-1 is transmitted (red light (R) and blue light (B) are cut) by the G color filter 131) to be incident on a G photodiode (G-PD) 132 formed of n=–type silicon (Si). The G photodiode 132 generates a signal charge corresponding to a light amount of the green light (G). The signal charge generated by the G photodiode 132 is read out by a signal readout circuit to be supplied to a signal processing circuit on a subsequent stage.

In the pixel 31B-2, the light condensed by an on-chip lens 101-2 is incident on a Mg color filter (Mg-OCCF) 133. Light of a component of magenta (Mg) obtained by mixing red (R) and blue (B) (magenta light) out of the incident light from the on-chip lens 101-2 is transmitted by the Mg color filter 133 to be incident on a B photodiode (B-PD) 105. Since the red light (R) and the blue light (B) are mixed in the magenta light (Mg), the B photodiode (B-PD) 105 absorbs the blue light (B) from the transmitted light and generates a signal charge corresponding to a light amount of the light (B). The signal charge generated by the B photodiode 105 is readout by a vertical transistor 108 to be supplied to the signal processing circuit on the subsequent stage.

In the pixel 31B-2, a multi-layer film 106A is formed (inserted) as an optical interference film 106 between the B photodiode (B-PD) 105 and a R photodiode (R-PD) 107 formed of n-type silicon (Si). The multi-layer film 106A reflects the blue light (B) on a short wavelength side and transmits the red light (R) on a long wavelength side out of the light transmitted through the B photodiode 105 (transmitted light).

The light transmitted through the multi-layer film 106A is incident on the R photodiode 107. Herein, since the light transmitted through the multi-layer film 106A becomes the light (transmitted light) including the red light (R), the R photodiode 107 absorbs the red light (R) from the transmitted light and generates a signal charge corresponding to a light amount of the red light (R). The signal charge generated by the R photodiode 107 is read out by the signal readout circuit to be supplied to the signal processing circuit on the subsequent stage.

In this manner, in the pixel 31B-1, the signal charge corresponding to the light amount of the green light (G) is generated to be read out, and in the pixel 31B-2, the signal charges corresponding to the light amounts of the blue light (B) and the red light (R) are generated to be read out, and RGB signals corresponding to the signal charges are processed by the signal processing circuit on the subsequent stage to be output as image data.

Meanwhile, in the pixel array unit 21, it is possible that the same number of pixels 31B-1 and 31B-2 are arranged in a two-dimensional manner by making the pixel 31B-1 and the pixel 31B-2 a group such as in a checkered pattern, for example; however, any arranging method by combination of the pixels 31B-1 and the pixels 31B-2 which are arranged in a two-dimensional manner on the pixel array unit 21 may be used; for example, more pixels 31B-1 than the pixels 31B-2 may be arranged.

(Manufacturing Process)

As a manufacturing process of a solid-state imaging device 10 in which the combinations of the pixel 31B-1 and the pixel 31B-2 are arranged in a two-dimensional manner in the pixel array unit 21, it is possible to use a first manufacturing process (FIG. 22), a second manufacturing process (FIG. 24), or a third manufacturing process (FIG. 25) described above.

For example, in a case of using the first manufacturing process, in the manufacturing process of the pixel 31B-1, the G photodiode 132 formed of silicon (Si) is formed without forming the multi-layer film 106A. Then, the G color filter 131 is arranged on a lower side of the on-chip lens 101-1 in a process step of an upper layer. Also, in the manufacturing process of the pixel 31B-2, by performing the above-described manufacturing process, a structure in which the B photodiode 105, the multi-layer film 106A (optimum multi-layer film 106 A), and the R photodiode 107 are stacked is formed. Then, the Mg color filter 133 is arranged on a lower side of the on-chip lens 101-2 in the process step of the upper layer.

Meanwhile, in the structure of the pixel 31B-2 in FIG. 28, although a case where the multi-layer film 106A (optimum multi-layer film 106 A) is formed as the optical interference film 106 formed between the B photodiode 105 and the R photodiode 107 is described, a single-layer film 106B (optimum single-layer film 106B) may also be formed in place of the multi-layer film 106A.

6. Fourth Embodiment (Structure of Pixel: PD Three-Layer Stacked Type Structure)

Figure 29:
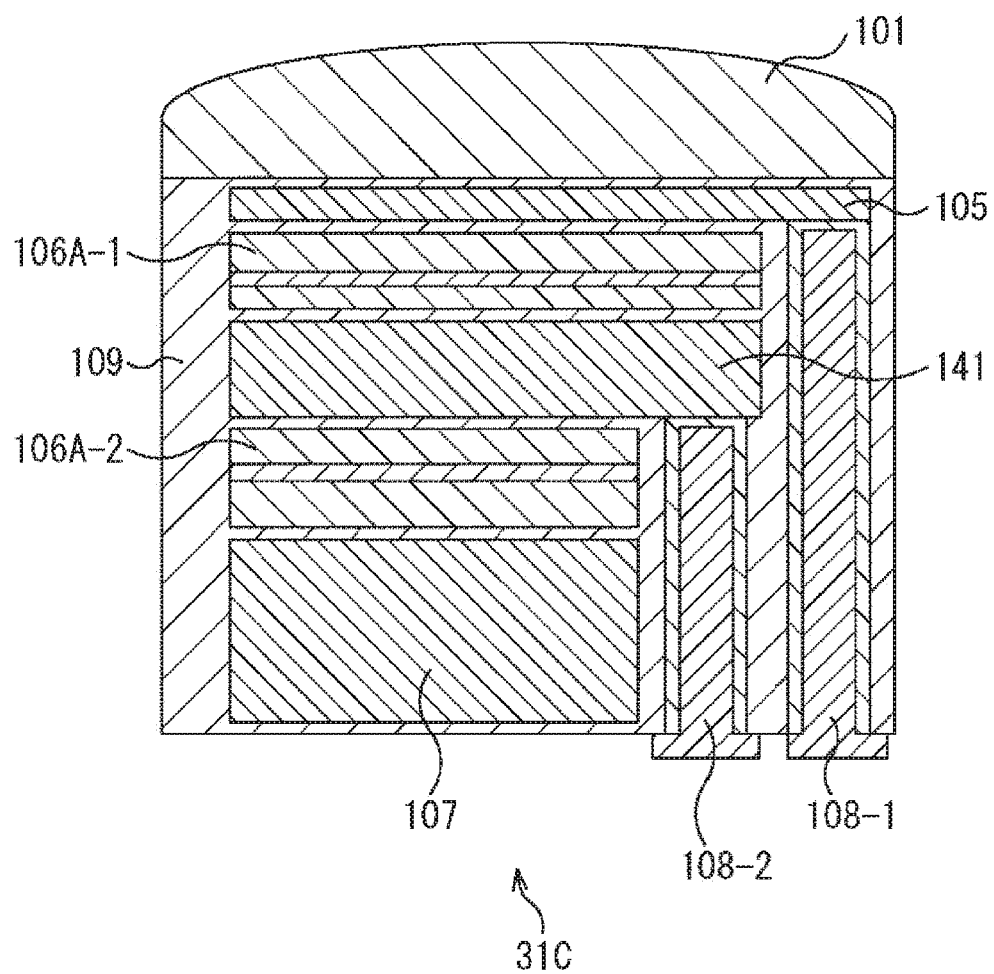
FIG. 29 is a cross-sectional view illustrating a structure of a pixel in a fourth embodiment.

FIG. 29 is a cross-sectional view illustrating a structure of a pixel 31 (FIG. 3) in a fourth embodiment. A pixel 31C in FIG. 29 is different from a basic structure in FIG. 4 in that this has a PD three-layer stacked type structure in which R, G, B photodiodes (R-PD, G-PD, and B-PD) are formed.

In the pixel 31C, light condensed by an on-chip lens 101 is incident on a B photodiode (B-PD) 105. The B photodiode 105 absorbs blue light (B) out of the incident light from the on-chip lens 101 and generates a signal charge corresponding to a light amount of the blue light (B). The signal charge generated by the B photodiode 105 is read out by a vertical transistor 108-1 to be supplied to a signal processing circuit on a subsequent stage.

In the pixel 31C, a multi-layer film 106A-1 is formed (inserted) between the B photodiode (B-PD) 105 and the G photodiode (G-PD) 141 formed of n-type silicon (Si) as an optical interference film 106. The multi-layer film 106A-1 transmits green light (G) of a medium wavelength and red light (R) of a long wavelength while reflecting blue light (B) of a short wavelength out of the light transmitted through the B photodiode 105 (transmitted light).

The light transmitted through the multi-layer film 106A-1 is incident on the G photodiode 141. Herein, since the light transmitted through the multi-layer film 106A-1 is the light (transmitted light) including the green light (G) and the red light (R), the G photodiode 141 absorbs the green light (G) from the transmitted light and generates a signal charge corresponding to a light amount of the green light (G). The signal charge generated by the G photodiode 141 is read out by a vertical transistor 108-2 to be supplied to the signal processing circuit on the subsequent stage.

Also, in the pixel 31C, a multi-layer film 106A-2 is formed (inserted) between the G photodiode (G-PD) 141 and the R photodiode (R-PD) 107 formed of n-type silicon (Si) as the optical interference film 106. The multi-layer film 106A-2 transmits the red light (R) of the long wavelength while reflecting the blue light (B) of the short wavelength and the green light (G) of the middle wavelength out of the light transmitted through the G photodiode 141 (transmitted light).

The light transmitted through the multi-layer film 106A-2 is incident on the R photodiode 107. Herein, since the light transmitted through the multi-layer film 106A-2 becomes the light (transmitted light) including the red light (R), the R photodiode 107 absorbs the red light (R) from the transmitted light and generates a signal charge corresponding to a light amount of the red light (R). The signal charge generated by the R photodiode 107 is read out by the signal readout circuit to be supplied to the signal processing circuit on the subsequent stage.

In this manner, in the pixel 31C, the signal charges corresponding to the light amounts of the green light (G), the blue light (B), and the red light (R) are generated to be read out, and RGB signals corresponding to the signal charges are processed by the signal processing circuit on the subsequent stage to be output as image data.

(Reflection Spectrum of PD Three-Layer Stacked Type)

Figure 30:
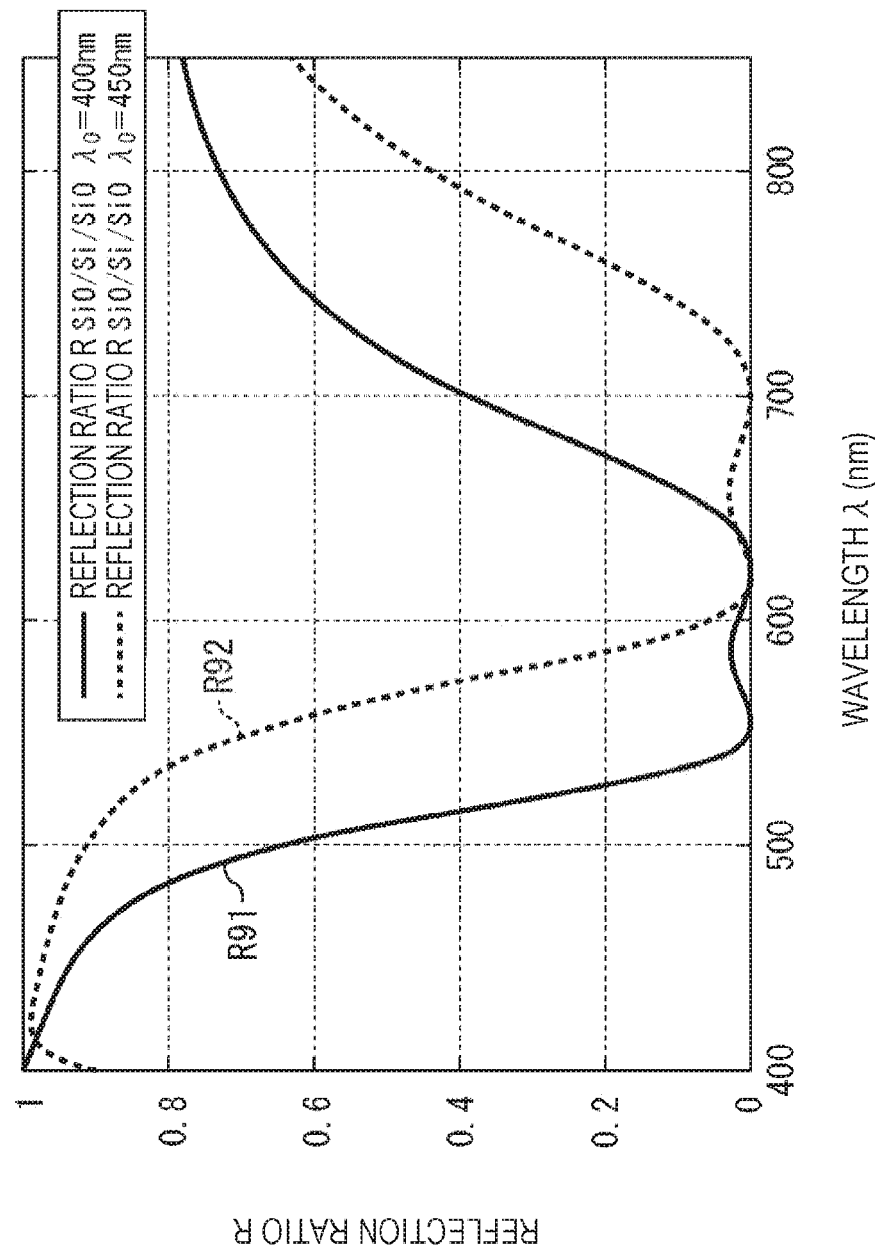
FIG. 30 is a view illustrating a reflection spectrum in a case of adopting a PD three-layer stacked type structure.

FIG. 30 is a view illustrating a reflection spectrum in a case of adopting a PD three-layer type structure.

Figure 31:
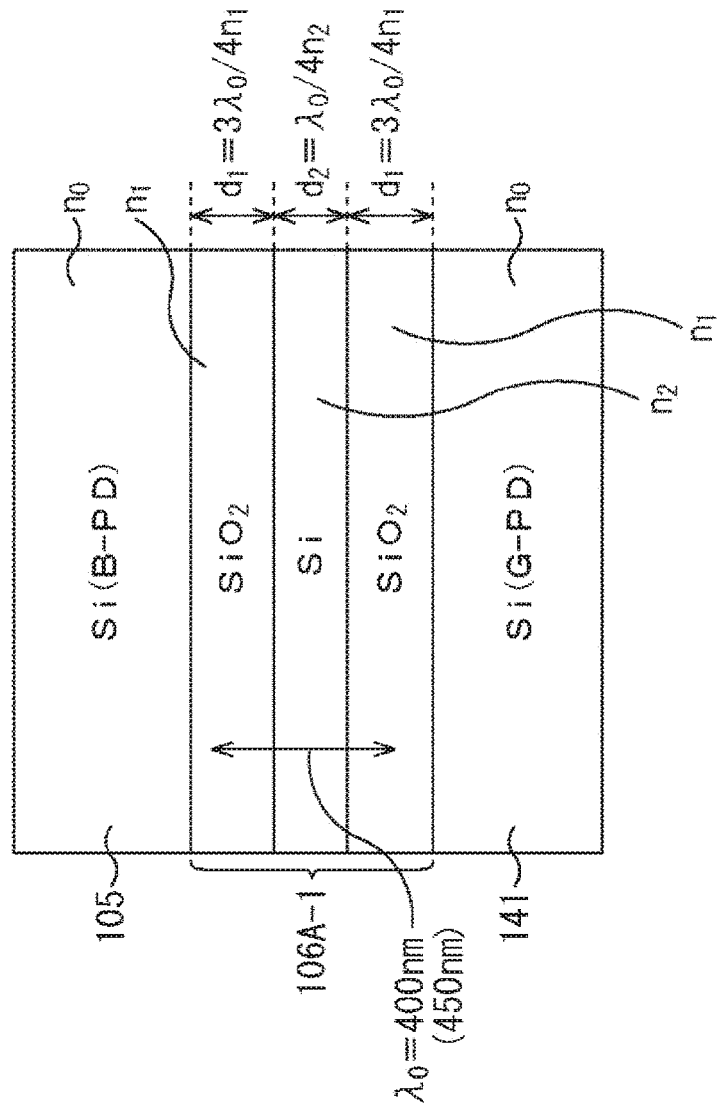
FIG. 31 is a cross-sectional view illustrating a structure corresponding to a condition of the reflection spectrum in FIG. 30.

FIG. 30 illustrates a reflection spectrum R91 when $\lambda_0=400$ nm, $d_1=3\lambda_0/4n_1$, and $d_2=\lambda_0/4n_2$ in a case where the multi-layer film 106A-1 obtained by stacking three layers of a silicon oxide film ($SiO_2$), a silicon film (Si), and a silicon oxide film ($SiO_2$) is formed between the B photodiode 105 and the G photodiode 141 formed of silicon (Si) as illustrated in FIG. 31.

That is, from a result of the reflection spectrum R91, the blue light (B) of the short wavelength is reflected and the green light (G) of the middle wavelength and the red light (R) of the long wavelength, that is, the long wavelength side is transmitted, so that the multi-layer film 106A-1 in FIG. 31 meets conditions required for the optical interference film 106.

Figure 32:
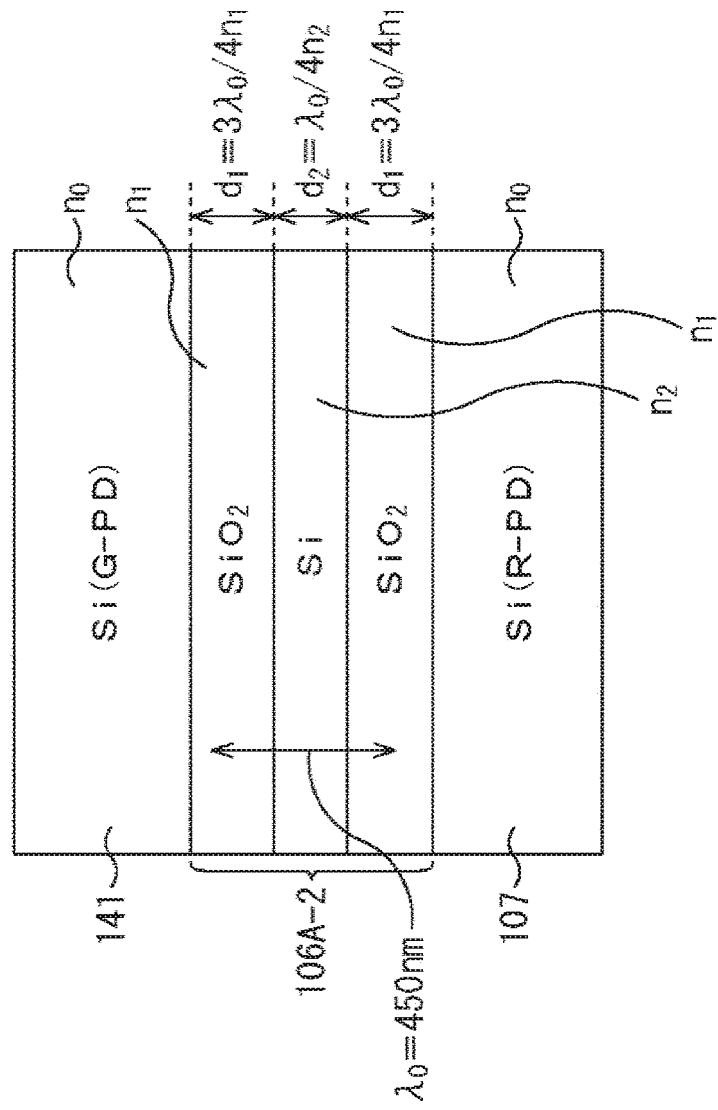
FIG. 32 is a cross-sectional view illustrating a structure corresponding to a condition of the reflection spectrum in FIG. 30.

Also, FIG. 30 illustrates a reflection spectrum R92 when $\lambda_0=450$ nm, $d_1=3\lambda_0/4n_1$, and $d_2=\lambda_0/4n_2$ in a case where the multi-layer film 106A-2 obtained by stacking the three layers of the silicon oxide film ($SiO_2$), the silicon film (Si), and the silicon oxide film ($SiO_2$) is formed between the G photodiode 141 and the R photodiode 107 formed of silicon (Si) as illustrated in FIG. 32.

That is, from a result of the reflection spectrum R92, the blue light (B) of the short wavelength and the green light (G) of the middle wavelength, that is, the short wavelength side is reflected and the red light (R) of the long wavelength is transmitted, so that the multi-layer film 106A-2 in FIG. 32 meets the conditions required for the optical interference film 106.

Meanwhile, regarding the reflection of the blue light (B) by the multi-layer film 106A-2, the blue light (B) is absorbed by the B photodiode 105 formed above the G photodiode 141 and the blue light (B) is further reflected by the multi-layer film 106A-1, so that the blue light (B) reaching the G photodiode 141 hardly exists. Similarly, it can be said that almost no blue light (B) reaches the multi-layer film 106A-2 to be reflected.

Therefore, it is possible to realize the PD three-layer stacked type structure of the pixel 31C in FIG. 29 in which not only the multi-layer film 106A-1 but also the multi-layer film 106A-2 are inserted. Meanwhile, in FIG. 29, in the pixel 31C, although both the multi-layer film 106A-1 and the multi-layer film 106A-2 are inserted between the respective photodiodes in the pixel 31C, the multi-layer film 106A-1 may be inserted only between the B photodiode 105 and the G photodiode 141 or the multi-layer film 106A-2 may be inserted only between the G photodiode 141 and the R photodiode 107.

(Manufacturing Process)

Regarding a manufacturing process of a solid-state imaging device 10 including a pixel array unit 21 in which a plurality of pixels 31C is arranged in a two-dimensional manner, a first manufacturing process (FIG. 22), a second manufacturing process (FIG. 24), or a third manufacturing process (FIG. 25) described above may be used.

For example, in a case of using the first manufacturing process, the multi-layer film 106A-1 (optimum multi-layer film 106A-1) and the multi-layer film 106A-2 (optimum multi-layer film 106A-2) are formed in the manner similar to that when the multi-layer film 106A is formed in the above-described manufacturing process and the G photodiode 141 is formed in the manner similar to that when the B photodiode 105 and the R photodiode 107 are formed. However, in a process step of an upper layer, the on-chip lenses 101 and the like are arranged, but it is not necessary to form the G organic photoelectric conversion film 102.

Meanwhile, in the structure of the pixel 31C in FIG. 29, although a case where the multi-layer films 106A-1 and 106A-2 are formed as the optical interference films 106 formed between the B photodiode 105 and the G photodiode 141 and between the G photodiode 141 and the R photodiode 107 is described, a single-layer film 106B-1 (optimum single-layer film 106B-1) and a single-layer film 106B-2 (optimum single-layer film 106B-2) may also be formed in place of the multi-layer film 106A.

As described above, according to the present technology, it is possible to inhibit optical color mixture and electrical color mixture principally inevitable in the solid-state image sensor 10 including the pixels of a longitudinal spectroscopic structure making use of difference in color absorption characteristics for each color of semiconductor bulk (silicon bulk). This makes it possible to reduce the color mixture of light of other wavelength bands while improving the sensitivity in a certain wavelength band in a photoelectric conversion unit such as the photodiode. As a result, the spectral sensitivity characteristic of the RGB approaches the ideal spectroscopy, the matrix coefficient of the color correction calculation is controlled to be low, and the image quality with a high SN ratio may be obtained.

Meanwhile, the optical color mixture is herein intended to mean physically inevitable color mixture occurring, for example, because the red light (R) passes through the B photodiode 105 or the blue light (B) passes through the R photodiode 107. Also, the electrical color mixture is intended to mean occurrence of the color mixture between the photodiodes when photoelectrons thermally cross the potential barrier between the B photodiode 105 and the R photodiode 107, for example, when this is small.

7. Configuration of Camera Module

The present technology is not necessarily applied to a solid-state imaging device. That is, the present technology is applicable to electronic devices including the solid-state imaging device in general such as a camera module including an optical lens system and the like in addition to the solid-state imaging device, an imaging device such as a digital still camera and a video camera, a portable terminal device having an imaging function (for example, a smartphone and a tablet terminal), or a copying machine in which the solid-state imaging device is used in an image reading unit.

Figure 33:
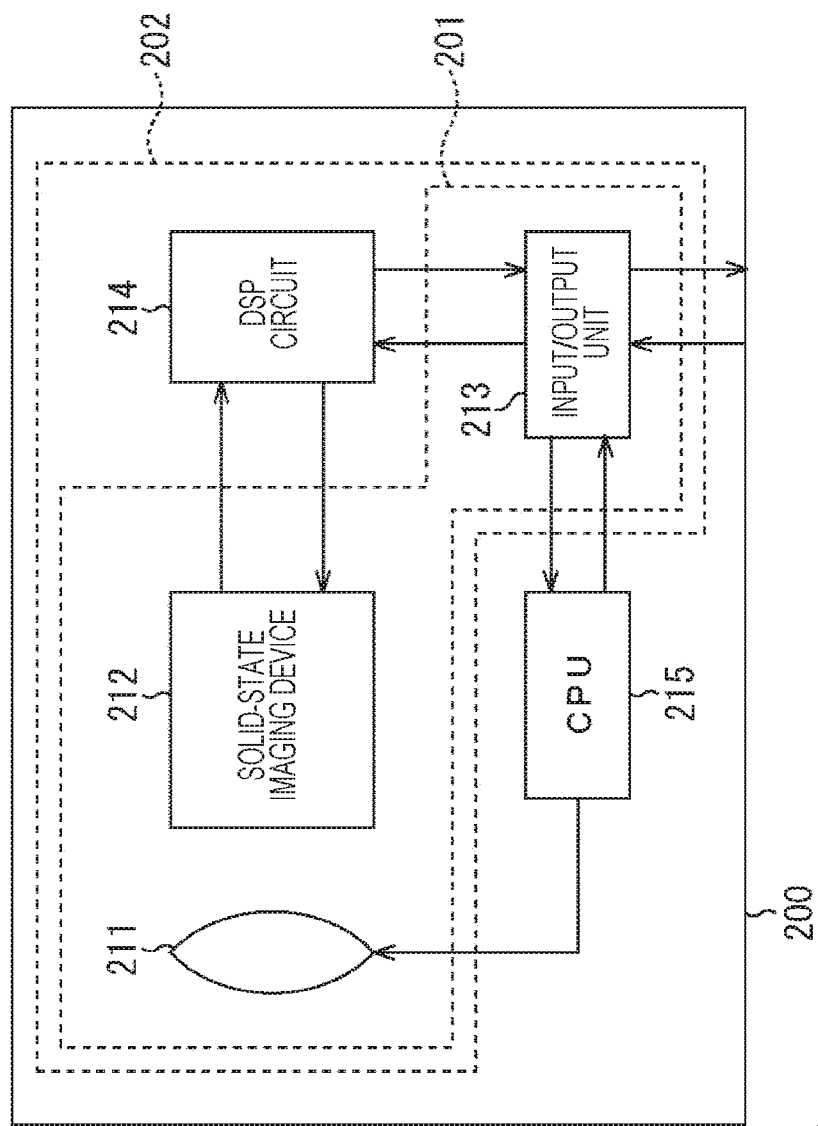
FIG. 33 is a view illustrating a configuration example of a camera module including a solid-state imaging device.

FIG. 33 is a view illustrating a configuration example of the camera module including the solid-state imaging device.

In FIG. 33, a camera module 200 incorporates an optical lens system 211, a solid-state imaging device 212, an input/output unit 213, a digital signal processor (DSP) circuit 214, and a CPU 215 into a single module.

The solid-state imaging device 212 corresponding to a solid-state imaging device 10 in FIG. 3 has a cross-sectional structure in FIG. 4, 6, 26, 28 or 29, for example, as a structure of the pixel (pixel 31). That is, in the solid-state imaging device 212, a pixel array unit 21 in which the pixels 31 (pixel 31 in FIGS. 4 and 6, pixel 31A in FIG. 26, pixels 31B-1 and 31B-2 in FIG. 28, and pixel 31C in FIG. 29) in which a multi-layer film 106A or a single-layer film 106B is formed between photodiodes forming a longitudinal spectroscopic structure are arranged in a two-dimensional manner is provided.

The solid-state imaging device 212 captures incident light (image light) from an object through the optical lens system 211 and converts a light amount of the incident light an image of which is formed on an imaging surface to electric signals in a pixel unit to output as pixel signals. The input/output unit 213 has a function as an input/output interface with outside.

The DSP circuit 214 is a signal processing circuit which processes the signal supplied from the solid-state imaging device 212. For example, in this signal processing circuit, RGB signals based on signals corresponding to green light (G), blue light (B), and red light (R) corresponding to the output from the pixel 31 (FIG. 3) are processed. Meanwhile, it is also possible that processing performed by the signal processing circuit described above is performed by the solid-state imaging device 212.

The CPU 215 controls the optical lens system 211 and communicates data with the input/output unit 213.

Also, as a camera module 201, for example, the module may be formed only of the optical lens system 211, the solid-state imaging device 212, and the input/output unit 213. In this case, the pixel signal from the solid-state imaging device 212 is output through the input/output unit 213. Furthermore, as a camera module 202, the module may also be formed of the optical lens system 211, the solid-state imaging device 212, the input/output unit 213, and the DSP circuit 214. In this case, the pixel signal from the solid-state imaging device 212 is processed by the DSP circuit 214 to be output through the input/output unit 213.

The camera modules 200, 201, and 202 are formed in the above-described manner. In the camera modules 200, 201, and 202, the solid-state imaging device 212 including the pixel array unit 21 in which the pixels 31 in which the multi-layer film 106A or the single-layer film 106B is formed between the photodiodes forming the longitudinal spectroscopic structure are arranged in a two-dimensional manner is provided, so that it is possible to improve the sensitivity in a certain wavelength band and at the same time reduce color mixture of light of other wavelength bands in the photodiode.

8. Configuration of Electronic Device

Figure 34:
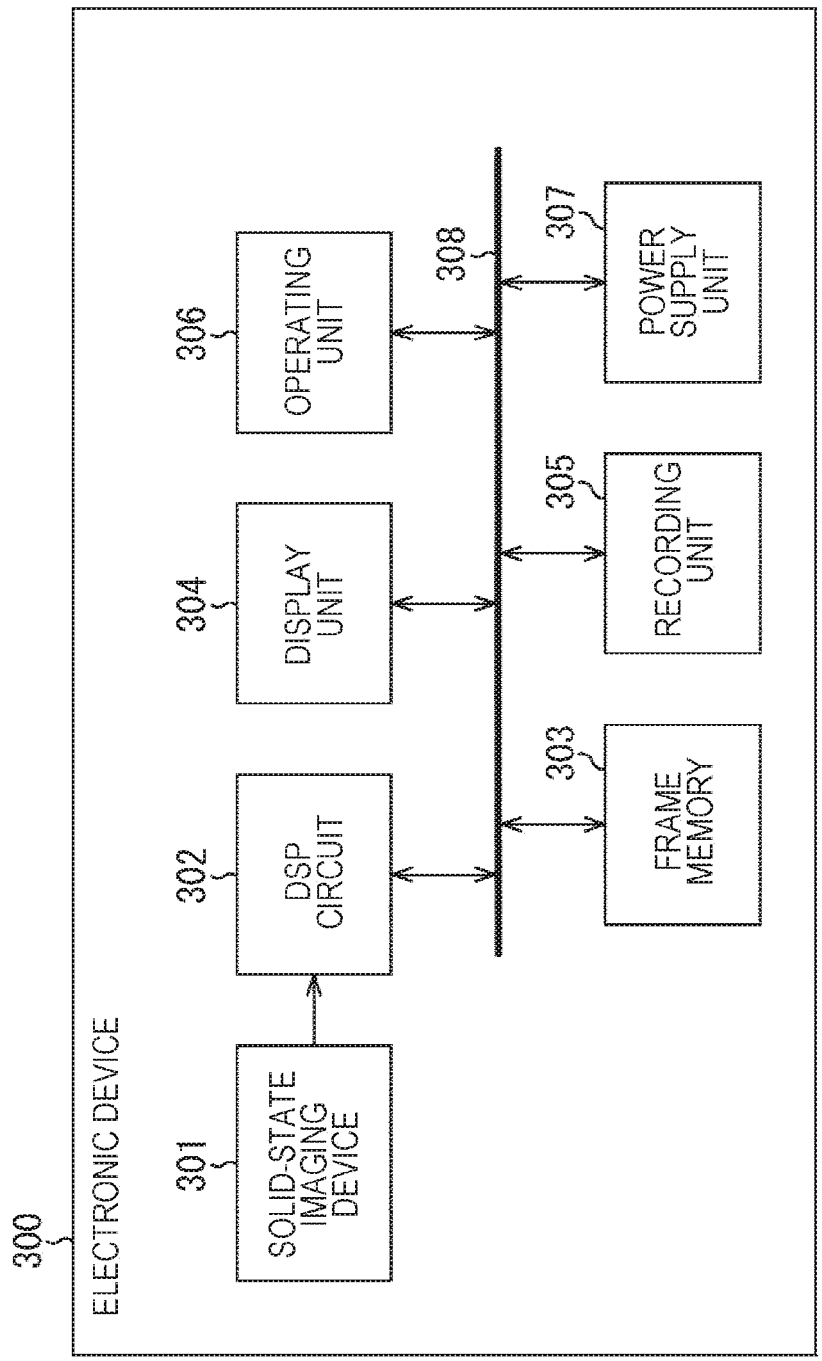
FIG. 34 is a view illustrating a configuration example of an electronic device including the solid-state imaging device.

FIG. 34 is a view illustrating a configuration example of an electronic device including a solid-state imaging device.

An electronic device 300 in FIG. 34 is an electronic device such as an imaging device such as a digital still camera and a video camera, a portable terminal device such as a smartphone and a tablet terminal and the like, for example.

In FIG. 34, the electronic device 300 is formed of a solid-state imaging device 301, a DSP circuit 302, a frame memory 303, a display unit 304, a recording unit 305, an operating unit 306, and a power supply unit 307. Also, in the electronic device 300, the DSP circuit 302, the frame memory 303, the display unit 304, the recording unit 305, the operating unit 306, and the power supply unit 307 are connected to one another through a bus line 308.

The solid-state imaging device 301 corresponding to the solid-state imaging device 10 in FIG. 3 has a cross-sectional structure in FIG. 4, FIG. 6, FIG. 26, FIG. 28, or FIG. 29, for example, as a structure of the pixel (pixel 31). That is, in the solid-state imaging device 301, a pixel array unit 21 in which the pixels 31 (pixel 31 in FIGS. 4 and 6, pixel 31A in FIG. 26, pixels 31B-1 and 31B-2 in FIG. 28, and pixel 31C in FIG. 29) in which a multi-layer film 106A or a single-layer film 106B is formed between photodiodes forming a longitudinal spectroscopic structure are arranged in a two-dimensional manner is provided.

The solid-state imaging device 301 captures incident light (image light) from an object through an optical lens system (not illustrated) and converts a light amount of the incident light an image of which is formed on an imaging surface to an electric signal in a pixel unit to output as a pixel signal.

The DSP circuit 302 being a signal processing circuit which processes the signal supplied from the solid-state imaging device 301 corresponds to the DSP circuit 214 in FIG. 33. The DSP circuit 302 outputs image data obtained by processing the signal from the solid-state imaging device 301. The frame memory 303 temporarily holds image data processed by the DSP circuit 302 in a frame unit.

The display unit 304 formed of a panel type display device such as a liquid crystal panel and an organic electro luminescence (EL) panel, for example, displays a moving image or a still image taken by the solid-state imaging device 301. The recording unit 305 records the image data of a moving image or a still image taken by the solid-state imaging device 301 in a recording medium such as a semiconductor memory and a hard disk.

The operating unit 306 outputs an operation command regarding various functions of the electronic device 300 in accordance with operation by a user. The power supply unit 307 appropriately supplies various power sources serving as operation power sources of the DSP circuit 302, the frame memory 303, the display unit 304, the recording unit 305, and the operating unit 306 to supply targets.

The electronic device 300 is configured in the above-described manner. In the electronic device 300, the solid-state imaging device 301 including the pixel array unit 21 in which the pixels 31 in which the multi-layer film 106A or the single-layer film 106B is formed between the photodiodes forming the longitudinal spectroscopic structure are arranged in a two-dimensional manner is provided, so that it is possible to improve the sensitivity in a certain wavelength band and at the same time reduce color mixture of light of other wavelength bands in the photodiode.

9. Usage Example of Solid-State Imaging Device

Figure 35:
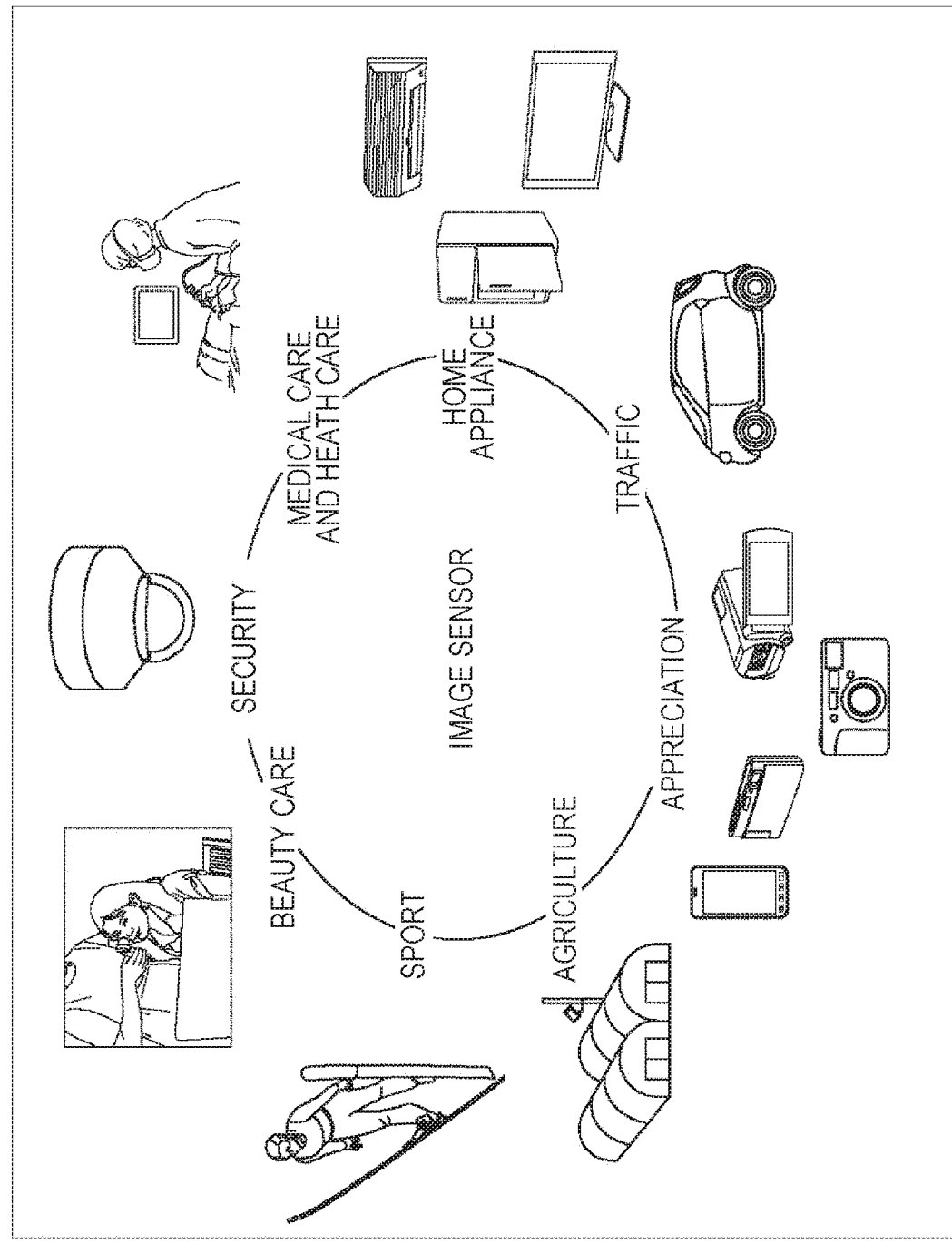
FIG. 35 is a view illustrating a usage example of the solid-state imaging device.

FIG. 35 is a view illustrating a usage example of a solid-state imaging device 10 as an image sensor.

The above-described solid-state imaging device 10 may be used in various cases in which light such as visible light, infrared light, ultraviolet light, and X-ray is sensed as described below, for example. That is, as illustrated in FIG. 35, the solid-state imaging device 10 may be used in devices used in a traffic field, a home appliance field, a medical care and health care field, a security field, a beauty care field, a sports field, or an agricultural field, for example, in addition to a field of appreciation in which an image to be appreciated is taken described above.

Specifically, as described above, the solid-state imaging device 10 may be used in a device for taking an image to be appreciated (electronic device 300 in FIG. 34, for example) such as a digital camera, a smartphone, and a portable phone having a camera function, for example, in the field of appreciation.

In the traffic field, the solid-state imaging device 10 may be used in devices used for traffic such as a vehicle-mounted sensor which takes images of the front, back, surroundings, and inside of an automobile, a monitoring camera which monitors running vehicles and roads, and a ranging sensor which measures a distance between vehicles for safe driving such as automatic stop and recognition of a driver's condition, for example.

In the home appliance field, the solid-state imaging device 10 may be used in home appliances such as a television receiver, a refrigerator, and an air conditioner for taking an image of a user's gesture and operating the device according to the gesture, for example. Also, in the medical care and health care field, the solid-state imaging device 10 may be used in medical care and health care devices such as an endoscope and a device performing angiography by receiving infrared light, for example.

In the security field, the solid-state imaging device 10 may be used in security devices such as a security monitoring camera and a personal authentication camera, for example. Also, in the beauty care field, the solid-state imaging device 10 may be used in beauty care devices such as a skin measuring device which takes an image of skin and a microscope which takes an image of head skin, for example.

In the sports field, the solid-state imaging device 10 may be used in sports devices such as an action camera and a wearable camera for sports, for example. Also, in the agricultural field, the solid-state imaging device 10 may be used in agricultural devices such as a camera for monitoring a land and crop state, for example.

Meanwhile, the embodiments of the present technology are not limited to the above-described embodiments and various modifications may be made without departing from the scope of the present technology. For example, it is possible to adopt a combination of all or some of a plurality of embodiments described above.

The present technology may also have the following configurations.

(1)

A solid-state imaging device including:

a first photoelectric conversion unit which generates a signal charge corresponding to a light amount of light of a first color component on a short wavelength side out of incident light;

a second photoelectric conversion unit which generates a signal charge corresponding to a light amount of light of a second color component on a long wavelength side out of the incident light; and a first optical interference film provided between the first photoelectric conversion unit and the second photoelectric conversion unit formed below the first photoelectric conversion unit which transmits the light on the long wavelength side while reflecting the light on the short wavelength side out of the incident light.

(2)

The solid-state imaging device according to (1), in which the first optical interference film is a single-layer film or a multi-layer film.

(3)

The solid-state imaging device according to (2), in which, in layers formed of the first photoelectric conversion unit, the single-layer film or the multi-layer film, and the second photoelectric conversion unit, a high refractive index and a low refractive index of respective layers are alternately repeated, and the single-layer film or the multi-layer film has a relationship of $d_X=\lambda_0 \times (2m_X+1)/4n_X$ (where $d_X$ and $n_X$ represent a thickness and the refractive index in an X layer, respectively, $m_X$ represents an integer equal to or larger than 0, and $\lambda_0$ represents a wavelength of light).

(4)

The solid-state imaging device according to (2) or (3), in which the single-layer film or the multi-layer film is formed of a silicon oxide film ($SiO_2$), a silicon nitride film ($Si_3N_4$), a silicon film (Si), a titanium oxide film ($TiO_2$), or a $(SiO_2)_X(Si_3N_4)_{1-X}$ film.

(5)

The solid-state imaging device according to (3) or (4), in which the single-layer film is formed of the silicon oxide film ($SiO_2$), and the silicon oxide film ($SiO_2$) satisfies a relationship of $\lambda_0=370$ to 430 nm and $d_x=3\lambda_0/4n_x$.

(6)

The solid-state imaging device according to (3) or (4), in which the multi-layer film is formed by stacking three layers of the silicon oxide film ($SiO_2$), the silicon film (Si), and the silicon oxide film ($SiO_2$), the silicon oxide film ($SiO_2$) satisfies a relationship of $\lambda_0=420$ to 480 nm and $d_x=3\lambda_0/4n_x$, and the silicon film (Si) satisfies a relationship of $\lambda_0=420$ to 480 nm and $d_x=\lambda_0/4n_x$.

(7)

The solid-state imaging device according to any one of (1) to (6), in which a thickness of the first photoelectric conversion unit is 0.5 μm or less.

(8)

The solid-state imaging device according to any one of (2) to (7), in which at least a part of the single-layer film or the multi-layer film is formed of an insulating film.

(9)

The solid-state imaging device according to any one of (1) to (8), further including:

a photoelectric conversion film which absorbs light of a third color component to generate a signal charge above the first photoelectric conversion unit, in which the light of the first color component is blue light (B), the light of the second color component is red light (R), and the light of the third color component is green light (G).

(10)

The solid-state imaging device according to any one of (1) to (8), further including:

a pixel array unit in which a plurality of pixels formed of a combination of a first pixel including a first color filter which transmits light of a third color component, and a third photoelectric conversion unit which generates a signal charge corresponding to a light amount of the light of the third color component transmitted through the first color filter, and a second pixel obtained by stacking the first photoelectric conversion unit, the single-layer film or the multi-layer film, and the second photoelectric conversion unit, the second pixel including a second color filter which transmits light of a fourth color component above the first photoelectric conversion unit is arranged in a two-dimensional manner, in which the light of the first color component is blue light (B), the light of the second color component is red light (R), the light of the third color component is green light (G), and the light of the fourth color component is magenta light (Mg).

(11)

The solid-state imaging device according to any one of (1) to (8), further including:

a third photoelectric conversion unit which generates a signal charge corresponding to a light amount of light of a third color component of a medium wavelength out of the incident light; and a second optical interference film provided between the first photoelectric conversion unit and the third photoelectric conversion unit formed below the first photoelectric conversion unit which reflects the light of the short wavelength and transmits the light of the middle wavelength and long wavelength out of the incident light, in which the first optical interference film is provided between the third photoelectric conversion unit and the second photoelectric conversion unit formed below the third photoelectric conversion unit to reflect the light of the short wavelength and the light of the medium wavelength and transmit the light of the long wavelength out of the incident light, the light of the first color component is blue light (B), the light of the second color component is red light (R), and the light of the third color component is green light (G).

(12)

The solid-state imaging device according to (3), in which a range of the wavelength $\lambda_0$ is 350 to 500 nm.

(13)

The solid-state imaging device according to any one of (1) to (12), in which the first photoelectric conversion unit and the second photoelectric conversion unit are stacked type photodiodes formed in a silicon (Si) layer.

(14)

The solid-state imaging device according to any one of (1) to (13), in which a p-type silicon layer formed of p-type silicon is formed in the vicinity of a boundary of the first optical interference film.

(15)

A method of manufacturing a solid-state imaging device including:

removing a part of a second semiconductor substrate on which a second photoelectric conversion unit which generates a signal charge corresponding to a light amount of light of a second component on a long wavelength side out of incident light is formed for forming a first optical interference film which reflects light on a short wavelength side and transmits the light on the long wavelength side out of the incident light;

forming the first optical interference film in a portion from which a part of the second semiconductor substrate is removed; and attaching a first semiconductor substrate on which a first photoelectric conversion unit which generates a signal charge corresponding to a light amount of light of a first color component on the short wavelength side out of the incident light is formed to the second semiconductor substrate on which the first optical interference film is formed.

(16)

A method of manufacturing a solid-state imaging device including:

forming a first optical interference film which reflects light on a short wavelength side and transmits light on a long wavelength side out of incident light on a part of a semiconductor substrate on which a second photoelectric conversion unit which generates a signal charge corresponding to a light amount of light of a second component on the long wavelength side out of the incident light is formed;

covering a side surface side of the first optical interference film by selectively growing a semiconductor of the semiconductor substrate; and covering an upper surface side of the first optical interference film by laterally growing a semiconductor of the semiconductor substrate to form a first photoelectric conversion unit which generates a signal charge corresponding to a light amount of light of a first color component on the short wavelength side out of the incident light by the semiconductor formed on the upper surface of the first optical interference film.

(17)

An electronic device including a solid-state imaging device including:

a first photoelectric conversion unit which generates a signal charge corresponding to a light amount of light of a first color component on a short wavelength side out of incident light;

a second photoelectric conversion unit which generates a signal charge corresponding to a light amount of light of a second color component on a long wavelength side out of the incident light; and a first optical interference film provided between the first photoelectric conversion unit and the second photoelectric conversion unit formed below the first photoelectric conversion unit which transmits the light on the long wavelength side while reflecting the light on the short wavelength side out of the incident light.

REFERENCE SIGNS LIST

10 Solid-state imaging device
21 Pixel array unit
31, 31A, 31B-1, 31B-2, 31C Pixel
23 Column signal processing circuit
26 Control circuit
101, 101-1, 101-2 On-chip lens
102 G Organic photoelectric conversion film
103 Transparent electrode
104 Electrode
105 B Photodiode (B-PD)
106 Optical interference film
106A, 106A-1, 106A-2 Multi-layer film
106B Single-layer film
107 R Photodiode (R-PD)
121-1, 121-2 Gate
122-1, 122-2 Floating diffusion region
131 G color filter (G-OCCF)
132 G photodiode (G-PD)
133 Mg color filter (Mg-OCCF)
141 G photodiode (G-PD)
200, 201, 202 Camera module
212 Solid-state imaging device
300 Electronic device
301 Solid-state imaging device

The invention claimed is:

1. A solid-state imaging device, comprising:
a first pixel, comprising:
a first photoelectric conversion unit configured to generate a first charge corresponding to a first amount of light of a first color component of a first wavelength, wherein
the first wavelength is below a first threshold wavelength;
a second photoelectric conversion unit configured to generate a second charge corresponding to a second amount of light of a second color component of a second wavelength, wherein
the second wavelength is above a second threshold wavelength, and
the second threshold wavelength is larger than the first threshold wavelength;
an optical interference film between the first photoelectric conversion unit and the second photoelectric conversion unit, wherein the optical interference film is configured to:
transmit the second amount of the light of the second color component, and
reflect the first amount of the light of the first color component, and
the optical interference film is one of a single-layer film or a multi-layer film;
a plurality of layers that comprises one of the single-layer film or the multi-layer film, the first photoelectric conversion unit, and the second photoelectric conversion unit, wherein
a first refractive index and a second refractive index of the plurality of layers are alternately repeated, and
the first refractive index is greater than the second refractive index; and
a first color filter configured to transmit only light of a third color component, wherein the first color filter is located at a light incidence side of the first photoelectric conversion unit; and
a second pixel, comprising:
a second color filter configured to transmit only light of a fourth color component; and
a photoelectric conversion film configured to absorb the light of the fourth color component, after transmission through the second color filter, to generate a third charge, wherein
the light of the first color component is blue light (B),
the light of the second color component is red light (R),
the light of the third color component is magenta light (Mg), and
the light of the fourth color component is green light (G).

2. The solid-state imaging device according to claim 1, wherein
a thickness and a refractive index of one of the single-layer film or the multi-layer film has a relationship of:

$$d_x = \lambda_0 \times (2m_x+1)/4n_x$$

(where $d_x$ and $n_x$ represent the thickness and the refractive index in an X layer, respectively, $m_x$ represents an integer one of equal to or larger than 0, and $\lambda_0$ represents a wavelength of light incident on the solid-state imaging device).

3. The solid-state imaging device according to claim 1, wherein one of the single-layer film or the multi-layer film comprises one of a silicon oxide film ($SiO_2$), a silicon nitride film ($Si_3N_4$), a silicon film (Si), a titanium oxide film ($TiO_2$), or a $(SiO_2)_X(Si_3N_4)_{1-X}$ film.

4. The solid-state imaging device according to claim 3, wherein
the single-layer film comprises the silicon oxide film ($SiO_2$), and
a thickness of the silicon oxide film ($SiO_2$) satisfies a relationship of $d_x=3\lambda_0/4n_x$, where $\lambda_0=370$ nm to 430 nm.

5. The solid-state imaging device according to claim 3, wherein
the multi-layer film comprises a stack of a first silicon oxide film ($SiO_2$), the silicon film (Si), and a second silicon oxide film ($SiO_2$),
a thickness of each of the first silicon oxide film ($SiO_2$) and the second silicon oxide film ($SiO_2$) satisfies a relationship of $d_x=3\lambda_0/4n_x$, where $\lambda_0=380$ nm to 420 nm, and
the thickness of the silicon film (Si) satisfies a relationship of $d_x=\lambda_0/4n_x$, where $\lambda_0=380$ nm to 420 nm.

6. The solid-state imaging device according to claim 2, wherein a thickness of the first photoelectric conversion unit is one of 0.5 μm or less.

7. The solid-state imaging device according to claim 1, wherein at least a part of one of the single-layer film or the multi-layer film comprises an insulating film.

8. The solid-state imaging device according to claim 1, further comprising:
a pixel array unit that comprises the first pixel and the second pixel, wherein
the first pixel comprises a stack of the first photoelectric conversion unit, one of the single-layer film or the multi-layer film, and the second photoelectric conversion unit, and
pixels of the pixel array unit are arranged in a two-dimensional manner.

9. The solid-state imaging device according to claim 1, wherein
light incident on the solid-state imaging device has a wavelength $\lambda_0$, and
a range of the wavelength $\lambda_0$ of the light incident on the solid-state imaging device is 350 nm to 500 nm.

10. The solid-state imaging device according to claim 1, wherein the first photoelectric conversion unit and the second photoelectric conversion unit are stacked type photodiodes in a silicon (Si) layer.

11. The solid-state imaging device according to claim 1, wherein a p-type silicon layer comprises p-type silicon in a vicinity of a boundary of the optical interference film.

12. A method of manufacturing a solid-state imaging device, comprising:
forming a first photoelectric conversion unit on a first semiconductor substrate, wherein
the first photoelectric conversion unit is configured to generate a first charge corresponding to a first amount of light of a first color component of a first wavelength, and
the first wavelength is above a first threshold wavelength;
removing a part of a layer that comprises the first photoelectric conversion unit;
forming an optical interference film in a portion from which the part of the layer that comprises the first photoelectric conversion unit is removed,
wherein the optical interference film is configured to reflect a second amount of light of a second color component of a second wavelength which is below a second threshold wavelength, and transmit the first amount of light of the first color component;
attaching a second semiconductor substrate, on which a second photoelectric conversion unit is formed, to the first semiconductor substrate on which the optical interference film is formed, wherein
the second photoelectric conversion unit is configured to generate a second charge corresponding to the second amount of light of the second color component of the second wavelength,
the first threshold wavelength is larger than the second threshold wavelength, and
the optical interference film is one of a single-layer film or a multi-layer film;
forming a plurality of layers that comprises one of the single-layer film or the multi-layer film, the first photoelectric conversion unit, and the second photoelectric conversion unit, wherein
a first refractive index and a second refractive index of the plurality of layers are alternately repeated, and the first refractive index is greater than the second refractive index;
forming a first on-chip lens on the second photoelectric conversion unit;
arranging a first color filter on a lower side of the first on-chip lens, wherein
the first color filter is configured to transmit only light of a third color component, and
the first color filter is located at a light incidence side of the second photoelectric conversion unit;
forming a photoelectric conversion film on the first semiconductor substrate;
forming a second on-chip lens on the photoelectric conversion film; and
arranging a second color filter on a lower side of the second on-chip lens, wherein
the second color filter configured to transmit only light of a fourth color component,
the photoelectric conversion film configured to absorb the light of the fourth color component, after transmission through the second color filter, to generate a third charge,
the light of the first color component is red light (R),
the light of the second color component is blue light (B),
the light of the third color component is magenta light (Mg), and
the light of the fourth color component is green light (G).

13. A method of manufacturing a solid-state imaging device, comprising:
forming an optical interference film on a part of a semiconductor substrate on which a first photoelectric conversion unit is formed, wherein
the first photoelectric conversion unit is configured to generate a first charge corresponding to a first amount of light of a first color component of a first wavelength
the first wavelength is above a first threshold wavelength, and
the optical interference film is configured to reflect a second amount of light of a second color component of a second wavelength which is below a second threshold wavelength, and transmit the first amount of light of the first color component;
covering a side surface side of the optical interference film by selectively growing a semiconductor of the semiconductor substrate;
covering an upper surface side of the optical interference film by laterally growing the semiconductor of the semiconductor substrate to form a second photoelectric conversion unit, wherein
the second photoelectric conversion unit is configured to generate a second charge corresponding to the second amount of the light of the second color component of the second wavelength,
the first threshold wavelength is larger than the second threshold wavelength, and
the optical interference film is one of a single-layer film or a multi-layer film;
forming a plurality of layers that comprises one of the single-layer film or the multi-layer film, the first photoelectric conversion unit, and the second photoelectric conversion unit, wherein
a first refractive index and a second refractive index of the plurality of layers are alternately repeated, and
the first refractive index is greater than the second refractive index;
forming a first on-chip lens on the second photoelectric conversion unit;
arranging a first color filter on a lower side of the first on-chip lens, wherein
the first color filter is configured to transmit only light of a third color component, and
the first color filter is located at a light incidence side of the second photoelectric conversion unit;
forming a photoelectric conversion film on the semiconductor substrate;
forming a second on-chip lens on the photoelectric conversion film; and
arranging a second color filter on a lower side of the second on-chip lens, wherein
the second color filter configured to transmit only light of a fourth color component,
the photoelectric conversion film configured to absorb the light of the fourth color component, after transmission through the second color filter, to generate a third charge, the light of the first color component is red light (R),
the light of the second color component is blue light (B),
the light of the third color component is magenta light (Mc), and
the light of the fourth color component is green light (G).

14. An electronic device, comprising:
a solid-state imaging device, including:
a first pixel that includes:
a first photoelectric conversion unit configured to generate a first charge corresponding to a first amount of light of a first color component of a first wavelength, wherein
the first wavelength is below a first threshold wavelength;
a second photoelectric conversion unit configured to generate a second charge corresponding to a second amount of light of a second color component of a second wavelength,
wherein the second wavelength is above a second threshold wavelength, and
the second threshold wavelength is larger than the first threshold wavelength;
an optical interference film between the first photoelectric conversion unit and the second photoelectric conversion unit, wherein
the optical interference film is configured to:
transmit the second amount of the light of the second color component, and
reflect the first amount of the light of the first color component, and
the optical interference film is one of a single-layer film or a multi-layer film;
a plurality of layers that comprises one of the single-layer film or the multi-layer film, the first photoelectric conversion unit, and the second photoelectric conversion unit, wherein
a first refractive index and a second refractive index of the plurality of layers are alternately repeated, and
the first refractive index is greater than the second refractive index; and
a first color filter configured to transmit only light of a third color component, wherein the first color filter is located at a light incidence side of the first photoelectric conversion unit; and
a second pixel, comprising:
a second color filter configured to transmit only light of a fourth color component; and a photoelectric conversion film configured to absorb the light of the fourth color component, after transmission through the second color filter, to generate a third charge, wherein the light of the first color component is blue light (B), the light of the second color component is red light (R), the light of the third color component is magenta light (Mg), and the light of the fourth color component is green light (G).

* * * * *